(12) United States Patent
Yamazaki et al.

(10) Patent No.: US 11,776,596 B2
(45) Date of Patent: Oct. 3, 2023

(54) DATA PROCESSING DEVICE AND METHOD FOR OPERATING DATA PROCESSING DEVICE

(71) Applicant: SEMICONDUCTOR ENERGY LABORATORY CO., LTD., Atsugi (JP)

(72) Inventors: Shunpei Yamazaki, Tokyo (JP); Takayuki Ikeda, Kanagawa (JP); Hitoshi Kunitake, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 17/772,331

(22) PCT Filed: Aug. 26, 2020

(86) PCT No.: PCT/IB2020/057947
§ 371 (c)(1),
(2) Date: Apr. 27, 2022

(87) PCT Pub. No.: WO2021/094844
PCT Pub. Date: May 20, 2021

(65) Prior Publication Data
US 2022/0406347 A1 Dec. 22, 2022

(30) Foreign Application Priority Data

Nov. 11, 2019 (JP) .................................. 2019-203814
Nov. 20, 2019 (JP) .................................. 2019-209362

(51) Int. Cl.
*G11C 7/10* (2006.01)
(52) U.S. Cl.
CPC ............ *G11C 7/1096* (2013.01); *G11C 7/109* (2013.01); *G11C 7/1069* (2013.01)

(58) Field of Classification Search
CPC ..... G11C 7/1096; G11C 7/1069; G11C 7/109; G11C 11/4045; G11C 16/0483;
(Continued)

(56) References Cited

U.S. PATENT DOCUMENTS

| 5,877,740 A | 3/1999 | Hirakata et al. |
| 6,678,191 B2 | 1/2004 | Lee et al. |
(Continued)

FOREIGN PATENT DOCUMENTS

| JP | 2005-309304 A | 11/2005 |
| JP | 2007-242163 A | 9/2007 |
(Continued)

OTHER PUBLICATIONS

Akasawa.F et al., "An Energy Efficient Normally-Off CPU with 2.4 pW Negative Voltage Generator Featuring 60-nm Crystalline Indium-Gallium-Zinc Oxide FETs in BEOL", SSDM 2019 (Extended Abstracts of the 2019 International Conference on Solid State Devices and Materials), Sep. 2, 2019, pp. 519-520.
(Continued)

*Primary Examiner* — Michael T Tran
(74) *Attorney, Agent, or Firm* — Fish & Richardson P.C.

(57) ABSTRACT

A data device with a small circuit area and reduced power consumption is used. The data processing device includes a NAND memory portion and a controller. The memory portion includes a first string and a second string in different blocks. The first string includes a first memory cell, and the second string includes a second memory cell. On reception of first data and a signal including an instruction to write the first data, the controller writes the first data to the first memory cell. Then, the controller reads the first data from the first memory cell and writes the first data to the second memory cell.

8 Claims, 20 Drawing Sheets

(58) Field of Classification Search
CPC ... G11C 16/10; G11C 16/26; G11C 11/40411; G11C 11/405; G11C 16/14; H10B 12/00; H10B 41/70; G06F 13/1673; G06F 3/0658; G06F 12/00; G06F 12/06; G06F 13/16; H01L 21/8258; Y02D 10/00
USPC .................................... 365/185.24, 189.011
See application file for complete search history.

(56) References Cited

U.S. PATENT DOCUMENTS

| | | | |
|---|---|---|---|
| 6,876,339 B2 | 4/2005 | Hiroki | |
| 7,190,360 B1 | 3/2007 | Hiroki | |
| 7,613,880 B2 | 11/2009 | Miura et al. | |
| 7,639,058 B2 | 12/2009 | Kurokawa et al. | |
| 7,663,447 B2 | 2/2010 | Matsuzaki | |
| 7,782,315 B2 | 8/2010 | Hiroki | |
| 7,991,954 B2 | 8/2011 | Miura et al. | |
| 8,095,104 B2 | 1/2012 | Kawae et al. | |
| 8,103,897 B2 | 1/2012 | Endo et al. | |
| 8,185,690 B2 | 5/2012 | Miura et al. | |
| 8,338,882 B2 | 12/2012 | Tanaka et al. | |
| 8,455,868 B2 | 6/2013 | Yamazaki et al. | |
| 8,476,708 B2 | 7/2013 | Fukuzumi et al. | |
| 8,514,013 B2 | 8/2013 | Takeuchi et al. | |
| 9,209,160 B2 | 12/2015 | Lee | |
| 9,406,694 B1 | 8/2016 | Ikeno et al. | |
| 9,466,263 B2 | 10/2016 | Bae et al. | |
| 9,479,145 B2 | 10/2016 | Okamoto et al. | |
| 9,543,370 B2 | 1/2017 | Tsai et al. | |
| 9,544,994 B2 | 1/2017 | Kwon et al. | |
| 9,569,713 B2 | 2/2017 | Yoneda et al. | |
| 9,612,620 B2 | 4/2017 | Bae | |
| 9,634,097 B2 | 4/2017 | Rabkin et al. | |
| 9,761,732 B2 | 9/2017 | Nomura et al. | |
| 9,780,170 B2 | 10/2017 | Ota et al. | |
| 9,799,095 B2 | 10/2017 | Miki et al. | |
| 9,818,757 B2 | 11/2017 | Ikeda et al. | |
| 9,910,509 B2 | 3/2018 | Markovic et al. | |
| 9,973,692 B2 | 5/2018 | Szabo et al. | |
| 9,990,997 B2 | 6/2018 | Matsuzaki et al. | |
| 10,163,967 B2 | 12/2018 | Okamoto et al. | |
| 10,177,767 B2 | 1/2019 | Kozuma | |
| 10,373,686 B2 | 8/2019 | Tran et al. | |
| 10,396,092 B2 | 8/2019 | Kanamori et al. | |
| 10,410,599 B2 | 9/2019 | Shin et al. | |
| 10,416,950 B2 | 9/2019 | Kim et al. | |
| 10,475,370 B2 | 11/2019 | Spitzer et al. | |
| 10,593,693 B2 | 3/2020 | Yamazaki et al. | |
| 10,600,469 B2 | 3/2020 | Kimura et al. | |
| 10,699,628 B2 | 6/2020 | Yamazaki et al. | |
| 10,930,205 B2 | 2/2021 | Kurokawa | |
| 11,335,812 B2 | 5/2022 | Yamazaki et al. | |
| 2005/0018486 A1* | 1/2005 | Kawai | G11C 16/3468 365/185.21 |
| 2007/0211530 A1 | 9/2007 | Nakano | |
| 2007/0288702 A1* | 12/2007 | Roohparvar | G11C 16/3454 711/154 |
| 2011/0238889 A1* | 9/2011 | Miakashi | G11C 16/0483 711/E12.001 |
| 2012/0092363 A1 | 4/2012 | Kim et al. | |
| 2014/0185383 A1* | 7/2014 | Shibata | G11C 16/10 365/185.17 |
| 2014/0340431 A1 | 11/2014 | Yamakawa | |
| 2015/0076579 A1 | 3/2015 | Tsuji et al. | |
| 2015/0263725 A1* | 9/2015 | Onuki | H01L 29/78693 327/108 |
| 2015/0331627 A1* | 11/2015 | Kwak | G06F 12/00 711/103 |
| 2016/0011807 A1* | 1/2016 | Seol | G11C 11/5628 711/102 |
| 2016/0042797 A1* | 2/2016 | Kim | G11C 16/3427 714/764 |
| 2016/0225457 A1* | 8/2016 | Hara | G11C 16/0483 |
| 2016/0267991 A1* | 9/2016 | Hashimoto | H10B 43/10 |
| 2016/0322109 A1* | 11/2016 | Kim | G11C 16/3454 |
| 2017/0017400 A1* | 1/2017 | Kwon | G06F 3/061 |
| 2017/0117283 A1 | 4/2017 | Matsuzaki et al. | |
| 2017/0177515 A1* | 6/2017 | Yoon | G06F 13/4282 |
| 2017/0178739 A1* | 6/2017 | Maejima | G11C 16/0483 |
| 2017/0263318 A1* | 9/2017 | Bushnaq | G11C 11/5628 |
| 2017/0322738 A1* | 11/2017 | Kim | G06F 12/00 |
| 2017/0330531 A1 | 11/2017 | Yamazaki et al. | |
| 2017/0373086 A1* | 12/2017 | Pang | H01L 29/7926 |
| 2020/0203339 A1 | 6/2020 | Yamazaki et al. | |
| 2021/0135010 A1 | 5/2021 | Yamazaki et al. | |
| 2021/0373793 A1* | 12/2021 | Chen | G06F 3/0652 |

FOREIGN PATENT DOCUMENTS

| | | |
|---|---|---|
| JP | 2010-149654 A | 7/2010 |
| JP | 2013-134295 A | 7/2013 |
| JP | 2014-197444 A | 10/2014 |
| JP | 2015-004727 A | 1/2015 |
| JP | 2017-168809 A | 9/2017 |
| JP | 2018-207038 A | 12/2018 |
| KR | 2007-0092642 A | 9/2007 |
| WO | WO-2017/068478 | 4/2017 |

OTHER PUBLICATIONS

Bartling.S et al., "An 8MHz 75μA/MHz Zero-Leakage Non-Volatile Logic-Based Cortex-M0 MCU SoC Exhibiting 100% Digital State Retention at VDD=0V with <400ns Wakeup and Sleep Transitions", ISSCC 2013 (Digest of Technical Papers. IEEE International Solid-State Circuits Conference), Feb. 17, 2013, pp. 432-434.

Ishizu.T et al., "SRAM with C-Axis Aligned Crystalline Oxide Semiconductor: Power Leakage Reduction Technique for Microprocessor Caches", IMW 2014 (6th IEEE International Memory Workshop), May 18, 2014, pp. 103-106.

Singhal.V et al., "A 10.5μA/MHz at 16MHz Single-Cycle Non-Volatile Memory Access Microcontroller with Full State Retention at 108nA in a 90nm Process", ISSCC 2015 (Digest of Technical Papers. IEEE International Solid-State Circuits Conference), Feb. 23, 2015, pp. 148-150.

Sakimura.N et al., "10.5 A 90nm 20MHz Fully Nonvolatile Microcontroller for Standby-Power-Critical Applications", ISSCC 2014 (Digest of Technical Papers. IEEE International Solid-State Circuits Conference), 2014, pp. 184-185.

* cited by examiner

FIG. 16A
Intermediate state
New crystalline phase
| Amorphous | Crystalline | Crystal |
|---|---|---|
| • completely amorphous | • CAAC<br>• nc<br>• CAC<br><br>excluding single crystal and poly crystal | • single crystal<br>• poly crystal |
FIG. 16B
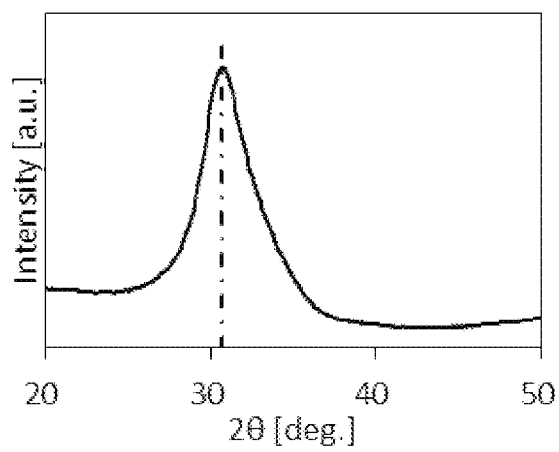
FIG. 16C
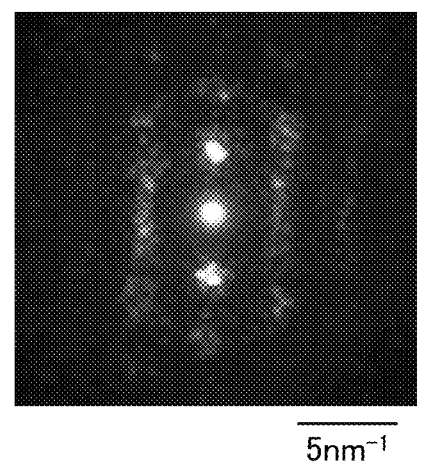

DATA PROCESSING DEVICE AND METHOD FOR OPERATING DATA PROCESSING DEVICE

CROSS REFERENCE TO RELATED APPLICATIONS

This application is a U.S. National Phase Application under 35 U.S.C. § 371 of International Application PCT/IB2020/057947, filed on Aug. 26, 2020, which is incorporated by reference and claims the benefit of foreign priority applications filed in Japan on Nov. 11, 2019, as Application No. 2019-203814 and on Nov. 20, 2019, as Application No. 2019-209362.

TECHNICAL FIELD

One embodiment of the present invention relates to a data processing device and a method for operating the data processing device.

Note that one embodiment of the present invention is not limited to the above technical field. The technical field of the invention disclosed in this specification and the like relates to an object, an operation method, or a manufacturing method. Alternatively, one embodiment of the present invention relates to a process, a machine, manufacture, or a composition of matter. Therefore, specific examples of the technical field of one embodiment of the present invention disclosed in this specification include a semiconductor device, a display device, a liquid crystal display device, a light-emitting device, a power storage device, an imaging device, a memory device, a signal processing device, a sensor, a processor, an electronic device, a data processing device, a system, an operation method thereof, a manufacturing method thereof, and a testing method thereof.

BACKGROUND ART

Research and development for the purpose of reducing power consumption of data processing devices have been intensively carried out, where a reduction in the power consumption of integrated circuits (ICs) such as CPUs or memory devices is a major challenge in circuit design. The power consumption of ICs is broadly classified into operating power consumption (dynamic power) and non-operating (standby) power consumption (static power). Dynamic power increases when operation frequency is increased for higher performance. Most of the static power is power consumed by the leakage current of transistors. Examples of the leakage current include a subthreshold leakage current, a gate tunnel leakage current, a gate-induced drain leakage (GIDL) current, and a junction tunnel leakage current. These leakage currents increase in accordance with scaling down of transistors. Thus, an increase in power consumption is a large barrier to high performance and high integration of ICs.

In order to reduce power consumption of a semiconductor device such as an integrated circuit or a memory device or a data processing device including such a semiconductor device, circuits that do not need to operate are stopped by power gating or clock gating. Power gating has the effect of eliminating standby power because supply of power is stopped. In order to perform power gating in a CPU, it is necessary to back up contents stored in a register or a cache to a nonvolatile memory.

A memory circuit capable of retaining data even when power is off, which takes advantage of a feature of an extremely low off-state current of a transistor including an oxide semiconductor (also referred to as Oxide Semiconductor or simply OS) in its channel formation region (hereinafter, such a transistor is sometimes referred to as an "oxide semiconductor transistor" or an "OS transistor"), has been proposed. For example, Non-Patent Document 1 discloses an OS-SRAM (static random access memory) including a backup circuit that includes an OS transistor. Non-Patent Document 1 discloses that a microprocessor mounted with an OS-SRAM is capable of power gating in a short break-even time (BET) without affecting a normal operation.

REFERENCE

Non-Patent Document

[Non-Patent Document 1] T. Ishizu et al., Int. Memory Workshop, 2014, pp. 106-103.
[Non-Patent Document 2] S. Baffling et al., ISSCC Dig. Tech. Papers, pp. 432-434, 2013.
[Non-Patent Document 3] N. Sakimura et al., ISSCC Dig. Tech. Papers, pp. 184-185, 2014.
[Non-Patent Document 4] V K. Singhal et al., ISSCC Dig. Tech. Papers, pp. 148-149, 2015.

SUMMARY OF THE INVENTION

Problems to be Solved by the Invention

For example, in a NAND memory device or the like, the speed of inputting data for writing (the amount of data that is input per unit time) is lower than the speed of writing data to a memory portion. A cache memory in a memory device temporarily retains data for writing, which has been input to the memory device, whereby data can be written to the memory portion without lowering the speed of inputting data for writing to the memory device. Furthermore, the speed of reading data from the memory portion is lower than the speed of outputting read data (the amount of data that is output per unit time) from the memory device. The cache memory in the memory device temporarily retains the data read from the memory device, whereby data can be read from the memory portion without lowering the speed of reading read data from the memory device.

Furthermore, for example, a cache memory has a function of temporarily retaining data when data retained in a memory portion are permutated or data irrelevant to deletion is saved.

A DRAM (Dynamic Random Access Memory) is used in a cache memory, for example. The cache memory and the NAND memory device are formed by different processes and thus formed on different chips. Therefore, a bus line needs to be provided between the cache memory and the NAND memory device, and the circuit area of the memory device is increased in some cases. In addition, depending on the length of the bus line, power consumption of a signal flowing through the bus line is increased in some cases.

An object of one embodiment of the present invention is to provide a data processing device with a reduced circuit area. Another object of one embodiment of the present invention is to provide a data processing device with low power consumption.

Another object of one embodiment of the present invention is to provide a novel data processing device. Another object of one embodiment of the present invention is to provide a novel method for operating a data processing device.

Note that the objects of one embodiment of the present invention are not limited to the objects listed above. The objects listed above do not preclude the existence of other objects. Note that the other objects are objects that are not described in this section and are described below. The objects that are not described in this section are derived from the description of the specification, the drawings, and the like and can be extracted as appropriate from the description by those skilled in the art. Note that one embodiment of the present invention is to achieve at least one of the objects listed above and the other objects. Note that one embodiment of the present invention does not necessarily achieve all the objects listed above and the other objects.

Means for Solving the Problems (1)

One embodiment of the present invention is a data processing device including a NAND memory portion and a controller. The memory portion includes a first string and a second string in different blocks. The first string and the second string each include a transistor including a metal oxide in a channel formation region. Furthermore, the first string includes a first memory cell, and the second string includes a second memory cell. The controller has a function of, on reception of first data and a signal including an instruction to write the first data, writing the first data to the first memory cell. Then, the controller has a function of reading the first data from the first memory cell and writing the first data to the second memory cell.

(2)

Another embodiment of the present invention is a data processing device including a NAND memory portion and a controller, in which the memory portion includes a first string, a second string, and a third string in different blocks. The first string and the second string each include a transistor including a metal oxide in a channel formation region. The first string includes a first memory cell, the second string includes a second memory cell and a third memory cell, and the third string includes a fourth memory cell. The controller has a function of, on reception of first data and a signal including an instruction to rewrite second data retained in the second memory cell to the first data, writing the first data to the first memory cell. Furthermore, the controller has a function of reading third data retained in the third memory cell and writing the third data to the fourth memory cell. Furthermore, the controller has a function of deleting the second data retained in the second memory cell and the third data retained in the third memory cell. Furthermore, the controller has a function of reading the first data retained in the first memory cell and writing the first data to the second memory cell. Furthermore, the controller has a function of reading the third data retained in the fourth memory cell and writing the third data to the third memory cell.

(3)

Another embodiment of the present invention is a method for operating a data processing device including a NAND memory portion and a controller. The memory portion includes a first string and a second string in different blocks. The first string and the second string each include a transistor including a metal oxide in a channel formation region. The first string includes a first memory cell, and the second string includes a second memory cell. The method for operating the data processing device includes a first step to a third step. The first step includes a step in which the controller receives first data and a signal including an instruction to write the first data; and a step in which the first data is written to the first memory cell by the controller. The second step includes a step in which the first data is read from the first memory cell by the controller. The third step includes a step in which the first data read in the second step is written to the second memory cell by the controller.

(4)

Another embodiment of the present invention is a method for operating a data processing device including a NAND memory portion and a controller, in which the memory portion includes a first string, a second string, and a third string in different blocks. The first string and the second string each include a transistor including a metal oxide in a channel formation region. The first string includes a first memory cell, the second string includes a second memory cell and a third memory cell, and the third string includes a fourth memory cell. The method for operating the data processing device includes a first step to an eighth step. The first step includes a step in which the controller receives first data and a signal including an instruction to rewrite second data retained in the second memory cell to the first data and a step in which the first data is written to the first memory cell by the controller. The second step includes a step in which third data retained in the third memory cell in the second string is read by the controller. The third step includes a step in which the third data read in the second step is written to the fourth memory cell by the controller. The fourth step includes a step in which the second data retained in the second memory cell and the third data retained in the third memory cell are deleted by the controller. The fifth step includes a step in which the first data retained in the first memory cell is read by the controller. The sixth step includes a step in which the first data read in the fifth step is written to the second memory cell by the controller. The seventh step includes a step in which the third data retained in the fourth memory cell is read by the controller. The eighth step includes a step in which the third data read in the seventh step is written to the third memory cell by the controller.

(5)

Another embodiment of the present invention is a method for operating a data processing device including an arithmetic processing unit, a memory device, and a plurality of wirings, in which the memory device includes a plurality of strings and one of the plurality of strings is electrically connected to the arithmetic processing unit through one of the plurality of wirings. The method for operating the data processing device includes: converting first data input by serial transmission into a plurality of second data; distributing the plurality of second data to the plurality of wirings; and supplying the plurality of second data to the plurality of strings at the same time in response to a trigger signal.

(6)

In the above-described structure (5) of one embodiment of the present invention, the strings may include a plurality of memory cells, and the memory cells may include an oxide semiconductor.

(7)

In the above-described structure (5) or (6) of one embodiment of the present invention, the memory device may be a NAND memory device.

(8)

Another embodiment of the present invention is a data processing device including a NAND memory portion and a controller. The memory portion includes a first string and a second string in different blocks. The first string and the second string each include a transistor including a metal oxide in a channel formation region. Furthermore, the first string includes a first memory cell, and the second string includes a second memory cell. The controller has a function of, on reception of first data and a signal including an instruction to write the first data, writing the first data to the first memory cell. Then, the controller has a function of reading the first data from the first memory cell and writing the first data to the second memory cell.

(9)

Another embodiment of the present invention is a data processing device including a NAND memory portion and a controller, in which the memory portion includes a first string, a second string, and a third string in different blocks. The first string and the second string each include a transistor including a metal oxide in a channel formation region. The first string includes a first memory cell, the second string includes a second memory cell and a third memory cell, and the third string includes a fourth memory cell. The controller has a function of, on reception of first data and a signal including an instruction to rewrite second data retained in the second memory cell to the first data, writing the first data to the first memory cell. Furthermore, the controller has a function of reading third data retained in the third memory cell and writing the third data to the fourth memory cell. Furthermore, the controller has a function of deleting the second data retained in the second memory cell and the third data retained in the third memory cell. Furthermore, the controller has a function of reading the first data retained in the first memory cell and writing the first data to the second memory cell. Furthermore, the controller has a function of reading the third data retained in the fourth memory cell and writing the third data to the third memory cell.

(10)

Another embodiment of the present invention is a method for operating a data processing device including a NAND memory portion and a controller. The memory portion includes a first string and a second string in different blocks. The first string and the second string each include a transistor including a metal oxide in a channel formation region. The first string includes a first memory cell, and the second string includes a second memory cell. The method for operating the data processing device includes a first step to a third step. The first step includes a step in which the controller receives first data and a signal including an instruction to write the first data; and a step in which the first data is written to the first memory cell by the controller. The second step includes a step in which the first data is read from the first memory cell by the controller. The third step includes a step in which the first data read in the second step is written to the second memory cell by the controller.

(11)

Another embodiment of the present invention is a method for operating a data processing device including a NAND memory portion and a controller, in which the memory portion includes a first string, a second string, and a third string in different blocks. The first string and the second string each include a transistor including a metal oxide in a channel formation region. The first string includes a first memory cell, the second string includes a second memory cell and a third memory cell, and the third string includes a fourth memory cell. The method for operating the data processing device includes a first step to an eighth step. The first step includes a step in which the controller receives first data and a signal including an instruction to rewrite second data retained in the second memory cell to the first data and a step in which the first data is written to the first memory cell by the controller. The second step includes a step in which third data retained in the third memory cell in the second string is read by the controller. The third step includes a step in which the third data read in the second step is written to the fourth memory cell by the controller. The fourth step includes a step in which the second data retained in the second memory cell and the third data retained in the third memory cell are deleted by the controller. The fifth step includes a step in which the first data retained in the first memory cell is read by the controller. The sixth step includes a step in which the first data read in the fifth step is written to the second memory cell by the controller. The seventh step includes a step in which the third data retained in the fourth memory cell is read by the controller. The eighth step includes a step in which the third data read in the seventh step is written to the third memory cell by the controller.

Note that in this specification and the like, a semiconductor device refers to a device that utilizes semiconductor characteristics, and means a circuit including a semiconductor element (a transistor, a diode, a photodiode, or the like), a device including the circuit, and the like. The semiconductor device also means all devices that can function by utilizing semiconductor characteristics. For example, an integrated circuit, a chip including an integrated circuit, and an electronic component including a chip in a package are examples of the semiconductor device. Moreover, a memory device, a display device, a light-emitting device, a lighting device, an electronic device, a data processing device, and the like themselves are semiconductor devices, or include semiconductor devices in some cases.

In the case where there is a description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relationship, for example, a connection relationship shown in drawings or texts, a connection relationship other than one shown in drawings or texts is regarded as being disclosed in the drawings or the texts. Each of X and Y denotes an object (e.g., a device, an element, a circuit, a wiring, an electrode, a terminal, a conductive film, or a layer).

For example, in the case where X and Y are electrically connected, one or more elements that allow(s) electrical connection between X and Y (e.g., a switch, a transistor, a capacitor, an inductor, a resistor, a diode, a display device, a light-emitting device, and a load) can be connected between X and Y. Note that a switch has a function of being controlled to be turned on or off. That is, the switch has a function of being in a conduction state (on state) or a non-conduction state (off state) to control whether a current flows or not.

For example, in the case where X and Y are functionally connected, one or more circuits that allow(s) functional connection between X and Y (e.g., a logic circuit (an inverter, a NAND circuit, a NOR circuit, or the like); a signal converter circuit (a digital-analog converter circuit, an analog-digital converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; or a control circuit) can be connected between X and Y. For example, even when another circuit is interposed between X and Y, X and Y are functionally connected when a signal output from X is transmitted to Y.

Note that an explicit description, X and Y are electrically connected, includes the case where X and Y are electrically connected (i.e., the case where X and Y are connected with another element or another circuit interposed therebetween) and the case where X and Y are directly connected (i.e., the case where X and Y are connected without another element or another circuit interposed therebetween).

It can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order." Alternatively, it can be expressed as "a source (or a first terminal or the like) of a transistor is electrically connected to X; a drain (or a second terminal or the like) of the transistor is electrically connected to Y; and X, the source (or the first terminal or the like) of the transistor, the drain (or the second terminal or the like) of the transistor, and Y are electrically connected to each other in this order." Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order." When the connection order in a circuit structure is defined by an expression similar to these examples, a source (or a first terminal or the like) and a drain (or a second terminal or the like) of a transistor can be distinguished from each other to specify the technical scope. Note that these expressions are just examples and expressions are not limited to these expressions. Here, X and Y each denote an object (e.g., a device, an element, a circuit, a wiring, an electrode, a terminal, a conductive film, or a layer).

Note that even if a circuit diagram shows that independent components are electrically connected to each other, one component has functions of a plurality of components in some cases. For example, when part of a wiring also functions as an electrode, one conductive film has functions of both of the components, the function of a wiring and the function of an electrode. Thus, electrical connection in this specification also includes such a case where one conductive film has functions of a plurality of components, in its category.

In this specification and the like, a "resistor" can be, for example, a circuit element or a wiring having a resistance value higher than 0Ω. Therefore, in this specification and the like, a "resistor" sometimes includes a wiring having a resistance value, a transistor in which a current flows between its source and drain, a diode, and a coil. Thus, the term "resistor" can be replaced with the terms "resistance", "load", "region having a resistance value", and the like; inversely, the terms "resistance", "load", and "region having a resistance value" can be replaced with the term "resistor" and the like. The resistance value can be, for example, preferably greater than or equal to 1 mΩ and less than or equal to 10Ω, further preferably greater than or equal to 5 mΩ and less than or equal to 5Ω, still further preferably greater than or equal to 10 mΩ and less than or equal to 1Ω. As another example, the resistance value may be greater than or equal to 1Ω and less than or equal to $1\times10^9$Ω.

In this specification and the like, a "capacitor" can be, for example, a circuit element having an electrostatic capacitance value higher than 0 F, a region of a wiring having an electrostatic capacitance value, parasitic capacitance, or gate capacitance of a transistor. Therefore, in this specification and the like, a "capacitor" sometimes includes not only a circuit element that has a pair of electrodes and a dielectric between the electrodes, but also parasitic capacitance generated between wirings, gate capacitance generated between a gate and one of a source and a drain of a transistor, and the like. The terms "capacitor", "parasitic capacitance", "gate capacitance", and the like can be replaced with the term "capacitance" and the like; inversely, the term "capacitance" can be replaced with the terms "capacitor", "parasitic capacitance", "gate capacitance", and the like. The term "pair of electrodes" of "capacitor" can be replaced with "pair of conductors", "pair of conductive regions", "pair of regions", and the like. Note that the electrostatic capacitance value can be greater than or equal to 0.05 fF and less than or equal to 10 pF, for example. Alternatively, the electrostatic capacitance value may be greater than or equal to 1 pF and less than or equal to 10 μF, for example.

In this specification and the like, a transistor includes three terminals called a gate, a source, and a drain. The gate functions as a control terminal for controlling the conduction state of the transistor. Two terminals functioning as the source and the drain are input/output terminals of the transistor. One of the two input/output terminals serves as the source and the other serves as the drain on the basis of the conductivity type (n-channel type or p-channel type) of the transistor and the levels of potentials applied to the three terminals of the transistor. Thus, the terms "source" and "drain" can be replaced with each other in this specification and the like. In this specification and the like, expressions "one of a source and a drain" (or a first electrode or a first terminal) and "the other of the source and the drain" (or a second electrode or a second terminal) are used in description of the connection relationship of a transistor. Depending on the transistor structure, a transistor may include a backgate in addition to the above three terminals. In that case, in this specification and the like, one of the gate and the backgate of the transistor may be referred to as a first gate and the other of the gate and the backgate of the transistor may be referred to as a second gate. Moreover, the terms "gate" and "backgate" can be replaced with each other in one transistor in some cases. In the case where a transistor includes three or more gates, the gates may be referred to as a first gate, a second gate, and a third gate, for example, in this specification and the like.

In this specification and the like, a node can be referred to as a terminal, a wiring, an electrode, a conductive layer, a conductor, an impurity region, or the like depending on the circuit structure, the device structure, or the like. Furthermore, a terminal, a wiring, or the like can be referred to as a node.

In this specification and the like, "voltage" and "potential" can be replaced with each other as appropriate. The "voltage" refers to a potential difference from a reference potential, and when the reference potential is a ground potential, for example, the "voltage" can be replaced with the "potential". Note that the ground potential does not necessarily mean 0 V. Moreover, potentials are relative values, and a potential supplied to a wiring, a potential applied to a circuit and the like, a potential output from a circuit and the like, for example, are changed with a change of the reference potential.

In this specification and the like, the term "high-level potential" or "low-level potential" does not mean a particular potential. For example, in the case where two wirings are both described as "functioning as a wiring for supplying a high-level potential", the levels of the high-level potentials supplied by the wirings are not necessarily equal to each other. Similarly, in the case where two wirings are both described as "functioning as a wiring for supplying a low-level potential", the levels of the low-level potentials supplied by the wirings are not necessarily equal to each other.

Note that "a current" is a charge transfer (electrical conduction); for example, the description "electrical conduction of positively charged particles occurs" can be rephrased as "electrical conduction of negatively charged particles occurs in the opposite direction." Therefore, unless otherwise specified, "a current" in this specification and the like refers to a charge transfer (electrical conduction) accompanied by carrier movement. Examples of a carrier here include an electron, a hole, an anion, a cation, and a complex ion, and the type of carrier differs between current flow systems (e.g., a semiconductor, a metal, an electrolyte solution, and a vacuum). The "direction of a current" in a wiring or the like refers to the direction in which a carrier with a positive charge moves, and the amount of current is expressed as a positive value. In other words, the direction in which a carrier with a negative charge moves is opposite to the direction of a current, and the amount of current is expressed as a negative value. Thus, in the case where the polarity of a current (or the direction of a current) is not specified in this specification and the like, the description "a current flows from Element A to Element B" can be rephrased as "a current flows from Element B to Element A", for example. The description "a current is input to Element A" can be rephrased as "a current is output from Element A", for example.

Ordinal numbers such as "first", "second", and "third" in this specification and the like are used to avoid confusion among components. Thus, the terms do not limit the number of components. Furthermore, the ordinal numbers do not limit the order of components. In this specification and the like, for example, a "first" component in one embodiment can be referred to as a "second" component in other embodiments or claims. Furthermore, in this specification and the like, for example, a "first" component in one embodiment can be omitted in other embodiments or claims In this specification and the like, the terms for describing positioning, such as "over" and "under", are sometimes used for convenience to describe the positional relationship between components with reference to drawings. The positional relation between components is changed as appropriate in accordance with a direction in which the components are described. Thus, the positional relationship is not limited to the terms described in the specification and the like, and can be described with another term as appropriate depending on the situation. For example, the expression "an insulator positioned over (on) a top surface of a conductor" can be replaced with the expression "an insulator positioned under (on) a bottom surface of a conductor" when the direction of a drawing showing these components is rotated by 180°.

Furthermore, the terms such as "over" and "under" do not necessarily mean that a component is placed directly over or directly under and in direct contact with another component. For example, the expression "Electrode B over Insulating Layer A" does not necessarily mean that Electrode B is formed on and in direct contact with Insulating Layer A, and does not exclude the case where another component is provided between Insulating Layer A and Electrode B.

In this specification and the like, the terms "film", "layer", and the like can be interchanged with each other depending on the situation. For example, the term "conductive layer" can be changed into the term "conductive film" in some cases. Moreover, the term "insulating film" can be changed into the term "insulating layer" in some cases. Alternatively, the term "film", "layer", or the like is not used and can be interchanged with another term depending on the case or according to circumstances. For example, the term "conductive layer" or "conductive film" can be changed into the term "conductor" in some cases. Furthermore, for example, the term "insulating layer" or "insulating film" can be changed into the term "insulator" in some cases.

In this specification and the like, the term "electrode", "wiring", "terminal", or the like does not limit the function of a component. For example, an "electrode" is used as part of a "wiring" in some cases, and vice versa. Furthermore, the term "electrode" or "wiring" also includes the case where a plurality of "electrodes" or "wirings" are formed in an integrated manner, for example. For example, a "terminal" is used as part of a "wiring" or an "electrode" in some cases, and vice versa. Furthermore, the term "terminal" can also include the case where a plurality of "electrodes", "wirings", "terminals", or the like are formed in an integrated manner. Therefore, for example, an "electrode" can be part of a "wiring" or a "terminal", and a "terminal" can be part of a "wiring" or an "electrode". Moreover, the term "electrode", "wiring", "terminal", or the like is sometimes replaced with the term "region", for example.

In this specification and the like, the terms "wiring", "signal line", "power supply line", and the like can be interchanged with each other depending on the case or according to circumstances. For example, the term "wiring" can be changed into the term "signal line" in some cases. Also, for example, the term "wiring" can be changed into the term "power source line" in some cases. Inversely, the term "signal line", "power supply line", or the like can be changed into the term "wiring" in some cases. The term "power source line" or the like can be changed into the term "signal line" or the like in some cases. Inversely, the term "signal line" or the like can be changed into the term "power source line" or the like in some cases. The term "potential" that is applied to a wiring can be changed into the term "signal" or the like depending on the case or according to circumstances. Inversely, the term "signal" or the like can be changed into the term "potential" in some cases.

In this specification and the like, an impurity in a semiconductor refers to an element other than a main component of a semiconductor layer, for example. For example, an element with a concentration of lower than 0.1 atomic % is an impurity. When an impurity is contained, for example, the density of defect states in a semiconductor may be increased, the carrier mobility may be decreased, or the crystallinity may be decreased. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components; specifically, there are hydrogen (contained also in water), lithium, sodium, silicon, boron, phosphorus, carbon, and nitrogen, for example. Specifically, when the semiconductor is a silicon layer, examples of an impurity that changes characteristics of the semiconductor include Group 1 elements, Group 2 elements, Group 13 elements, and Group 15 elements (except oxygen and hydrogen).

In this specification and the like, a switch has a function of being in a conduction state (on state) or a non-conduction state (off state) to determine whether a current flows or not. Alternatively, a switch has a function of selecting and changing a current path. For example, an electrical switch or a mechanical switch can be used. That is, a switch can be any element capable of controlling a current, and is not limited to a certain element.

Examples of an electrical switch include a transistor (e.g., a bipolar transistor and a MOS transistor), a diode (e.g., a PN diode, a PIN diode, a Schottky diode, a MIM (Metal Insulator Metal) diode, a MIS (Metal Insulator Semiconductor) diode, and a diode-connected transistor), and a logic circuit in which such elements are combined. Note that in the case of using a transistor as a switch, a "conduction state" of the transistor refers to a state where a source electrode and a drain electrode of the transistor can be regarded as being electrically short-circuited. Furthermore, a "non-conduction state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of a mechanical switch is a switch formed using a MEMS (micro electro mechanical system) technology. Such a switch includes an electrode which can be moved mechanically, and operates by controlling conduction and non-conduction with movement of the electrode.

In this specification, "parallel" indicates a state where the angle formed between two straight lines is greater than or equal to −10° and less than or equal to 10°. Accordingly, the case where the angle is greater than or equal to −5° and less than or equal to 5° is also included. In addition, the term "approximately parallel" or "substantially parallel" indicates a state where two straight lines are placed at an angle greater than or equal to −30° and less than or equal to 30°. In addition, "perpendicular" indicates a state where the angle formed between two straight lines is greater than or equal to 80° and less than or equal to 100°. Accordingly, the case where the angle is greater than or equal to 85° and less than or equal to 95° is also included. Furthermore, "approximately perpendicular" or "substantially perpendicular" indicates a state where two straight lines are placed at an angle greater than or equal to 60° and less than or equal to 120°.

Effect of the Invention

With one embodiment of the present invention, a data device with a reduced circuit area can be provided. With one embodiment of the present invention, a data processing device with low power consumption can be provided.

With one embodiment of the present invention, a novel data processing device can be provided. An object of one embodiment of the present invention is to provide a novel method for operating a data processing device.

Note that the effects of one embodiment of the present invention are not limited to the effects listed above. The effects listed above do not preclude the existence of other effects. Note that the other effects are effects that are not described in this section and are described below. The effects that are not described in this section are derived from the description of the specification, the drawings, or the like and can be extracted from the description by those skilled in the art. Note that one embodiment of the present invention has at least one of the effects listed above and the other effects. Accordingly, depending on the case, one embodiment of the present invention does not have the effects listed above in some cases.

BRIEF DESCRIPTION OF THE DRAWINGS

FIG. 16A is a diagram showing classifications of crystal structures of IGZO, FIG. 16B is a diagram showing an XRD spectrum of crystalline IGZO, and FIG. 16C is a diagram showing a nanobeam electron diffraction pattern of the crystalline IGZO.

MODE FOR CARRYING OUT THE INVENTION

Figure 1:
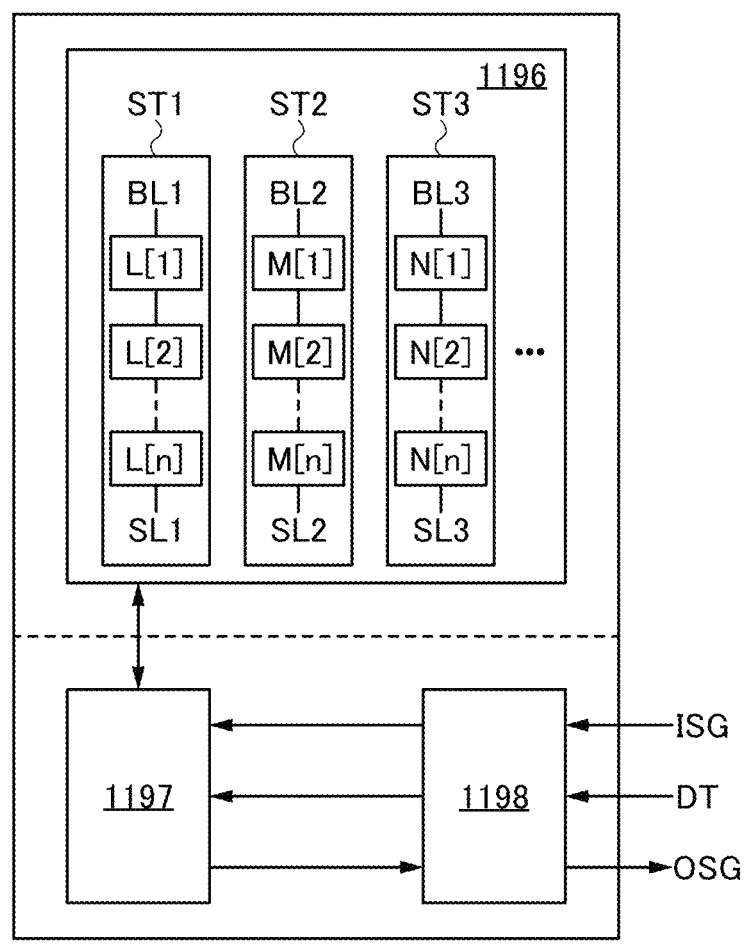
FIG. 1 is a block diagram illustrating a structure example of a data processing device.

In this specification and the like, a metal oxide is an oxide of metal in a broad sense. Metal oxides are classified into an oxide insulator, an oxide conductor (including a transparent oxide conductor), an oxide semiconductor, and the like. For example, in the case where a metal oxide is used in an active layer of a transistor, the metal oxide is referred to as an oxide semiconductor in some cases. That is, when a metal oxide can form a channel formation region of a transistor that has at least one of an amplifying function, a rectifying function, and a switching function, the metal oxide can be referred to as a metal oxide semiconductor.

Furthermore, in this specification and the like, a metal oxide containing nitrogen is also collectively referred to as a metal oxide in some cases. A metal oxide containing nitrogen may be referred to as a metal oxynitride.

In this specification and the like, one embodiment of the present invention can be constituted by appropriately combining a structure described in an embodiment with any of the structures described in the other embodiments. In addition, in the case where a plurality of structure examples are described in one embodiment, the structure examples can be combined as appropriate.

Note that a content (or part of the content) described in one embodiment can be applied to, combined with, or replaced with at least one of another content (or part of the content) in the embodiment and a content (or part of the content) described in one or a plurality of different embodiments.

Note that in each embodiment (or the example), a content described in the embodiment is a content described with reference to a variety of diagrams or a content described with text disclosed in the specification.

Note that by combining a drawing (or part thereof) described in one embodiment with at least one of another part of the drawing, a different drawing (or part thereof) described in the embodiment, and a drawing (or part thereof) described in one or a plurality of different embodiments, much more drawings can be constituted.

Embodiments described in this specification are described with reference to the drawings. Note that the embodiments can be implemented in many different modes, and it will be readily appreciated by those skilled in the art that modes and details can be changed in various ways without departing from the spirit and scope thereof. Therefore, the present invention should not be interpreted as being limited to the description in the embodiments. Note that in the structures of the invention in the embodiments, the same portions or portions having similar functions are denoted by the same reference numerals in different drawings, and repeated description thereof is omitted in some cases. In perspective views and the like, some components might not be illustrated for clarity of the drawings.

In this specification and the like, when a plurality of components are denoted with the same reference numerals, and in particular need to be distinguished from each other, an identification sign such as "_1", "[n]", or "[m, n]" is sometimes added to the reference numerals.

In the drawings in this specification, the size, the layer thickness, or the region is exaggerated for clarity in some cases. Therefore, they are not limited to the illustrated scale. The drawings are schematic views showing ideal examples, and embodiments of the present invention are not limited to shapes, values, or the like shown in the drawings. For example, variations in signal, voltage, or current due to noise, variations in signal, voltage, or current due to difference in timing, or the like can be included.

Embodiment 1

In this embodiment, a data processing device of one embodiment of the present invention having a function of a memory device is described.

<Structure Example>

FIG. 1 is a block diagram illustrating a structure example of a data processing device. A data processing device 50 includes a memory portion 1196, a controller 1197, and a bus interface 1198, for example.

The data processing device 50 has a function of, on reception of a signal including instruction data from the outside, writing data to the memory portion 1196 in accordance with the instruction, for example.

Specifically, for example, a signal ISG including instruction data input to the data processing device 50 is input to the controller 1197 through the bus interface 1198.

The controller 1197 has a function of decoding the signal ISG, for example. The controller 1197 has a function of executing various controls in accordance with an instruction included in the decoded signal. Specifically, the controller 1197 generates addresses in the memory portion 1196 and writes or reads data to/from the memory portion 1196 in accordance with the state of the data processing device. When writing to the memory portion 1196 is performed, data for writing can be, for example, data DT input to the data processing device through the bus interface 1198. The data DT is transmitted to the controller 1197 through the bus interface 1198.

Therefore, in some cases, the controller 1197 includes a circuit which decodes the signal ISG, a circuit which generates the addresses of memory cells included in the memory portion 1196, and a circuit which outputs a signal for switching between on and off states of transistors included in the memory portion 1196, for example.

The controller 1197 may have a function of generating a signal that controls the timing of operation. For example, the controller 1197 may include an internal clock generator which generates an internal clock signal based on a reference clock signal, and be configured to supply the internal clock signal to the above-described various circuits.

The controller 1197 may have a function of performing error check on a memory cell in a string included in the memory portion 1196. This function of the controller 1197 allows error check on the memory cell in the string included in the memory portion 1196 before the controller 1197 writes data to the memory portion 1196, for example. In the case where a defective cell is found in the string to which writing is to be performed, the controller 1197 can change the data writing destination from the defective cell to another cell and perform a data writing operation. The controller 1197 may have a function of performing error check on a memory cell of a string included in the memory portion 1196 at regular intervals and, when finding a defective cell in the string, correcting data.

The data processing device 50 has a function of, on reception of a signal including instruction data from the outside, reading data from the memory portion 1196 in accordance with the instruction, for example. Furthermore, the data processing device 50 has a function of outputting the data read by the controller 1197 to the outside of the data processing device 50 as a signal OSG.

In the data processing device of one embodiment of the present invention, a memory circuit including NAND strings can be used as the memory portion 1196, for example. As the NAND memory circuit, a three-dimensional NAND memory circuit using OS transistors is particularly preferably used. As a memory cell structure, there are a structure where horizontal NAND strings using OS transistors are stacked one by one and a structure where vertical NAND strings using OS transistors are formed at once by etching or the like. In this specification and the like, the structure with the vertical NAND strings using OS transistors is referred to as a 3D OS NAND (registered trademark) memory circuit, in some cases. Since many memory cells can be formed at the same time in the 3D OS NAND memory circuit, the mounting density can be increased through a small number of manufacturing steps. In other words, the cost per bit can be reduced, whereby a memory circuit having a high mounting density can be formed at low cost. Thus, the memory portion 1196 includes a plurality of NAND strings. FIG. 1 illustrates an example where the memory portion 1196 includes a string ST1 to a string ST3. In the memory portion 1196 in FIG. 1, strings except the string ST1 to the string ST3 are omitted.

For example, the string ST1 includes a memory cell L[1] to a memory cell L[n] (n is an integer more than or equal to 1), the string ST2 includes a memory cell M[1] to a memory cell M[n], and the string ST3 includes a memory cell N[1] to a memory cell N[n].

In the string ST1, the memory cell L[1] to the memory cell L[n] are electrically connected in series between a wiring SL1 and a wiring BL1. Similarly, in the string ST2, the memory cell M[1] to the memory cell M[n] are electrically connected in series between a wiring SL2 and a wiring BL2; and in the string ST3, the memory cell N[1] to the memory cell N[n] are electrically connected in series between a wiring SL3 and a wiring BL3.

The wiring SL1 to the wiring SL3, respectively, function as wirings which supply predetermined potentials to the string ST1 to the string ST3. Furthermore, the wiring BL1 to the wiring BL3, respectively, function as wirings for writing data to the memory cells included in the string ST1 to the string ST3 and/or wirings for reading data from the memory cells.

Note that a connection structure similar to that of the string ST1 to the string ST3 applies to unillustrated strings.

<Operation Method Example>

Here, an example of an operation method in which some memory cells included in the strings of the memory portion 1196 are treated as a cache memory in the data processing device 50 in FIG. 1 is described.

Figure 2:
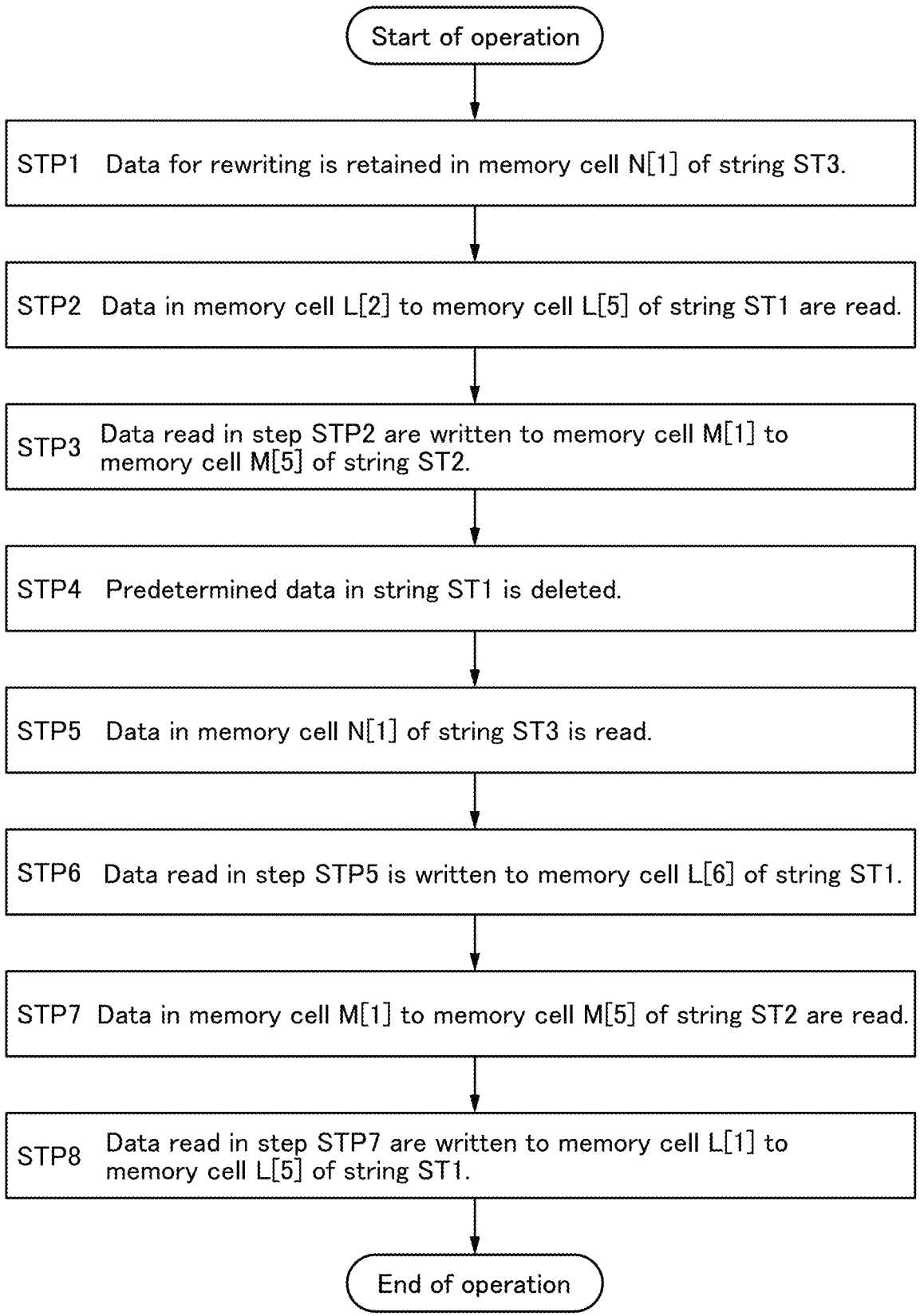
FIG. 2 is a flow chart showing an example of a method for operating the data processing device.
Figure 3A:
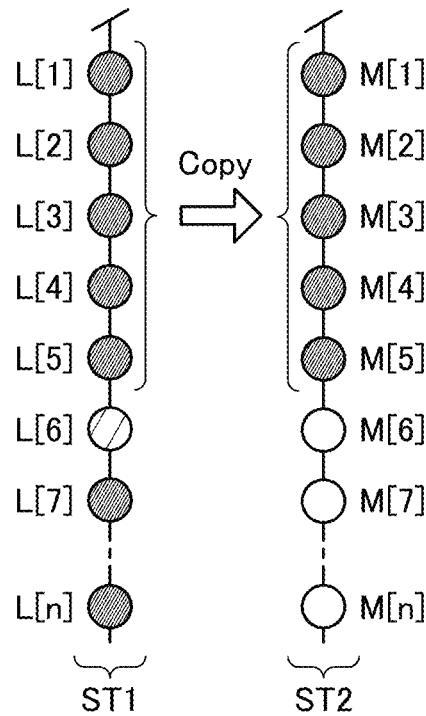
FIG. 3A to FIG. 3C are schematic views illustrating an example of a method for operating the data processing device.
Figure 3B:
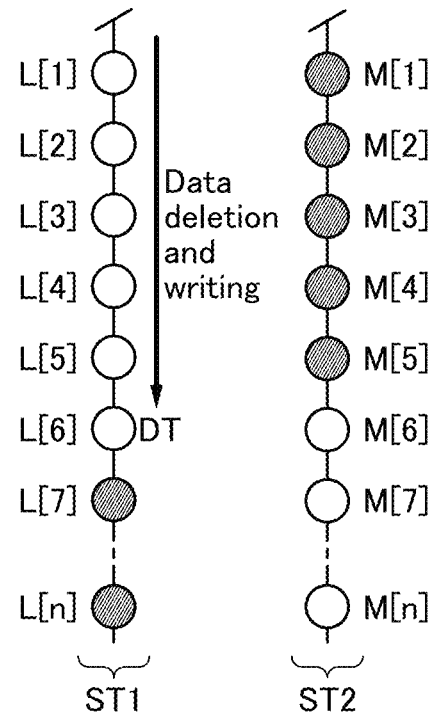
Figure 3C:
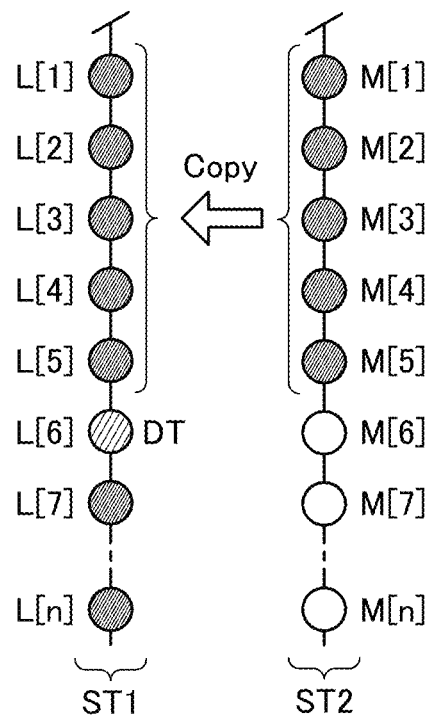

FIG. 2 is a flow chart showing an example of a method for operating the data processing device 50 in FIG. 1. The operation method includes a step STP1 to a step STP8. FIG. 3A to FIG. 3C illustrate the movement of data in the string ST1 and the string ST2 which is linked to the flow chart.

In this operation method, a case where data is retained in each of the memory cells L[1] to L[n] in the string ST1 and data in the memory cell L[6] is rewritten is considered as an example. In addition, it is assumed that data is not retained in at least the string ST2 and the string ST3.

When the operation starts in the data processing device 50 in FIG. 1, the step STP1 is initially performed.

The step STP1 includes a step of writing, to the memory cell N[1] of the string ST3, data that is to be rewritten to the memory cell L[1], for example. Specifically, for example, the data processing device 50 in FIG. 1 receives the data DT for rewriting and the signal ISG including an instruction to rewrite data, a writing signal is transmitted from the controller 1197 to the memory portion 1196, and the data DT for writing is retained in the memory cell M[1].

After the step STP1 is finished, the step STP2 is performed. The step STP2 includes a step of reading data retained in each of the memory cells L[1] to L[n] other than the memory cell where rewriting is to be performed in the string ST1. Here, for example, data retained in each of the memory cells L[1] to L[5] is read (see FIG. 3A).

The step STP3 includes a step of sequentially writing (copying) the data of the memory cell L[1] to the memory cell L[5], which have been read in the step STP2, to the memory cell M[1] to the memory cell M[5] of the string ST2 (see FIG. 3A).

Note that although the step STP3 is performed next to the step STP2 in the flow chart in FIG. 2, the method for operating the data processing device of one embodiment of the present invention is not limited thereto. For example, in the step STP2, the data retained in each of the memory cells L[1] to L[5] of the string ST1 may be sequentially read, and writing to the memory cell M[1] to the memory cell M[5] of the string ST2 may be performed sequentially from the read data. In other words, the step STP2 and the step STP3 may be combined to one step.

After the step STP3 is finished, the step STP4 is performed. The step STP4 includes a step of deleting the data retained in the memory cell L[1] to the memory cell L[5] of the string ST1.

In the case where the memory portion 1196 is a NAND memory circuit, a data deletion operation is performed on a string basis. Thus, all the data in the memory cell L[1] to the memory cell L[n] are deleted when trying to delete the data retained in the memory cell L[1] to the memory cell L[5] of the string ST1. Therefore, in the step STP2 and the step STP3, not only the data in the memory cell L[1] to the memory cell L[5] but also data in the memory cell L[7] to the memory cell L[n] need to be written to the string ST2.

Thus, the memory portion 1196 is preferably an OS NAND memory circuit having any of circuit structures illustrated in FIG. 4 to FIG. 6, which are described later. Although the details are described later, using such a memory device enables deletion of data from the memory cell L[1] to a desired memory cell in the string ST1. Since the data of the memory cell L[6] is rewritten in this operation example, only the data in the memory cell L[1] to the memory cell L[6] of the string ST1 are deleted (see FIG. 3B).

The step STP5 includes a step of reading the data DT for rewriting from the memory cell N[1] of the string ST3.

The step STP6 includes a step of writing the data DT for rewriting, which has been read from the memory cell N[1] in the step STP5, to the memory cell L[6] of the string ST1 (see FIG. 3B).

The step STP7 includes a step of reading the data retained in each of the memory cells M[1] to M[5] of the string ST2. The data corresponds to the data written in the step STP3 (see FIG. 3C).

The step STP8 includes a step of sequentially writing (copying) the data of the memory cell M[1] to the memory cell M[5], which have been read in the step STP5, to the memory cell L[1] to the memory cell L[5] of the string ST1 (see FIG. 3C).

Note that although the step STP8 is performed next to the step STP7 in the flow chart in FIG. 2, the method for operating the data processing device of one embodiment of the present invention is not limited thereto. For example, in the step STP7, the data retained in each of the memory cells M[1] to M[5] of the string ST2 may be sequentially read, and writing to the memory cell L[2] to the memory cell N[5] of the string ST1 may be performed sequentially from the read data. In other words, the step STP7 and the step STP8 may be combined to one step.

As described above in the step STP1 to the step STP8, when data is written to a string of the memory portion 1196 or when data retained in a string is rewritten, for example, a memory cell in a different string in the memory portion 1196 can be treated as a cache memory.

In the data processing device 50 illustrated in FIG. 1, a semiconductor substrate (e.g., a single crystal substrate or a silicon substrate) is preferably used as a substrate on which the circuits are formed, for example. Examples of the substrate include an SOI substrate, a glass substrate, a quartz substrate, a plastic substrate, a sapphire glass substrate, a metal substrate, a stainless steel substrate, a substrate including stainless steel foil, a tungsten substrate, a substrate including tungsten foil, a flexible substrate, an attachment film, paper including a fibrous material, and a base material film. Examples of the glass substrate include barium borosilicate glass, aluminoborosilicate glass, and soda lime glass. As examples of the flexible substrate, the attachment film, the base material film, and the like, the following can be given. Examples include plastics typified by polyethylene terephthalate (PET), polyethylene naphthalate (PEN), polyether sulfone (PES), and polytetrafluoroethylene (PTFE). Another example is a synthetic resin such as acrylic. Furthermore, polypropylene, polyester, polyvinyl fluoride, and polyvinyl chloride can be given as examples. Other examples include polyamide, polyimide, aramid, an epoxy resin, an inorganic vapor deposition film, and paper. In particular, the use of a semiconductor substrate, a single crystal substrate, an SOI substrate, or the like enables the manufacture of small-sized transistors with a small variation in characteristics, size, shape, or the like and with high current capability. When a circuit is formed with such transistors, lower power consumption of the circuit or higher integration of the circuit can be achieved.

Alternatively, a flexible substrate may be used as the substrate, and a transistor may be directly formed over the flexible substrate. Alternatively, a separation layer may be provided between the substrate and the transistor. After part or the whole of a data processing device is completed over the separation layer, the separation layer can be used for separation from the substrate and transfer to another substrate. In that case, the transistor can be transferred to even a substrate having low heat resistance or a flexible substrate. As the separation layer, a stacked-layer structure of inorganic films of a tungsten film and a silicon oxide film, or a structure in which an organic resin film of polyimide or the like is formed over a substrate can be used, for example.

In other words, the transistor may be formed using one substrate and then transferred to another substrate; thus, the transistor may be positioned over another substrate. Examples of the substrate to which the transistor is transferred include, in addition to the above-described substrates over which the transistor can be formed, a paper substrate, a cellophane substrate, an aramid film substrate, a polyimide film substrate, a stone substrate, a wood substrate, a cloth substrate (including a natural fiber (silk, cotton, or hemp), a synthetic fiber (nylon, polyurethane, or polyester), a regenerated fiber (acetate, cupro, rayon, or regenerated polyester), or the like), a leather substrate, and a rubber substrate. When such a substrate is used, forming a transistor with excellent characteristics, forming a transistor with low power consumption, manufacturing a device with high durability, providing high heat resistance, reducing weight, or reducing thickness can be achieved.

Note that all the circuits necessary to achieve a predetermined function can be formed over one substrate (e.g., a glass substrate, a plastic substrate, a single crystal substrate, or an SOI substrate). In this manner, the cost can be reduced by a reduction in the number of components or the reliability can be improved by a reduction in the number of connection points to circuit components.

Note that it is possible that not all the circuits necessary to achieve a predetermined function are formed over one substrate. That is, it is possible to form part of the circuits necessary to achieve the predetermined function over a given substrate and form the other part of the circuits necessary to achieve the predetermined function over another substrate. For example, part of the circuits necessary to achieve the predetermined function can be formed over a glass substrate, and the other part of the circuits necessary to achieve the predetermined function can be formed over a single crystal substrate (or an SOI substrate). The single crystal substrate where the other part of the circuits necessary to achieve the predetermined function is formed (also referred to as an IC chip) can be connected to the glass substrate by COG (Chip On Glass), and the IC chip can be placed over the glass substrate. Alternatively, the IC chip can be connected to the glass substrate by TAB (Tape Automated Bonding), COF (Chip On Film), or SMT (Surface Mount Technology), or using a printed circuit board, for example. When part of the circuits is formed over the same substrate as a pixel portion in this manner, the cost can be reduced by a reduction in the number of components or the reliability can be improved by a reduction in the number of connection points to circuit components. In particular, a circuit in a portion where the driving voltage is high, a circuit in a portion where the driving frequency is high, or the like consumes much power in many cases. In view of this, such a circuit is formed over a substrate (e.g., a single crystal substrate) different from a substrate where a pixel portion is formed, whereby an IC chip is formed. The use of this IC chip can prevent the increase in power consumption.

Note that one embodiment of the present invention is not limited to the structure of the data processing device 50 illustrated in FIG. 1. In one embodiment of the present invention, the structure of the data processing device 50 illustrated in FIG. 1 may be changed in accordance with the circumstances. For example, the structure of strings of the memory portion 1196 included in the data processing device 50 illustrated in FIG. 1 may be changed to any of the structures of strings described in Embodiment 2.

Note that this embodiment can be combined with any of the other embodiments in this specification as appropriate.

Embodiment 2

In this embodiment, structure examples of a memory portion (NAND memory circuit) that can be used in the memory portion 1196 of Embodiment 1 are described.

<Structure Example of Memory Portion (Memory Circuit)>

Figure 4A:
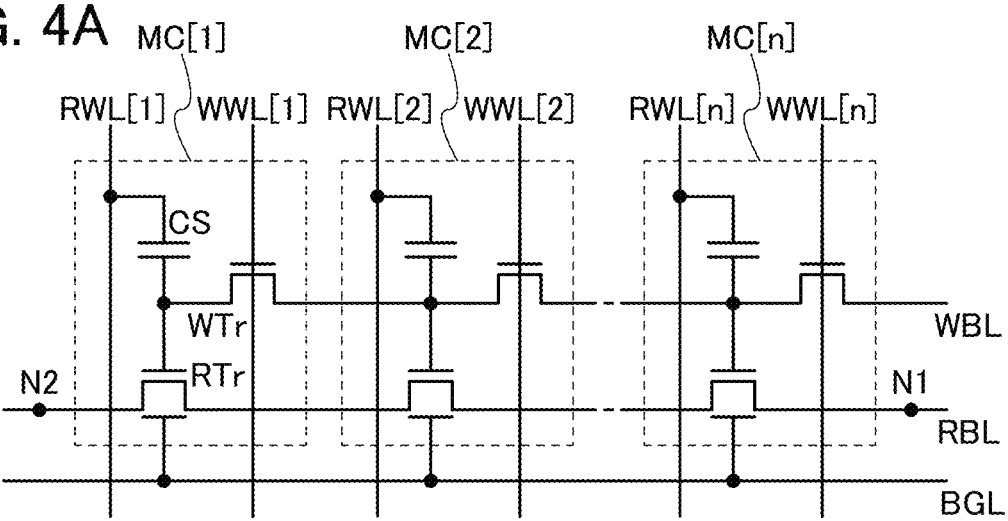
FIG. 4A to FIG. 4C are circuit diagrams illustrating structure examples of a memory portion included in the data processing device.

An example of the memory portion is described with reference to FIG. 4A. FIG. 4A is a circuit diagram of n memory cells (n is an integer more than or equal to 1). Specifically, the circuit illustrated in FIG. 4A includes the memory cells MC[1] to MC[n] and wirings WWL[1] to WWL[n], wirings RWL[1] to RWL[n], a wiring WBL, and a wiring RBL for controlling the memory cells. The wiring WWL functions as a write word line, the wiring RWL functions as a read word line, the wiring WBL functions as a write bit line, and the wiring RBL functions as a read bit line.

Each of the memory cells MC includes a transistor WTr, a transistor RTr, and a capacitor CS. The transistor RTr illustrated in FIG. 4A has a backgate; application of a potential to the backgate can change the threshold voltage of the transistor RTr. The wiring BGL illustrated in FIG. 4A is electrically connected to the backgates of the transistors RTr in the memory cells MC[1] to MC[n]. Instead of including one wiring BGL electrically connected to the backgates of the transistors RTr in the memory cells MC[1] to MC[n], the semiconductor device in FIG. 4A may include wirings BGL that are electrically connected to the respective backgates independently to supply different potentials to the backgates.

For example, a channel formation region of the transistor WTr preferably contains a metal oxide described in Embodiment 6. Specifically, a metal oxide that contains one or more elements selected from indium, an element M (the element M is for example aluminum, gallium, yttrium, copper, vanadium, beryllium, boron, titanium, iron, nickel, germanium, zirconium, molybdenum, lanthanum, cerium, neodymium, hafnium, tantalum, tungsten, or magnesium), and zinc functions as a wide gap semiconductor; thus, a transistor containing the metal oxide in its channel formation region has ultralow off-state current characteristics.

For a channel formation region of the transistor RTr, a material achieving high field-effect mobility of the transistor is preferably used. Using such a transistor allows the semiconductor device to operate faster. Examples of the material contained in the channel formation region of the transistor RTr include semiconductor materials such as silicon and the metal oxide described in Embodiment 6.

The transistor WTr functions as a write transistor, and the transistor RTr functions as a read transistor. The on/off state of the transistor WTr is switched by a potential supplied to the wiring WWL. The potential of one electrode of the capacitor CS is controlled with the wiring RWL. The other electrode of the capacitor CS is electrically connected to a gate of the transistor RTr. The other electrode of the capacitor CS can be referred to as a memory node. In each of the memory cells MC, the memory node is electrically connected to a first terminal of the transistor WTr.

A second terminal of the transistor WTr is electrically connected in series with the first terminal of the transistor WTr in the adjacent memory cell MC. Similarly, a first terminal of the transistor RTr is electrically connected in series with a second terminal of the transistor RTr in the adjacent memory cell MC. The second terminal of the transistor WTr in the memory cell MC[n] is electrically connected to the wiring WBL. The second terminal of the transistor RTr in the memory cell MC[n] is electrically connected to the wiring RBL. In this embodiment, a connection point of the second terminal of the transistor RTr in the memory cell MC[n] and the wiring RBL is referred to as a node N1, and the first terminal of the transistor RTr in the memory cell MC[1] is referred to as a node N2. Note that a selection transistor may be connected in series with the transistor RTr of the memory cell MC[n] in order to control electrical continuity between the node N1 and the wiring RBL. Similarly, a selection transistor may be connected in series with the transistor RTr of the memory cell MC[1] in order to control electrical continuity between the node N2 and a wiring connected to the node N2.

Figure 4B:
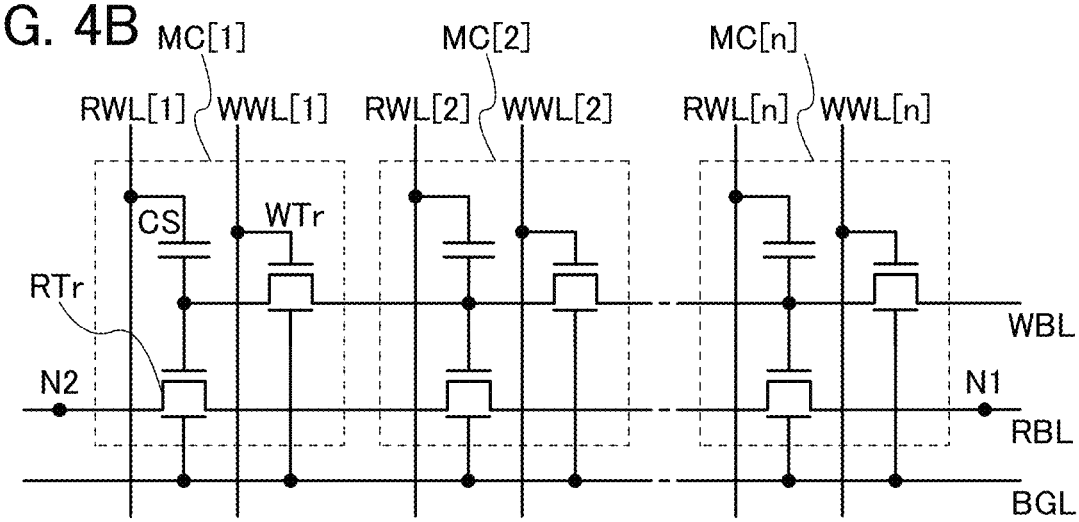

Note that one embodiment of the present invention is not limited to the semiconductor device illustrated in FIG. 4A. One embodiment of the present invention can have a circuit structure obtained by appropriately changing the circuit structure of the semiconductor device in FIG. 4A. For example, one embodiment of the present invention may be a semiconductor device in which the transistor WTr also has a backgate as illustrated in FIG. 4B. In the semiconductor device in FIG. 4B including the components of the semiconductor device illustrated in FIG. 4A, the transistors WTr in the memory cells MC[1] to MC[n] are provided with backgates to which the wiring BGL is electrically connected. As another example, one embodiment of the present invention may be a semiconductor device in which the transistor RTr and the transistor WTr have no backgate as illustrated in FIG. 4C.

Figure 4C:
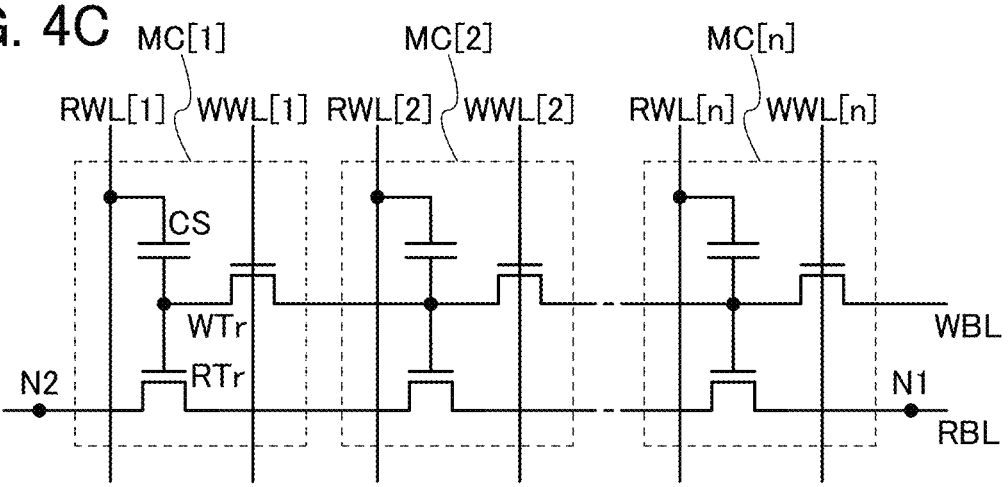

To further increase the memory capacity of the semiconductor devices in FIG. 4A to FIG. 4C, the semiconductor devices illustrated in FIG. 4A to FIG. 4C are arranged in a matrix. For example, a circuit structure illustrated in FIG. 5 is obtained when the semiconductor devices in FIG. 4B are arranged in a matrix.

Figure 5:
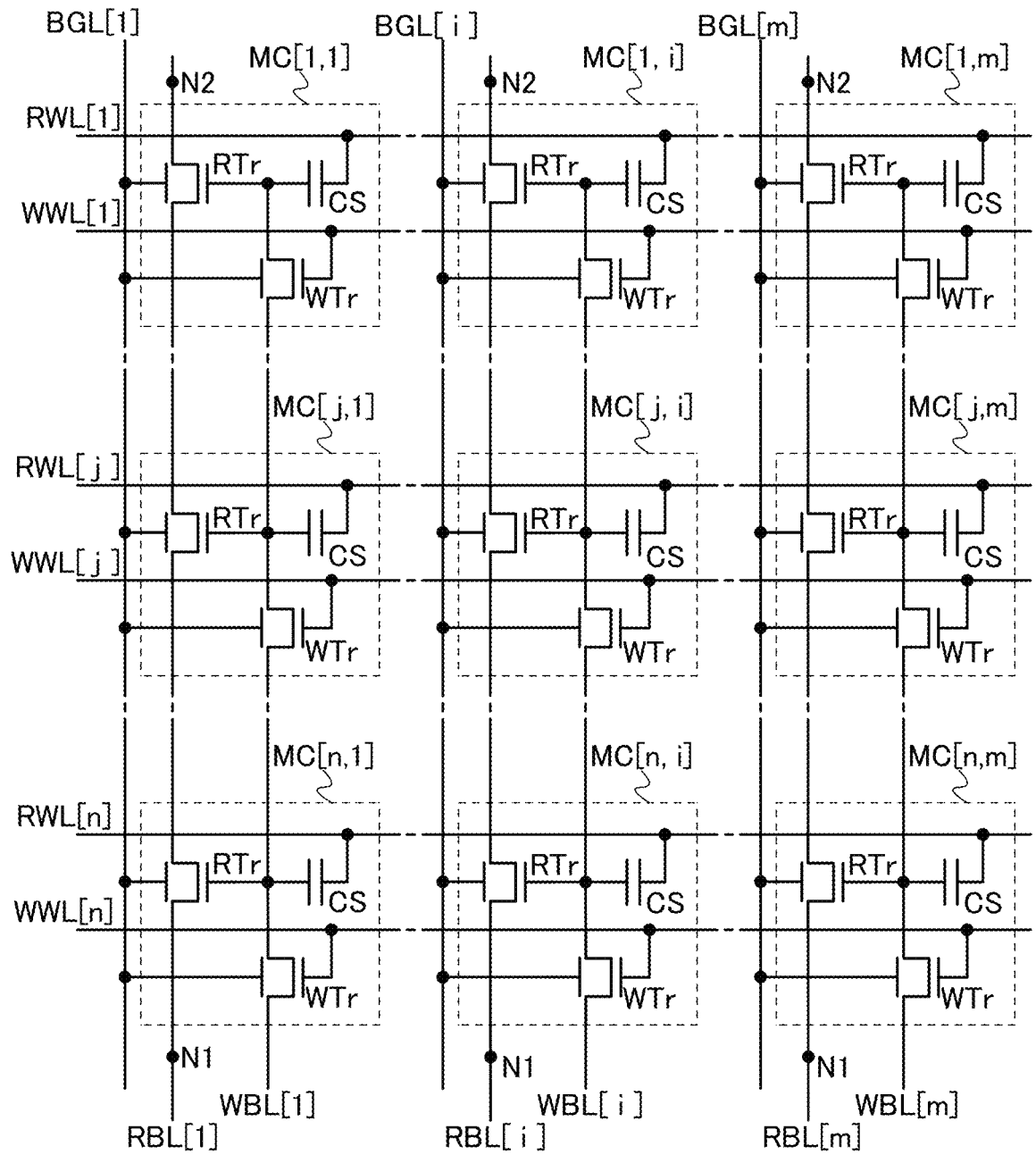
FIG. 5 is a circuit diagram illustrating a structure example of the memory portion included in the data processing device.

In the semiconductor device illustrated in FIG. 5, the semiconductor devices in FIG. 4B are arranged in m columns (m is an integer more than or equal to 1), and the wiring RWL and the wiring WWL are electrically connected to and shared between the memory cells MC in the same row. That is, the semiconductor device in FIG. 5 has a matrix of n rows and m columns and includes the memory cells MC[1, 1] to MC[n, m]. Accordingly, in the semiconductor device in FIG. 5, electrical connection is established through the wirings RWL[1] to RWL[n], the wirings WWL[1] to WWL[n], wirings RBL[1] to RBL[m], wirings WBL[1] to WBL[m], and the wirings BGL[1] to BGL[m]. Specifically, one electrode of the capacitor CS in the memory cell MC[j, i] (j is an integer more than or equal to 1 and less than or equal to n, and i is an integer more than or equal to 1 and less than or equal to m) is electrically connected to the wiring RWL[j]. The gate of the transistor WTr in the memory cell MC[j, i] is electrically connected to the wiring WWL[j]. The wiring WBL[i] is electrically connected to the second terminal of the transistor WTr in the memory cell MC[n, i]. The wiring RBL[i] is electrically connected to the second terminal of the transistor RTr in the memory cell MC[n, i].

FIG. 5 only illustrates the memory cell MC[1, 1], the memory cell MC[1, i], the memory cell MC[1, m], the memory cell MC[j, 1], the memory cell MC[j, i], the memory cell MC[j, m], the memory cell MC[n, 1], the memory cell MC[n, i], the memory cell MC[n, m], the wiring RWL[1], the wiring RWL[j], the wiring RWL[n], the wiring WWL[1], the wiring WWL[j], the wiring WWL[n], the wiring RBL[1], the wiring RBL[i], the wiring RBL[m], the wiring WBL[1], the wiring WBL[i], the wiring WBL[m], the wiring BGL[1], the wiring BGL[i], the wiring BGL[m], the capacitors CS, the transistors WTr, the transistors RTr, the nodes N1, and the nodes N2.

Note that in this specification and the like, the memory cell MC[1, i] to the memory cell MC[n, i] electrically connected between the node N1 and the node N2 in the i-th column may be referred to as a string in the i-th column, for example. Furthermore, for example, the memory cell MC[j, 1] to the memory cell MC[j, m] electrically connected to the wiring RWL[j] and the wiring WWL[j] in the j-th row may be referred to as a page in the j-th row. Moreover, for example, the memory cell MC[1, 1] to the memory cell MC[n, m] arranged in a matrix of n rows and m columns illustrated in FIG. 5 may collectively be referred to as a block.

Figure 6:
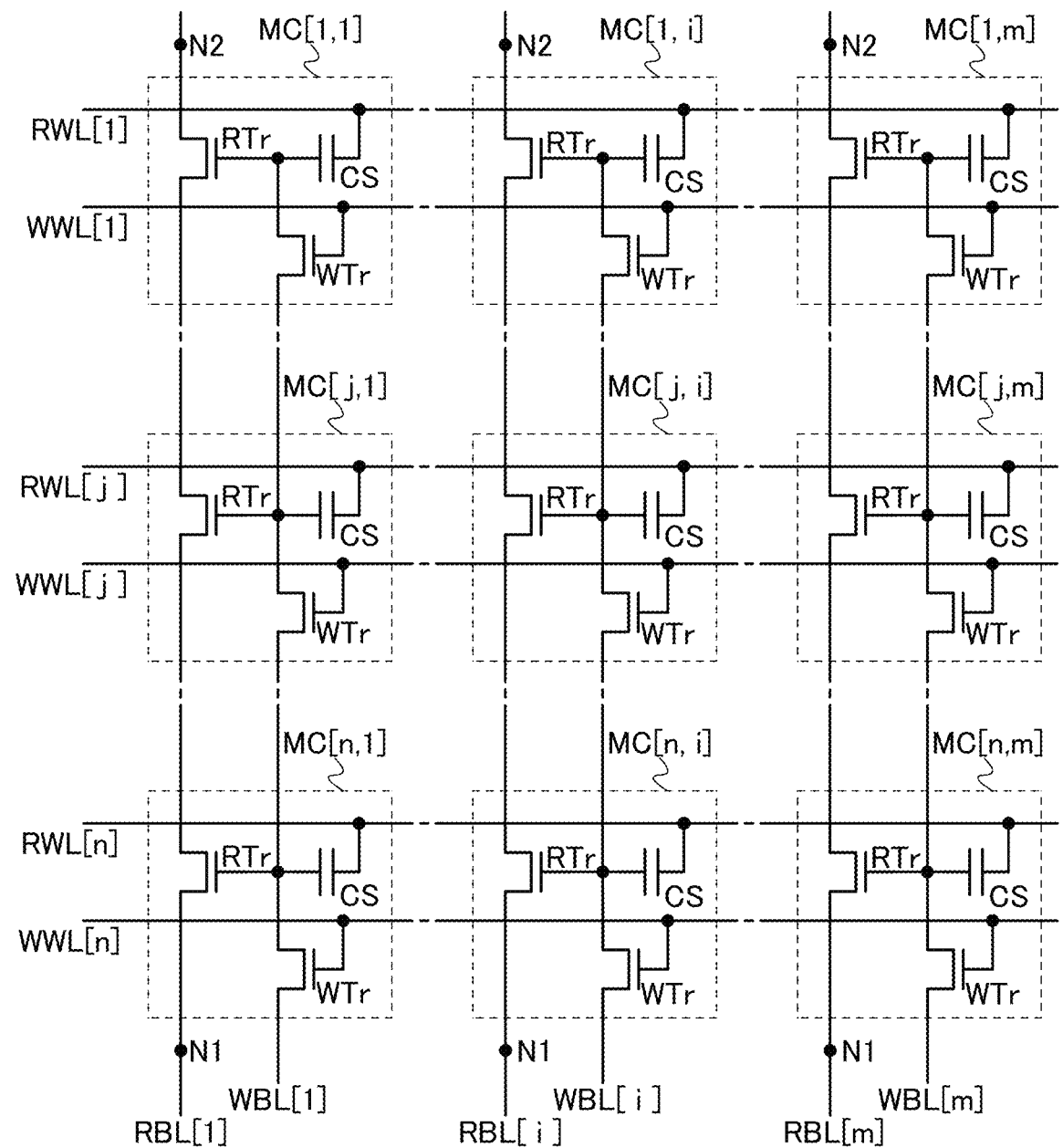
FIG. 6 is a circuit diagram illustrating a structure example of the memory portion included in the data processing device.

In FIG. 6, the semiconductor devices in FIG. 4C are arranged in m columns (m is an integer more than or equal to 1). In the semiconductor device in FIG. 6, the transistors in all the memory cells MC do not have a backgate; hence, the semiconductor device in FIG. 6 does not include the wiring BGL. Note that the description of the semiconductor device in FIG. 5 is referred to for the semiconductor device in FIG. 6.

<<Operation Method Example>>

Next, an example of a method for operating the semiconductor devices in FIGS. 4A to 4C will be described. Note that in the following description, a low-level potential and a high-level potential do not represent any fixed potentials, and specific potentials may vary depending on wirings. For example, a low-level potential and a high-level potential supplied to the wiring WWL may be different from a low-level potential and a high-level potential supplied to the wiring RWL.

In this operation method example, the wiring BGL in FIG. 4A and FIG. 4B has previously been supplied with a potential in a range where the transistor RTr and/or the transistor WTr operate normally. Accordingly, the operations of the semiconductor devices in FIG. 4A to FIG. 4C can be considered the same.

Figure 7A:
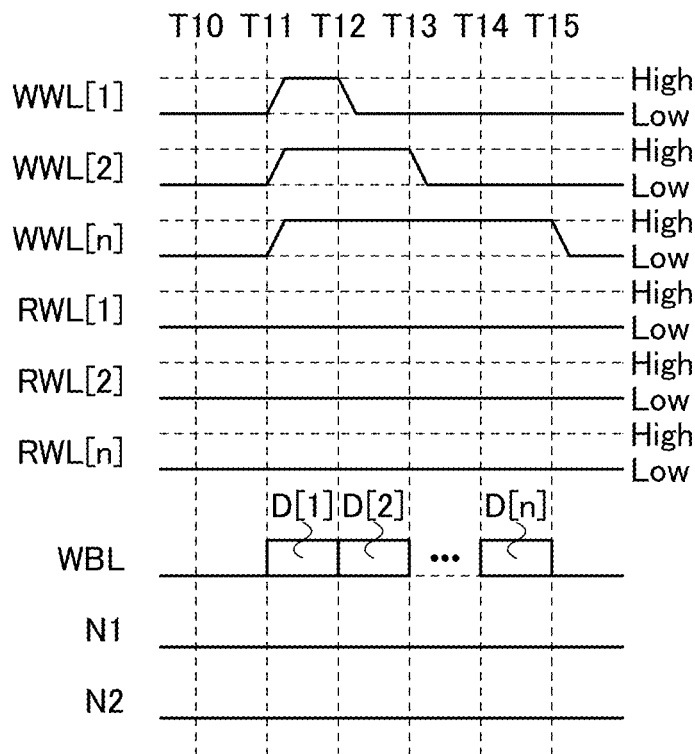
FIG. 7A and FIG. 7B are timing charts illustrating an example of a method for operating the memory portion included in the data processing device.
Figure 7B:
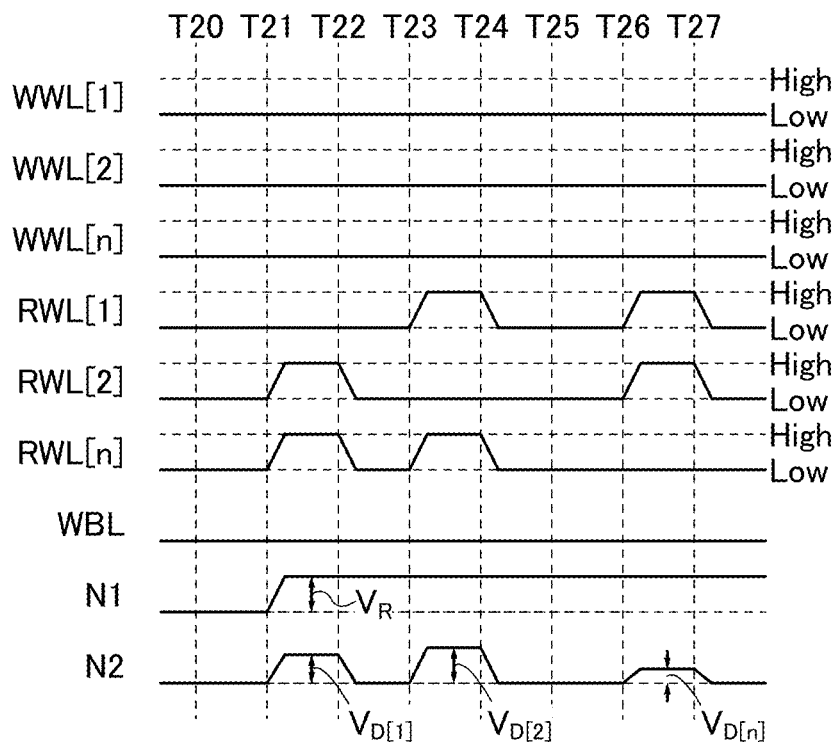

FIG. 7A is a timing chart showing an operation example for writing data to the semiconductor device. FIG. 7B is a timing chart showing an operation example for reading data from the semiconductor device. The timing charts in FIG. 7A and FIG. 7B each show changes in the potential level of the wiring WWL[1], the wiring WWL[2], the wiring WWL[n], the wiring RWL[1], the wiring RWL[2], the wiring RWL[n], the node N1, and the node N2. As for the wiring WBL, data supplied to the wiring WBL is shown.

FIG. 7A shows an example of writing data D[1] to data D[n] to the respective memory cells MC[1] to MC[n]. Note that the data D[1] to the data D[n] can be binary data, multilevel data, analog data, or the like. The data D[1] to the data D[n] are supplied from the wirings WBL. That is, in the circuit structures of the semiconductor devices in FIGS. 4A to 4C, data is written to the memory cells MC sequentially from the memory cell MC[1] to the memory cell MC[n].

For example, if data is to be written to the memory cell MC[1] after data is written to the memory cell MC[2], the data stored in the memory cell MC[2] is lost during data writing to the memory cell MC[1] unless the data written to the memory cell MC[2] is read out in advance and saved in another place.

When data is written to the memory cell MC[i] (here, i is an integer more than or equal to 2 and less than or equal to n) in the circuit structures of the semiconductor devices in FIGS. 4A to 4C, in order to prevent rewriting of data retained in the memory cells MC[1] to MC[i−1], a low-level potential is supplied to the wirings WWL[1] to WWL[i−1] so that the transistors WTr in the memory cells MC[1] to MC[i−1] are turned off. Thus, the data retained in each of the memory cells MC[1] to MC[i−1] can be protected.

Moreover, when data is written to the memory cell MC[i], since the data is supplied from the wiring WBL, a high-level potential is supplied to the wiring WWL[i] to WWL[n] so that the transistors WTr in the memory cells MC[i] to MC[n] are sufficiently turned on. Consequently, the data can be retained in the memory node of the memory cell MC[i].

When data is written to the semiconductor devices having the circuit structures in FIGS. 4A to 4C, the wiring RBL can be controlled independently of the other wirings; therefore, the wiring RBL does not need to be set to a specific potential but can be set to a low-level potential, for example. That is, the potential of the node N1 can be set to a low-level potential. The potential of the node N2 can also be set to a low-level potential.

In light of the above, the operation example shown in the timing chart of FIG. 7A is described. At time T10, the wirings WWL[1] to WWL[n], the wirings RWL[1] to RWL[n], the wiring WBL, the node N1, and the node N2 have a low-level potential.

At time T11, supply of a high-level potential to the wirings WWL[1] to WWL[n] starts. Thus, the transistors WTr in the memory cells MC[1] to MC[n] are sufficiently turned on between time T11 and time T12. The data D[1] is supplied to the wiring WBL. Since the transistors WTr in the memory cells MC[1] to MC[n] are sufficiently turned on, the data D[1] reaches and is written to the memory node of the memory cell MC[1].

At time T12, supply of a low-level potential to the wiring WWL[1] starts, and the high-level potential is continuously supplied to the wirings WWL[2] to WWL[n]. Thus, between time T12 and time T13, the transistor WTr in the memory cell MC[1] is turned off and the transistors WTr in the memory cells MC[2] to MC[n] remain in a sufficient on state. The data D[2] is supplied to the wiring WBL. Since the transistors WTr in the memory cells MC[2] to MC[n] are sufficiently turned on, the data D[2] reaches and is written to the memory node of the memory cell MC[2]. The data D[1] retained in the memory cell MC[1] is not lost by the write operation between time T12 and time T13 because the transistor WTr in the memory cell MC[1] is turned off.

Between time T13 and time T14, the data D[3] to the data D[n−1] are sequentially written to the memory cells MC[3] to MC[n−1] in the same manner as the operation of writing the data D[1] to the memory cell MC[1] between time T11 and time T12 and the operation of writing the data D[2] to the memory cell MC[2] between time T12 and time T13. Specifically, the transistors WTr in the memory cells MC[1] to MC[j−1] into which the data have been written (here, j is an integer more than or equal to 3 and less than or equal to n−1) are turned off, the transistors WTr in the memory cells MC[j] to MC[n] into which the data has not been written yet are sufficiently turned on, and the data D[j] is supplied from the wiring WBL and written to the memory node of the memory cell MC[j]. Then, when writing of the data D[j] to the memory cell MC[j] ends, the transistor WTr in the memory cell MC[j] is turned off, and the data D[j+1] is supplied from the wiring WBL and written to the memory node of the memory cell MC[j+1]. Note that the write operation for j=n−1 refers to the following operation between time T14 and time T15.

At time T14, a low-level potential is supplied to the wirings WWL[1] to WWL[n−1] starts, and the high-level potential is continuously supplied to the wiring WWL[n]. Thus, between time T14 and time T15, the transistors WTr in the memory cells MC[1] to MC[n−1] are turned off and the transistor WTr in the memory cell MC[n] remains in a sufficient on state. The data D[n] is supplied to the wiring WBL. Since the transistor WTr in the memory cell MC[n] is sufficiently turned on, the data D[n] reaches and is written to the memory node of the memory cell MC[n]. The data D[1] to the data D[n−1] stored in the respective memory cells MC[1] to MC[n−1] are not lost by the write operation between time T14 and time T15 because the transistors WTr in the memory cells MC[1] to MC[n−1] are turned off.

With the above operation, data can be written to the memory cells MC included in any one of the semiconductor devices illustrated in FIGS. 4A to 4C.

FIG. 7B illustrates an example of a timing chart for reading the data D[1] to the data D[n] from the respective memory cells MC[1] to MC[n]. Here, the transistors WTr need to be off to maintain the data stored in the memory cells MC. For that reason, the wirings WWL[1] to WWL[n] are set to a low-level potential during the operation of reading the data from the memory cells MC[1] to MC[n].

To read data in a specific memory cell MC in the semiconductor devices having the circuit structures in FIGS.

4A to 4C, the transistor RTr in the specific memory cell MC is made to operate in the saturation region after the transistors RTr in the other memory cells MC are sufficiently turned on. That is, a current flowing between the source and the drain of the transistor RTr in the specific memory cell MC is determined based on the source-drain voltage and data retained in the specific memory cell MC.

For example, a case of reading data retained in the memory cell MC[k] (here, k is an integer more than or equal to 1 and less than or equal to n) is considered. At this time, a high-level potential is supplied to the wirings RWL[1] to RWL[n] except the wiring RWL[k] so that the transistors RTr in the memory cells MC[1] to MC[n] except the memory cell MC[k] are sufficiently turned on.

Meanwhile, in order to set the transistor RTr in the memory cell MC[k] to an on state corresponding to the retained data, the wiring RWL[k] needs to have the same potential as the wiring RWL[k] at the time of writing the data to the memory cell MC[k]. Here, the potential of the wiring RWL[k] in the write operation and the read operation is considered as a low-level potential.

For example, a potential of +3 V is supplied to the node N1, and a potential of 0 V is supplied to the node N2. Then, the node N2 is made floating, and the potential of the node N2 is measured subsequently. When the wirings RWL[1] to RWL[n] except the wiring RWL[k] are set to a high-level potential, the transistors RTr in the memory cells MC[1] to MC[n] except the memory cell MC[k] are sufficiently turned on. Meanwhile, the voltage between the first terminal and the second terminal of the transistor RTr in the memory cell MC[k] depends on the gate potential of the transistor RTr and the potential of the node N1; hence, the potential of the node N2 is determined based on the data retained in the memory node of the memory cell MC[k].

In the above manner, the data stored in the memory cell MC[k] can be read out.

In light of the above, the operation example shown in the timing chart of FIG. 7B is described. At time T20, the wirings WWL[1] to WWL[n], the wirings RWL[1] to RWL[n], the wiring WBL, the node N1, and the node N2 have a low-level potential. Specifically, the node N2 is floating. The data D[1] to the data D[n] are retained in the memory nodes of the respective memory cells MC[1] to MC[n].

Between time T21 and time T22, a low-level potential starts to be supplied to the wiring RWL[1], and a high-level potential starts to be supplied to the wirings RWL[2] to RWL[n]. Thus, the transistors RTr in the memory cells MC[2] to MC[n] are sufficiently turned on between time T21 and time T22. The transistor RTr in the memory cell MC[1] becomes an on state corresponding to the data D[1] retained in the memory node of the memory cell MC[1]. Moreover, a potential $V_R$ is supplied to the wiring RBL. Consequently, the potential of the node N1 becomes $V_R$, and the potential of the node N2 is determined based on the potential $V_R$ of the node N1 and the data retained in the memory node of the memory cell MC[1]. Here, the potential of the node N2 is denoted by $V_{D[1]}$. By measurement of the potential $V_{D[1]}$ of the node N2, the data D[1] retained in the memory node of the memory cell MC[1] can be read out.

Between time T22 and time T23, a low-level potential starts to be supplied to the wirings RWL[1] to RWL[n]. A low-level potential is supplied to the node N2, and then the node N2 becomes floating. That is, the potentials of the wirings RWL[1] to RWL[n] and the node N2 between time T22 and time T23 become the same as those between time T20 and time T21. Note that the wiring RBL may be continuously supplied with the potential $V_R$ or may be supplied with a low-level potential. In this operation example, the wiring RBL is continuously supplied with the potential $V_R$ after time T21.

Between time T23 and time T24, a low-level potential is supplied to the wiring RWL[2], and a high-level potential starts to be supplied to the wiring RWL[1] and the wirings RWL[3] to RWL[n]. Hence, the transistors RTr in the memory cell MC[1] and the memory cells MC[3] to MC[n] are sufficiently turned on between time T23 and time T24. The transistor RTr in the memory cell MC[2] becomes an on state corresponding to the data D[2] retained in the memory node of the memory cell MC[2]. The potential $V_R$ is continuously supplied to the wiring RBL. Consequently, the potential of the node N2 is determined based on the potential $V_R$ of the node N1 and the data retained in the memory node of the memory cell MC[2]. Here, the potential of the node N2 is denoted by $V_{D[2]}$. By measurement of the potential $V_{D[2]}$ of the node N2, the data D[2] retained in the memory node of the memory cell MC[2] can be read out.

Between time T24 and time T25, the data D[3] to the data D[n−1] are sequentially read from the memory cells MC[3] to MC[n−1] in the same manner as the operation of reading the data D[1] from the memory cell MC[1] between time T20 and time T22 and the operation of reading the data D[2] from the memory cell MC[2] between time T22 and time T24. Specifically, to read the data D[j] from the memory cell MC[j] (here, j is an integer more than or equal to 3 and less than or equal to n−1), the node N2 is set to a low-level potential and is made floating, and then a high-level potential is supplied to the wirings RWL[1] to RWL[n] except the wiring RWL[j] so that the transistors RTr in the memory cells MC[1] to MC[n] except the memory cell MC[j] are sufficiently turned on and the transistor RTr in the memory cell MC[j] is set to an on state corresponding to the data D[j]. Next, the potential of the node N1 is set to $V_R$, whereby the potential of the node N2 becomes a potential corresponding to the data D[j]; by measurement of this potential, the data D[j] can be read out. After the data D[j] retained in the memory cell MC[j] is read out, as preparation for the next read operation, a low-level potential starts to be supplied to the wirings RWL[1] to RWL[n] to set the node N2 to a low-level potential, and then the node N2 is made floating. Note that this preparation for j=n−1 refers to the operation between time T25 and time T26.

Between time T25 and time T26, a low-level potential starts to be supplied to the wirings RWL[1] to RWL[n]. A low-level potential starts to be supplied to the node N2; the node N2 becomes floating after the potential of the node N2 becomes the low-level potential. That is, the potentials of the wirings RWL[1] to RWL[n] and the node N2 between time T25 and time T26 become the same as those between time T20 and time T21. Note that the wiring RBL may be continuously supplied with the potential $V_R$ or may be supplied with a low-level potential. In this operation example, the potential $V_R$ starts to be supplied to the wiring RBL at time T21 and is continuously supplied to the wiring RBL at and after time T22.

At time T26, a low-level potential is supplied to the wiring RWL[n], and a high-level potential is supplied to the wirings RWL[1] to RWL[n−1]. Thus, the transistors RTr in the memory cells MC[1] to MC[n−1] are sufficiently turned on between time T26 and time T27. The transistor RTr in the memory cell MC[n] becomes an on state corresponding to the data D[n] retained in the memory node of the memory cell MC[n]. The potential $V_R$ is continuously supplied to the wiring RBL. Accordingly, the potential of the node N2 is determined based on the potential $V_R$ of the node N1 and the data retained in the memory node of the memory cell MC[n]. Here, the potential of the node N2 is denoted by $V_{D[n]}$. By measurement of the potential $V_{D[n]}$ of the node N2, the data D[n] retained in the memory node of the memory cell MC[n] can be read out.

With the above operation, data can be read from each of the memory cells MC in the semiconductor devices illustrated in FIG. 4A to FIG. 4C.

Note that the operation in the data processing device of one embodiment of the present invention is not limited to the above operation example. The operation in the data processing device of one embodiment of the present invention may be appropriately changed from the above-described operation example in accordance with the circumstances. For example, in the above-described read operation, the potential $V_R$ is supplied to the node N1 to read the potential $V_D$ corresponding to the data retained in the memory node of the target memory cell MC from the node N2.

Next, an example of a method for treating the NAND memory circuit illustrated in FIG. 5 or FIG. 6 as a cache memory in order to use the circuit in the memory portion 1196 of FIG. 1 is described.

Figure 8:
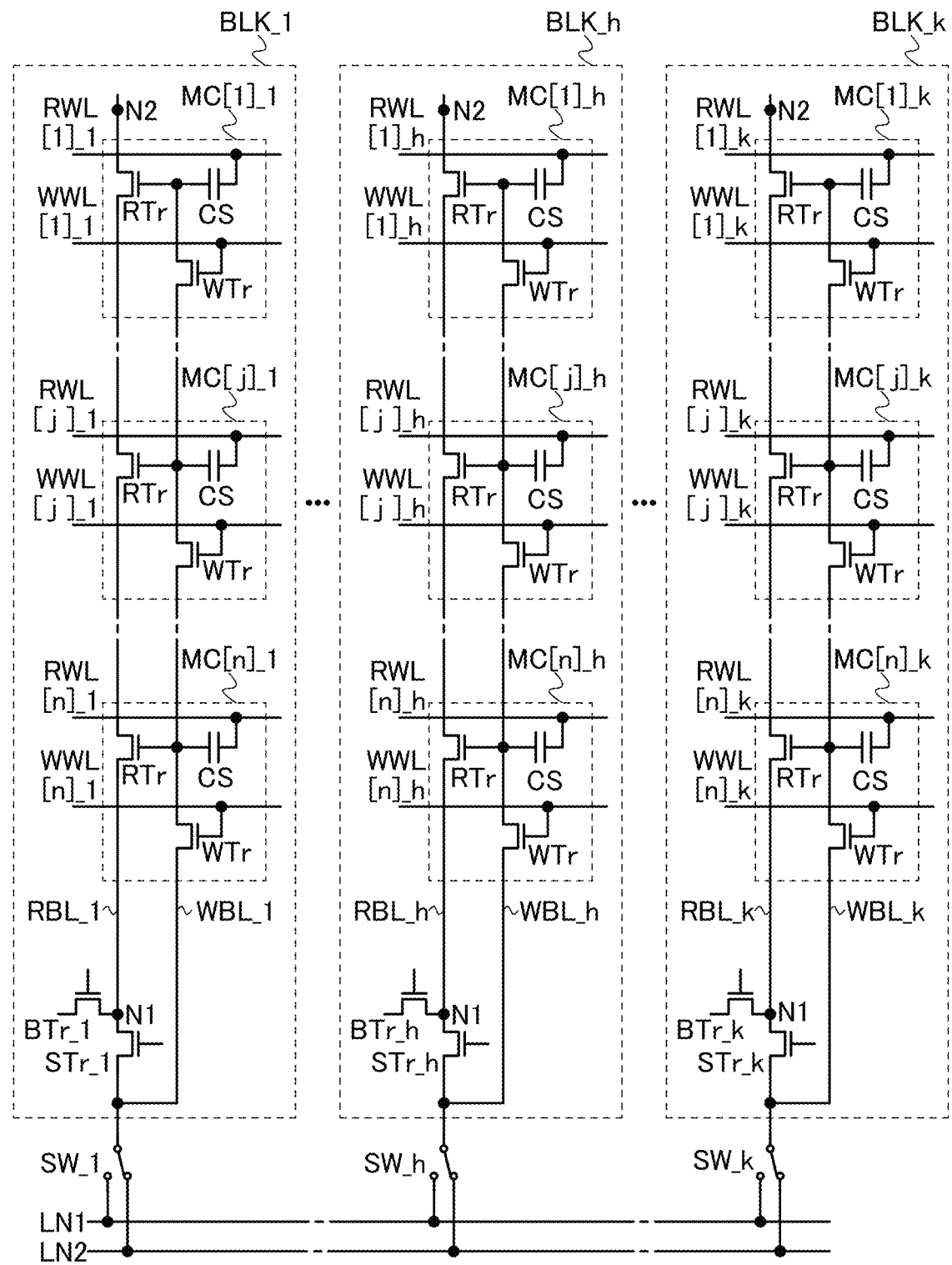
FIG. 8 is a circuit diagram illustrating a structure example of a memory portion included in the data processing device.

FIG. 8 illustrates a structure example of a memory portion including a block BLK_1 to a block BLK_k (k is an integer more than or equal to 1). Each of the block BLK_1 to the block BLK_k includes the memory cells MC[1, 1] to the memory cell MC[n, m] in a matrix of n rows and m columns illustrated in FIG. 5 or FIG. 6, for example. In the block BLK_1 to the block BLK_k illustrated in FIG. 8, only the memory cells MC in focused columns are illustrated. Thus, in FIG. 8, the row address of the memory cell MC in the matrix included in the block BLK is written in the reference numeral as "[ ]," the block BLK address is written as "_," and the column address is not written in the reference numeral. In the case where the memory portion illustrated in FIG. 5 is used in the structure of the memory portion illustrated in FIG. 8, the backgates of the transistors are considered as being not illustrated in FIG. 8.

The memory portion illustrated in FIG. 8 has a structure where a transistor BTr_1 to a transistor BTr_k and a transistor STr_1 to a transistor STr_k are provided to the memory portion illustrated in FIG. 5 or FIG. 6.

Specifically, in the memory portion of FIG. 8, a wiring RBL_1 is electrically connected to a first terminal of the transistor BTr_1 and a first terminal of the transistor STr_1. A second terminal of the transistor STr_1 is electrically connected to a wiring WBL_1 and a first terminal of a switch SW_1. A wiring RBL_h (h is an integer more than or equal to 1 and less than or equal to k) is electrically connected to a first terminal of a transistor BTr_h and a first terminal of a transistor STr_h. A second terminal of the transistor STr_h is electrically connected to a wiring WBL_h and a first terminal of a switch SW_h. A wiring RBL_k is electrically connected to a first terminal of the transistor BTr_k and a first terminal of the transistor STr_k. A second terminal of the transistor STr_k is electrically connected to a wiring WBL_k and a first terminal of a switch SW_k.

Second terminals of the switch SW_1 to the switch SW_k are electrically connected to a wiring LN1. Furthermore, third terminals of the switch SW_1 to the switch SW_k are electrically connected to a wiring LN2.

The switch SW_1 to the switch SW_k each have a function of bringing a conduction state between the first terminal and either one of the second terminal and the third terminal. In other words, the switch SW_1 to the switch SW_k can each select which of the wirings LN1 and LN2 the block BLK_1 to the block BLK_k are electrically connected to.

The wiring LN1 functions as a wiring which transmits data for writing to the memory cells in each string of the block BLK_1 to the block BLK_k, for example. In addition, the wiring LN2 functions as a wiring which transmits data read from the memory cells in each string of the block BLK_1 to the block BLK_k, for example. Note that the data processing device of one embodiment of the present invention is not limited to this structure. For example, the wiring LN1 and the wiring LN2 may be combined to one (in this case, the switch SW_1 to the switch SW_k are not necessarily provided), or three or more wirings may be provided (in this case, the switch SW_1 to the switch SW_k are replaced by selector circuits or the like in accordance with the number of wirings).

The transistor BTr_1 to the transistor BTr_k each function as a transistor for adjusting the potential of the node N1 of the wiring RBL_1 to the wiring RBL_k. Thus, predetermined potentials are input to second terminals and gates of the transistor BTr_1 to the transistor BTr_k. Specifically, for example, when a potential is read from any one of memory cells MC[1]_h to MC[n]_h in a block BLK_h (h is an integer more than or equal to 1 and less than or equal to k), the transistor BTr[i] has a function of changing the potential of the node N1 of the wiring RBL_h to a potential for writing. Therefore, the transistor BTr_1 to the transistor BTr_k may be replaced by amplifier circuits such as sense amplifiers.

The transistor STr_1 to the transistor STr_k each function as a switching element. Thus, gates of the transistor STr_1 to the transistor STr_k are electrically connected to wirings which transmit signals for switching on/off of the transistor STr_1 to the transistor STr_k.

Next, a method for operating the memory portion of FIG. 8 part of which functions as a cache memory is described. A memory portion illustrated in FIG. 9 is used in description of the operation method.

Figure 9:
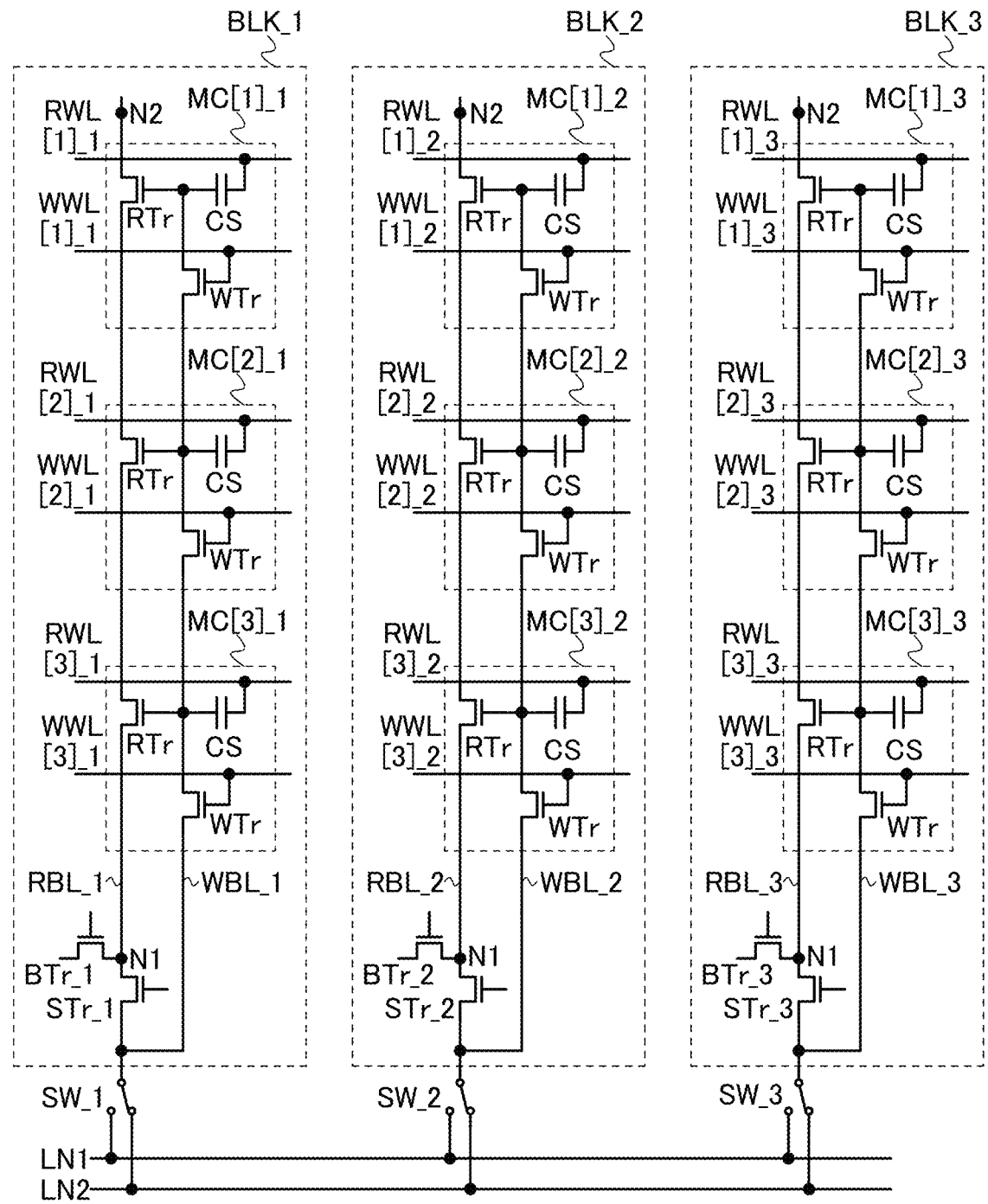
FIG. 9 is a circuit diagram illustrating a structure example of the memory portion included in the data processing device.

The memory portion in FIG. 8 is illustrated in a simplified manner in FIG. 9. Specifically, in the memory portion in FIG. 9, m and k in the memory portion of FIG. 8 are each 3.

The memory portion in FIG. 9 includes the block BLK_1 to a block BLK_3 which each include one or more strings. Specifically, the block BLK_1 includes a memory cell MC[1]_1 to a memory cell MC[3]_1 in one string, a block BLK_2 includes a memory cell MC[1]_2 to a memory cell MC[3]_2 in one string, and the block BLK_3 includes a memory cell MC[1]_3 to a memory cell MC[3]_3 in one string.

Assume that data is retained in each memory node in the memory cell MC[1]_2 to the memory cell MC[3]_2 included in the string of the block BLK_2. Specifically, for example, assume that potentials V[1]_2, V[2]_2, and V[3]_2 are retained in the memory nodes of the memory cell MC[1]_2 to the memory cell MC[3]_2, respectively.

In addition, assume that data is not retained in each memory node in the memory cell MC[1]_1 to the memory cell MC[3]_1 included in the string of the block BLK_1 and the memory cell MC[1]_3 to the memory cell MC[3]_3 included in the string of the block BLK_3.

Here, a case of rewriting V[1]_2 retained in the memory node in the memory cell MC[1]_2 is considered.

In the case of rewriting the potential of the memory node in the memory cell MC[1]_2, data for rewriting is transmitted from a wiring WBL_2 through the transistors WTr of a memory cell MC[2]_2 and the memory cell MC[3]_2 to the memory cell MC[1]_2; therefore, V[2]_2 and V[3]_2 retained in advance in the memory nodes of the memory cell MC[2]_2 and the memory cell MC[3]_3 need to be saved temporarily.

First, a potential $V_{REW}$, which is data for rewriting, is written to the memory node of the memory cell MC[3]_1 included in the string of the block BLK_1, for example. Specifically, a conduction state is made between the first terminal and the second terminal of the switch SW_1, and a high-level potential is input to a wiring WWL[3]_1 to turn on the transistor WTr in the memory cell MC[3]_1, so that $V_{REW}$ is input from the wiring LN1. At this time, writing of $V_{REW}$ from the wiring WBL_1 to the memory cells MC in each of the blocks BLK_2 and BLK_3 needs to be prevented by inputting a low-level potential to a wiring WWL[3]_2 of the block BLK_2 and a wiring WWL[3]_3 of the block BLK_3 so that the transistors WTr in the memory cell MC[3]_2 and the memory cell MC[3]_3 can be in an off state. Alternatively, in each of switches SW_2 and SW_3, a conduction state is made between the first terminal and the third terminal; that is, a non-conduction state is made between the first terminal and the second terminal.

At this time, the memory cell MC[3]_1 can be regarded as a cache memory.

Next, V[3]_2 retained in the memory node of the memory cell MC[3]_2 in the block BLK_2 is temporarily saved. In this operation example, V[3]_2 in the memory node of the memory cell MC[3]_2 is saved to the memory node of a memory cell MC[2]_3 in the block BLK_3. Specifically, a conduction state is made between the first terminal and the second terminal in each of the switches SW_2 and SW_3, a high-level potential is input to a wiring RWL[1]_2 and a wiring RWL[2]_2 to increase the potential of the memory node in each of the memory cells MC[1]_2 and MC[2]_2 and to sufficiently turn on the transistors RTr in the memory cell MC[1]_2 and the memory cell MC[2]_2. In addition, a high-level potential is input to a gate of a transistor STr_2 to turn on the transistor ST_2. Moreover, a low-level potential is input to a gate of a transistor ST_3 to turn off the transistor STr_3, and a high-level potential is input to a wiring WWL[2]_3 and the wiring WWL[3]_3 of the block BLK_3 to turn on the transistors WTr in the memory cell MC[2]_3 and the memory cell MC[3]_3.

Here, $V_R$ is supplied to the node N2 of the block BLK_2, whereby the potential of the node N1 in the block BLK_2 can become a potential corresponding to V[3]_2 retained in the memory node of the memory cell MC[3]_2 in the block BLK_2. Furthermore, the potential of the node N1 can be changed to V[3]_2 by a transistor BTr_2.

Since a conduction state is made between the node N1 of the block BLK_2 and the memory node of the memory cell MC[2]_3 in the block BLK_3 at this time, the potential of the memory node of the memory cell MC[2]_3 in the block BLK_3 becomes V[3]_2. Then, a low-level potential is input to the wiring WWL[2]_3 to turn off the transistor WTr in the memory cell MC[2]_3, so that the potential V[3]_2 can be retained in the memory node of the memory cell MC[2]_3.

Next, V[2]_2 retained in the memory node of the memory cell MC[2]_2 in the block BLK_2 is temporarily saved. In this operation example, V[2]_2 in the memory node of the memory cell MC[2]_2 is saved to the memory node of the memory cell MC[3]_3 in the block BLK_3. Specifically, a conduction state is made between the first terminal and the second terminal in each of the switches SW_2 and SW_3, a high-level potential is input to the wiring RWL[1]_2 and a wiring RWL[3]_2 to increase the potential of the memory node in each of the memory cells MC[1]_2 and MC[3]_2 and to sufficiently turn on the transistors RTr in the memory cell MC[1]_2 and the memory cell MC[3]_2. In addition, a high-level potential is input to the gate of the transistor STr_2 to turn on the transistor STr_2. Moreover, a low-level potential is input to the gate of the transistor STr_3 to turn off the transistor STr_3, and a high-level potential is input to the wiring WWL[3]_3 of the block BLK_3 to turn on the transistor WTr in the memory cell MC[3]_3.

Here, $V_R$ is supplied to the node N2 of the block BLK_2, whereby the potential of the node N1 in the block BLK_2 can become a potential corresponding to V[2]_2 retained in the memory node of the memory cell MC[2]_2 in the block BLK_2. Furthermore, the potential of the node N1 can be changed to V[2]_2 by the transistor BTr_2.

Since a conduction state is made between the node N1 of the block BLK_2 and the memory node of the memory cell MC[3]_3 in the block BLK_3 at this time, the potential of the memory node of the memory cell MC[3]_3 in the block BLK_3 becomes V[2]_2. Then, a low-level potential is input to the wiring WWL[3]_3 to turn off the transistor WTr in the memory cell MC[3]_3, so that the potential V[2]_2 can be retained in the memory node of the memory cell MC[3]_3.

Next, the data retained in the memory nodes of the memory cells MC[1]_2 to MC[3]_2 in the block BLK_2 is deleted.

Specifically, a conduction state is made between the first terminal and the second terminal of the switch SW_2 first, and a low-level potential is input to the gates of the transistor STr_1 to the transistor STr_3 to make the transistor STr_1 to the transistor STr_3 in an off state. Furthermore, a low-level potential is input to the wiring WWL[3]_1 of the block BLK_1 and the wiring WWL[3]_3 of the block BLK_3 to make the transistors WTr in the memory cell MC[3]_1 of the block BLK_1 and the memory cell MC[3]_3 of the block BLK_3 in an off state. In addition, a conduction state may be made between the first terminal and the third terminal in each of the switches SW_1 and SW_3; that is, a non-conduction state may be made between the first terminal and the second terminal in each of the switches SW_1 and SW_3.

Then, a high-level potential is input to a wiring WWL[1]_2 to the wiring WWL[3]_2 in the block BLK_2 to turn on the transistors WTr in the memory cell MC[1]_2 to the memory cell MC[3]_2 in the block BLK_2. At this time, a potential for initialization (e.g., a low-level potential or a ground potential) is supplied to the data in the memory nodes of the memory cell MC[1]_2 to the memory cell MC[3]_2 from the wiring LN1, so that the potentials retained in the memory nodes of the memory cell MC[1]_2 to the memory cell MC[3]_2 are rewritten to the potential for initialization. Then, a low-level potential is input to the wiring WWL[1]_2 to the wiring WWL[3]_2 in the block BLK_2 to turn off the transistors WTr in the memory cell MC[1]_2 to the memory cell MC[3]_2 in the block BLK_2. Thus, deletion of the data in the memory cell MC[1]_2 to the memory cell MC[3]_2 in the block BLK_2 is completed. Note that the deletion operation described above may be omitted because the data is rewritten when the transistors WTr in the memory cell MC[1]_2 to the memory cell MC[3]_2 are turned on at the time of writing data described below.

Next, $V_{REW}$ retained in the memory node of the memory cell MC[3]_1 in the block BLK_1 is written to the memory cell MC[1]_2 in the block BLK_2. Specifically, a conduction state is made between the first terminal and the second terminal in each of the switches SW_1 and SW_2, a high-level potential is input to a wiring RWL[1]_1 and a wiring RWL[2]_1 to increase the potential of the memory node in each of the memory cells MC[1]_1 and MC[2]_1 and to sufficiently turn on the transistors RTr in the memory cell MC[1]_1 and the memory cell MC[2]_1. In addition, a high-level potential is input to the gate of the transistor STr_1 to turn on the transistor STr_1. Moreover, a low-level potential is input to the gate of a transistor STr_2 to turn off the transistor STr_2, and a high-level potential is input to a wiring WWL[1]_3 and the wiring WWL[3]_3 of the block BLK_2 to turn on the transistors WTr in the memory cell MC[1]_3 and the memory cell MC[3]_3.

At this time, writing of $V_{REW}$ from the block BLK_1 to the memory cell MC[3]_3 of the block BLK_3 needs to be prevented by inputting a low-level potential to the wiring WWL[3]_3 in the block BLK_3 to turn off the transistor WTr in the memory cell MC[3]_3 and inputting a low-level potential to the gate of the transistor STr_3 to turn off the transistor STr_3. Alternatively, a conduction state may be made between the first terminal and the third terminal in the switch SW_3; that is, a non-conduction state may be made between the first terminal and the second terminal in the switch SW_3.

Here, $V_R$ is supplied to the node N2 of the block BLK_1, whereby the potential of the node N1 in the block BLK_1 can become a potential corresponding to $V_{REW}$ retained in the memory node of the memory cell MC[3]_1 in the block BLK_1. Furthermore, the potential of the node N1 can be changed to $V_{REW}$ by the transistor BTr_2.

Since a conduction state is made between the node N1 of the block BLK_1 and the memory node of the memory cell MC[1]_2 in the block BLK_2 at this time, the potential of the memory node of the memory cell MC[1]_2 in the block BLK_2 becomes $V_{REW}$. Then, a low-level potential is input to the wiring WWL[1]_2 to turn off the transistor WTr in the memory cell MC[1]_2, so that the potential $V_{REW}$ can be retained in the memory node of the memory cell MC[1]_2.

Next, V[2]_2 retained in the memory node of the memory cell MC[3]_3 in the block BLK_3 is written back to the memory cell MC[2]_2 in the block BLK_2. Specifically, a conduction state is made between the first terminal and the second terminal in each of the switches SW_2 and SW_3, a high-level potential is input to a wiring RWL[1]_3 and a wiring RWL[2]_3 to increase the potential of the memory node in each of the memory cells MC[1]_3 and MC[2]_3 and to sufficiently turn on the transistors RTr in the memory cell MC[1]_3 and the memory cell MC[2]_3. In addition, a high-level potential is input to the gate of the transistor STr_3 to turn on the transistor STr_3. Moreover, a low-level potential is input to the gate of the transistor STr_2 to turn off the transistor STr_2, and a high-level potential is input to a wiring WWL[2]_2 and the wiring WWL[3]_2 of the block BLK_2 to turn on the transistors WTr in the memory cell MC[2]_2 and the memory cell MC[3]_2.

At this time, writing of V[2]_2 from the block BLK_3 to the memory cell MC[3]_1 of the block BLK_1 needs to be prevented by inputting a low-level potential to the wiring WWL[3]_1 in the block BLK_1 to turn off the transistor WTr in the memory cell MC[3]_1 and inputting a low-level potential to the gate of the transistor STr_1 to turn off the transistor STr_1. Alternatively, a conduction state may be made between the first terminal and the third terminal in the switch SW_1; that is, a non-conduction state may be made between the first terminal and the second terminal in the switch SW_1.

Here, $V_R$ is supplied to the node N2 of the block BLK_3, whereby the potential of the node N1 in the block BLK_3 can become a potential corresponding to V[2]_2 retained in the memory node of the memory cell MC[3]_3 in the block BLK_3. Furthermore, the potential of the node N1 can be changed to V[2]_2 by the transistor BTr_3.

Since a conduction state is made between the node N1 of the block BLK_3 and the memory node of the memory cell MC[2]_2 in the block BLK_2 at this time, the potential of the memory node of the memory cell MC[2]_2 in the block BLK_2 becomes V[2]_2. Then, a low-level potential is input to the wiring WWL[2]_2 to turn off the transistor WTr in the memory cell MC[2]_2; thus, writing back the potential V[2]_2 to the memory node of the memory cell MC[2]_2 is completed.

Next, V[3]_2 retained in the memory node of the memory cell MC[2]_3 in the block BLK_3 is written back to the memory cell MC[3]_2 in the block BLK_2. Specifically, a conduction state is made between the first terminal and the second terminal in each of the switches SW_2 and SW_3, a high-level potential is input to the wiring RWL[1]_3 and a wiring RWL[3]_3 to increase the potential of the memory node in each of the memory cells MC[1]_3 and MC[3]_3 and to sufficiently turn on the transistors RTr in the memory cell MC[1]_3 and the memory cell MC[3]_3. In addition, a high-level potential is input to the gate of the transistor STr_3 to turn on the transistor STr_3. Moreover, a low-level potential is input to the gate of the transistor STr_2 to turn off the transistor STr_2, and a high-level potential is input to the wiring WWL[3]_2 of the block BLK_2 to turn on the transistors WTr in the memory cell MC[3]_2.

At this time, writing of V[3]_2 from the block BLK_3 into the memory cell MC[3]_1 of the block BLK_1 needs to be prevented by inputting a low-level potential to the wiring WWL[3]_1 in the block BLK_1 to turn off the transistor WTr in the memory cell MC[3]_1 and inputting a low-level potential to the gate of the transistor STr_1 to turn off the transistor STr_1. Alternatively, a conduction state may be made between the first terminal and the third terminal in the switch SW_1; that is, a non-conduction state may be made between the first terminal and the second terminal in the switch SW_1.

Here, $V_R$ is supplied to the node N2 of the block BLK_3, whereby the potential of the node N1 in the block BLK_3 can become a potential corresponding to V[3]_2 retained in the memory node of the memory cell MC[2]_3 in the block BLK_3. Furthermore, the potential of the node N1 can be changed to V[3]_2 by the transistor BTr_3.

Since a conduction state is made between the node N1 of the block BLK_3 and the memory node of the memory cell MC[3]_2 in the block BLK_2 at this time, the potential of the memory node of the memory cell MC[3]_2 in the block BLK_2 becomes V[3]_2. Then, a low-level potential is input to the wiring WWL[3]_2 to turn off the transistor WTr in the memory cell MC[3]_2; thus, writing back the potential V[3]_2 into the memory node of the memory cell MC[3]_2 is completed.

By the above-described operation, part of the memory portion illustrated in FIG. 8 or FIG. 9 can be treated as a cache memory when data is written to the memory portion or data retained in the memory portion is rewritten, for example.

Transistor characteristics of at least one of the transistor WTr, the transistor RTr, the transistor BTr, and the transistor STr included in each memory cell in the strings of the memory portion illustrated in FIG. 8 or FIG. 9 deteriorate (for example, a source-drain current in the transistor in the off state increases) in some cases, owing to a soft error or the like derived from the data processing device's environments (e.g., temperature or humidity) or natural radiation. In this case, by having a function of performing error check on a string (a memory cell) included in a memory portion, the controller 1197 of the data processing device 50 in FIG. 1 can perform error check on the strings in the memory portion illustrated in FIG. 8 or FIG. 9. The controller 1197 may have, when an error is found in an error-checked memory cell, a function of stopping access to the string including the memory cell and making access to another string.

Note that this embodiment can be combined with any of the other embodiments in this specification as appropriate.

Embodiment 3

In this embodiment, structure examples of the data processing device described in Embodiment 1 and a structure example of a transistor that can be used in the data processing device are described.

<Structure Example 1 of Data Processing Device>

Figure 10:
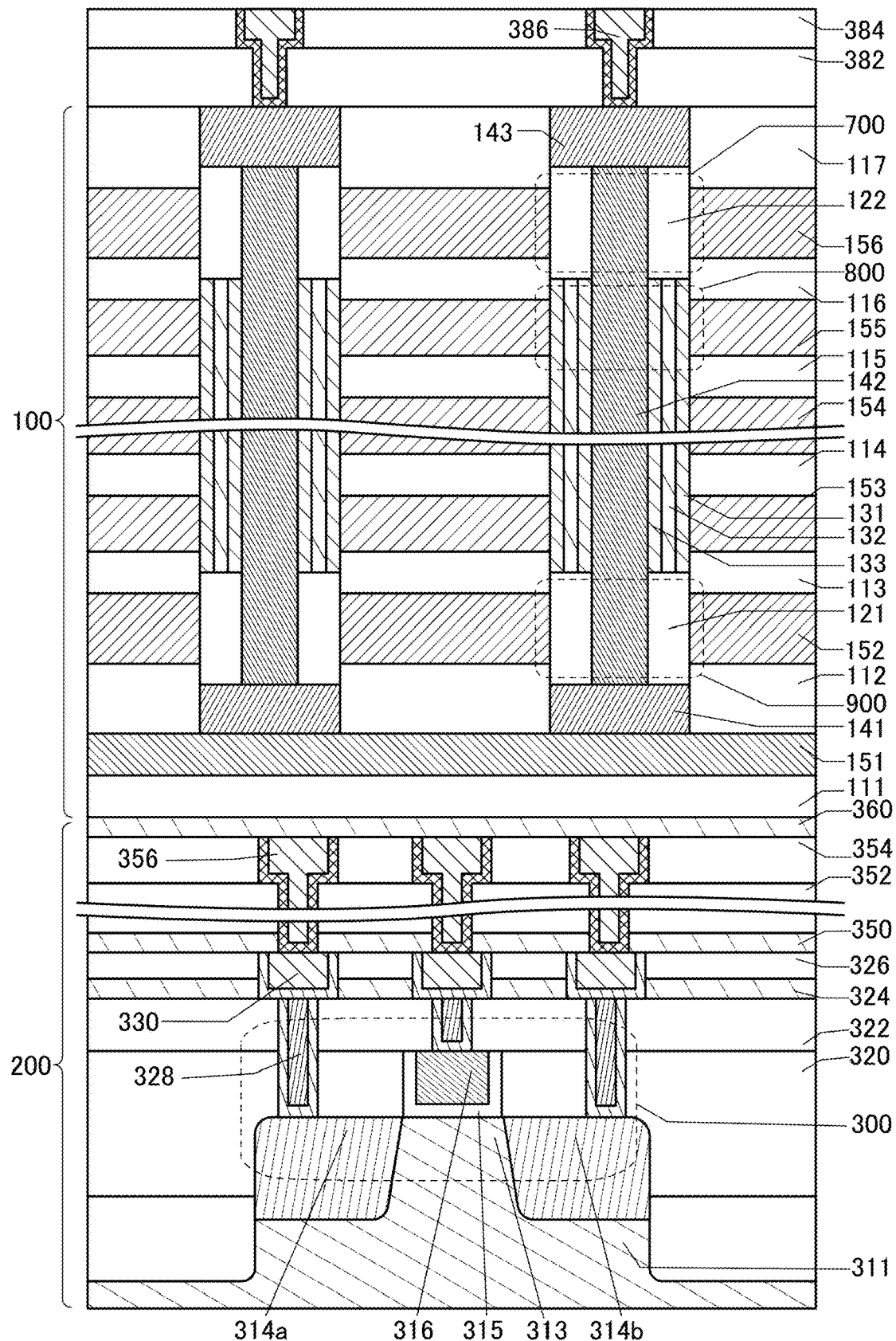
FIG. 10 is a schematic cross-sectional view illustrating a structure example of a data processing device.
Figure 11:
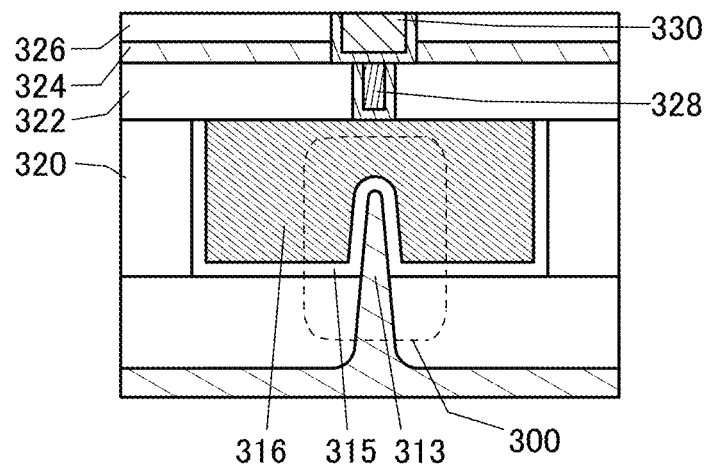
FIG. 11 is a schematic cross-sectional view illustrating a structure example of a transistor.

A data processing device illustrated in FIG. 10 includes a memory portion 100 and a control portion 200. FIG. 10 is a cross-sectional view of a transistor 300 in the channel length direction, and FIG. 11 is a cross-sectional view of the transistor 300 in the channel width direction.

In FIG. 10, the control portion 200 corresponds to a circuit including the controller 1197 illustrated in FIG. 1, and the memory portion 100 corresponds to the memory portion 1196 in FIG. 1.

First, the transistor 300 included in the control portion 200 and insulators, conductors, and the like formed around the transistor 300 are described.

The transistor 300 is, for example, provided on a substrate 311 and includes a conductor 316, an insulator 315, a semiconductor region 313 that is part of the substrate 311, and a low-resistance region 314a and a low-resistance region 314b each functioning as a source region or a drain region. Note that the transistor 300 can be used as a transistor included in the controller 1197, for example.

A semiconductor substrate (e.g., a single crystal substrate or a silicon substrate) is preferably used as the substrate 311.

In the transistor 300, a top surface and a side surface in the channel width direction of the semiconductor region 313 are covered with the conductor 316 with the insulator 315 therebetween, as illustrated in FIG. 11. Such a Fin-type transistor 300 can have an increased effective channel width, and thus the transistor 300 can have improved on-state characteristics. In addition, since contribution of an electric field of a gate electrode can be increased, the off-state characteristics of the transistor 300 can be improved.

Note that the transistor 300 can be either a p-channel transistor or an n-channel transistor.

A region of the semiconductor region 313 where a channel is formed, a region in the vicinity thereof, the low-resistance region 314a and the low-resistance region 314b each functioning as a source region or a drain region, and the like preferably contain a semiconductor such as a silicon-based semiconductor, and preferably contain single crystal silicon. Alternatively, the regions may be formed using a material containing Ge (germanium), SiGe (silicon germanium), GaAs (gallium arsenide), GaAlAs (gallium aluminum arsenide), GaN (gallium nitride) or the like. A structure may be employed in which silicon whose effective mass is controlled by applying stress to the crystal lattice and changing the lattice spacing is used. Alternatively, the transistor 300 may be an HEMT (High Electron Mobility Transistor) with GaAs and GaAlAs, or the like.

The low-resistance region 314a and the low-resistance region 314b contain an element which imparts n-type conductivity, such as arsenic or phosphorus, or an element which imparts p-type conductivity, such as boron, in addition to the semiconductor material used in the semiconductor region 313.

For the conductor 316 functioning as a gate electrode, a semiconductor material such as silicon containing the element which imparts n-type conductivity, such as arsenic or phosphorus, or the element which imparts p-type conductivity, such as boron, or a conductive material such as a metal material, an alloy material, or a metal oxide material can be used.

Note that since the work function of a conductor depends on the material of the conductor, the threshold voltage of the transistor can be adjusted by selecting the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum as the conductor, and it is particularly preferable to use tungsten in terms of heat resistance.

Note that the transistor 300 illustrated in FIG. 10 and FIG. 11 is an example and the structure is not limited thereto; an appropriate transistor can be used in accordance with a circuit structure or a driving method. For example, the control portion 200 of the data processing device may be a single-polarity circuit using only OS transistors.

An insulator 320, an insulator 322, an insulator 324, and an insulator 326 are stacked sequentially to cover the transistor 300.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, aluminum nitride, or the like is used, for example.

Note that in this specification, silicon oxynitride refers to a material that contains oxygen at a higher proportion than nitrogen, and silicon nitride oxide refers to a material that contains nitrogen at a higher proportion than oxygen. Furthermore, in this specification, aluminum oxynitride refers to a material that contains oxygen at a higher proportion than nitrogen, and aluminum nitride oxide refers to a material that contains nitrogen at a higher proportion than oxygen.

The insulator 322 may have a function of a planarization film for planarizing a level difference caused by the transistor 300 or the like provided below the insulator 322. For example, the top surface of the insulator 322 may be planarized by planarization treatment using a chemical mechanical polishing (CMP) method or the like to increase planarity.

Furthermore, as the insulator 324, it is preferable to use a film having a barrier property that prevents diffusion of hydrogen and impurities from the substrate 311, the transistor 300, or the like into the memory portion 100 including a transistor 700, a plurality of transistors 800, and a transistor 900.

As the film having a barrier property against hydrogen, silicon nitride formed using a CVD method can be used, for example. Here, in the case where the transistor 700, the plurality of transistors 800, and the transistor 900 are OS transistors, diffusion of hydrogen into the semiconductor elements including an oxide semiconductor, such as the transistor 700, the plurality of transistors 800, and the transistor 900, can degrade the characteristics of the semiconductor elements. Therefore, a film that inhibits hydrogen diffusion is preferably provided between the transistor 300 and each of the transistor 700, the plurality of transistors 800, and the transistor 900. The film that inhibits hydrogen diffusion is specifically a film from which a small amount of hydrogen is released.

The amount of released hydrogen can be analyzed by thermal desorption spectroscopy (TDS) or the like, for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 326 is preferably lower than that of the insulator 324. For example, the relative permittivity of the insulator 326 is preferably lower than 4, further preferably lower than 3. The relative permittivity of the insulator 326 is, for example, preferably 0.7 times or less, further preferably 0.6 times or less the relative permittivity of the insulator 324. When a material with a low permittivity is used as an interlayer film, parasitic capacitance generated between wirings can be reduced.

Moreover, a conductor 328, a conductor 330, and the like are embedded in the insulator 320, the insulator 322, the insulator 324, and the insulator 326, for example. Note that the conductor 328 and the conductor 330 each have a function of a plug or a wiring. Furthermore, a plurality of conductors functioning as plugs or wirings are collectively denoted by the same reference numeral in some cases. Moreover, in this specification and the like, a wiring and a plug connected to the wiring may be a single component. That is, there are cases where part of a conductor functions as a wiring and part of a conductor functions as a plug.

As a material of each of plugs and wirings (e.g., the conductor 328 and the conductor 330), a single layer or stacked layers of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, it is preferable to form the plugs and wirings with a low-resistance conductive material such as aluminum or copper. The use of a low-resistance conductive material can reduce wiring resistance.

A wiring layer may be provided over the insulator 326 and the conductor 330. For example, in FIG. 10, an insulator 350, an insulator 352, and an insulator 354 are stacked in this order. Furthermore, a conductor 356 is formed in the insulator 350, the insulator 352, and the insulator 354. The conductor 356 has a function of a plug or a wiring connected to the transistor 300. Note that the conductor 356 can be provided using a material similar to those of the conductor 328 and the conductor 330.

Note that for example, as the insulator 350, like the insulator 324, an insulator having a barrier property against hydrogen is preferably used. Furthermore, the conductor 356 preferably contains a conductor having a barrier property against hydrogen. In particular, the conductor having a barrier property against hydrogen is formed in an opening of the insulator 350 having a barrier property against hydrogen. With this structure, the transistor 300 can be separated from the memory portion 100 including the transistor 700, the plurality of transistors 800, and the transistor 900 by the barrier layer; accordingly, hydrogen diffusion from the transistor 300 into the memory portion 100 can be inhibited.

As the conductor having a barrier property against hydrogen, tantalum nitride is preferably used, for example. In addition, the use of stacked layers of tantalum nitride and tungsten, which has high conductivity, can inhibit diffusion of hydrogen from the transistor 300 while the conductivity of the wiring is maintained. In that case, a structure is preferable in which a tantalum nitride layer having a barrier property against hydrogen is in contact with the insulator 350 having a barrier property against hydrogen.

An insulator having a barrier property against hydrogen is preferably used over the insulator 354 and the conductor 356. For example, in FIG. 10, an insulator 360 is provided over the insulator 354 and the conductor 356. An opening may be provided in the insulator 360 and a conductor may be formed so as to be electrically connected to the conductor 356. In this case, the conductor has a function of a plug or a wiring. The conductor can be provided using a material similar to those of the conductor 328 and the conductor 330. It is particularly preferable that the conductor contain a conductor having a barrier property against hydrogen.

When the insulator having a barrier property against hydrogen is used as the insulator 360 and the conductor having a barrier property against hydrogen is used as the conductor, the transistor 700, the plurality of transistors 800, and the transistor 900, which are described later, can be separated from the transistor 300 by the barrier layer. Thus, hydrogen diffusion from the transistor 300 into the transistor 700, the plurality of transistors 800, and the transistor 900 can be inhibited.

Next, the transistor 700, the plurality of transistors 800, and the transistor 900 included in the memory portion 100, and insulators, conductors, and the like formed around the transistors are described.

FIG. 10 illustrates an example where the memory portion 100 includes a three-dimensional NAND memory circuit. The memory portion 100 of the data processing device illustrated in FIG. 10 includes the transistor 700, the plurality of transistors 800, and the transistor 900 as components of the three-dimensional NAND memory circuit. Note that the transistor 700 and the transistor 900 correspond to transistors for selecting the plurality of transistors 800 positioned in the same opening as the transistor 700 and the transistor 900, and the transistors 800 correspond to cell transistors that store data. In this specification and the like, the transistor 700, the plurality of transistors 800, and the transistor 900 positioned in the same opening may be referred to as a string.

The memory portion 100 illustrated in FIG. 10 is provided over the control portion 200. The memory portion 100 over the control portion 200 includes an insulator 111 to an insulator 117, an insulator 121, an insulator 122, an insulator 131, an insulator 132, an insulator 133, a conductor 151 to a conductor 156, and a semiconductor 141 to a semiconductor 143.

The insulator 111 is provided above the control portion 200. Thus, the insulator 360 positioned below the insulator 111 is preferably formed by a method capable of forming a planar film. Furthermore, the insulator 360 is preferably subjected to CMP treatment.

As the insulator 111, a material containing silicon oxide or silicon oxynitride can be used, for example. For example, an insulator including a material selected from boron, carbon, nitrogen, oxygen, fluorine, magnesium, aluminum, silicon, phosphorus, chlorine, argon, gallium, germanium, yttrium, zirconium, lanthanum, neodymium, hafnium, tantalum, and the like can be used in a single layer or stacked layers.

The conductor 151 is stacked over the insulator 111. The conductor 151 functions as a wiring which supplies a predetermined potential to all the strings in the memory portion 100, for example.

It is possible to use, as the conductor 151, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, and ruthenium, for example. A semiconductor having high electrical conductivity, typified by polycrystalline silicon containing an impurity element such as phosphorus, or a silicide such as nickel silicide may be used. A conductive material containing oxygen and a metal element contained in a metal oxide described in Embodiment 6 can be used. A conductive material containing a metal element such as titanium or tantalum and nitrogen can be used. For example, a conductive material containing nitrogen, such as titanium nitride or tantalum nitride, may be used. Alternatively, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added can be used, for example. Furthermore, indium gallium zinc oxide containing nitrogen can be used, for example. Using such a material in some cases allows capture of hydrogen or water entering from a surrounding insulator or the like.

There is no particular limitation on a formation method of the conductor 151. The conductor 151 can be formed by a sputtering method, a CVD method (including a thermal CVD method, an MOCVD method, a PECVD method, or the like), an MBE (Molecular Beam Epitaxy) method, an ALD (Atomic Layer Deposition) method, or a PLD (Pulsed Laser Deposition) method, for example.

The insulator 112 to the insulator 117 can be formed using, for example, a material similar to that of the insulator 111. The insulator 112 to the insulator 117 are preferably formed using a material with low permittivity, for example. When a material with low permittivity is used as the insulator 112 to the insulator 117, the parasitic capacitances generated by the conductor 152 to the conductor 156 and by the insulator 112 to the insulator 117 can be reduced. This increases the driving speed of the memory portion 100.

There is no particular limitation on a method of forming the insulator 112 to the insulator 117. The insulator 112 to the insulator 117 can be formed by a sputtering method, a CVD method (including a thermal CVD method, an MOCVD method, a PECVD method, or the like), an MBE method, an ALD method, or a PLD method, for example.

The conductor 152 functions as a gate of the transistor 900 and a wiring electrically connected to the gate. The conductor 153 to the conductor 155 function as gates of the plurality of transistors 800 and wirings electrically connected to the gates. The conductor 156 functions as a gate of the transistor 700 and a wiring electrically connected to the gate.

The conductor 152 to the conductor 156 can be formed using a material similar to that of the conductor 151, for example. The conductor 152 to the conductor 156 can be formed in a manner similar to that of the conductor 151.

In addition, an opening is provided in the insulator 112 to the insulator 117 and the conductor 152 to the conductor 156. In the opening, the insulator 121, the insulator 122, the insulator 131 to the insulator 133, and the semiconductor 141 to the semiconductor 143 are provided.

The semiconductor 141 is provided in contact with part of a side surface and a bottom surface of the opening. Specifically, the semiconductor 141 is provided over part of the conductor 151 and covers part of the insulator 112 that is at the side surface of the opening.

As the semiconductor 141, for example, silicon into which impurities are diffused is preferably used. As the impurity, an n-type impurity (donor) can be used. As the n-type impurity, phosphorus or arsenic can be used, for example. As the impurity, a p-type impurity (accepter) can be used. As the p-type impurity, boron, aluminum, or gallium can be used, for example. As silicon, single crystal silicon, hydrogenated amorphous silicon, microcrystalline silicon, or polycrystalline silicon can be used, for example. Other than silicon, a metal oxide with a high carrier concentration can be used as the semiconductor 141, in some cases. Alternatively, a semiconductor such as Ge or a compound semiconductor such as ZnSe, CdS, GaAs, InP, GaN, SiGe, or the like can be used in some cases.

Note that materials used for a semiconductor 142 and the semiconductor 143 described later are preferably the same as the material for the semiconductor 141, and the carrier concentration of the semiconductor 142 is preferably lower than those of the semiconductor 141 and the semiconductor 143 in some cases.

For example, when silicon into which a p-type impurity is diffused is used as the semiconductor 141, it is preferable that the semiconductor 141 be formed over the conductor 151 and a p-type impurity such as boron, aluminum, or gallium be added to the semiconductor 141. This forms a p-type region in the semiconductor 141. For example, when silicon into which an n-type impurity is diffused is used as the semiconductor 141, it is preferable that the semiconductor 141 be formed over the conductor 151 and an n-type impurity such as phosphorus or arsenic be added to the semiconductor 141. This forms an n-type region in the semiconductor 141.

When a metal oxide is used as the semiconductor 141, it is preferable that the semiconductor 141 be formed over the conductor 151 and a metal element or the like be added to the semiconductor 141, for example. This can increase the carrier concentration of the semiconductor 141. In particular, when a metal oxide described in Embodiment 6 is used as the semiconductor 141, an n-type region ($n^+$ region) is formed in the semiconductor 141. Instead of adding a metal element or the like, water, hydrogen, or the like may be added to the semiconductor 141 and then heat treatment may be performed, whereby oxygen vacancies can be generated in the semiconductor 141. An n-type region is formed in a region where oxygen vacancies are generated in the semiconductor 141; the carrier concentration of the semiconductor 141 is increased as a result.

The insulator 121 is provided to be in contact with part of a bottom surface of the opening. Specifically, the insulator 121 is provided to cover part of the top of the semiconductor 141 and the conductor 152 on the side surface of the opening.

The insulator 121 functions as a gate insulating film of the transistor 900.

As the insulator 121, silicon oxide or silicon oxynitride can be used, for example. In particular, when a metal oxide is used as the semiconductor 142 described later, the insulator 121 is preferably a material which releases oxygen by heating. When the insulator 121 containing oxygen is provided in contact with the metal oxide used as the semiconductor 142, oxygen vacancies in the metal oxide can be reduced, which can improve the reliability of the transistor 900.

Although there is no particular limitation on the method for forming the insulator 121, a film formation method with good coverage is required since the insulator 121 is formed on the side surface of the opening provided in the insulator 112, the conductor 152, and the insulator 113. Examples of the film formation method with good coverage include an ALD method.

The insulator 131 is provided to be in contact with part of the side surface of the opening. Specifically, the insulator 131 is provided to cover the conductor 153 to the conductor 155 on the side surface of the opening. Thus, the insulator 131 is provided to also cover the insulator 114 and the insulator 115 on the side surface of the opening.

The insulator 132 is provided to be in contact with the insulator 131. The insulator 133 is provided to be in contact with the insulator 132. That is, the insulator 131 to the insulator 133 are sequentially stacked in this order from the side surface to the center of the opening.

The insulator 131 functions as a gate insulating film of the transistors 800. The insulator 132 functions as a charge accumulation layer of the transistors 800. The insulator 133 functions as a tunnel insulating film of the transistors 800.

It is preferable to use silicon oxide or silicon oxynitride as the insulator 131, for example. Alternatively, as the insulator 131, aluminum oxide, hafnium oxide, or an oxide containing aluminum and hafnium can be used, for example. The insulator 131 can be an insulator including a stack of any of the above. When the insulator 131 is made thicker than the insulator 133, charge can be moved from the semiconductor 142, which is described later, to the insulator 132 through the insulator 133.

It is possible to use silicon nitride or silicon nitride oxide as the insulator 132, for example. Note that the material which can be used as the insulator 132 is not limited thereto.

It is preferable to use silicon oxide or silicon oxynitride as the insulator 133, for example. Alternatively, as the insulator 133, aluminum oxide, hafnium oxide, or an oxide containing aluminum and hafnium can be used, for example. The insulator 133 can be an insulator including a stack of any of the above.

The insulator 122 is provided to be in contact with part of the side surface of the opening. Specifically, the insulator 122 is provided to cover the conductor 156 on the side surface of the opening.

The insulator 122 functions as a gate insulating film of the transistor 700.

The insulator 122 can be formed using a material similar to that of the insulator 121, for example. The insulator 122 can be formed by a method similar to that of the insulator 121.

The semiconductor 142 is provided in contact with side surfaces of the insulator 121, the insulator 133, and the insulator 122 in the opening.

The semiconductor 142 functions as channel formation regions of the transistor 700, the transistors 800, and the transistor 900 and a wiring electrically connecting the transistor 700, the transistors 800, and the transistor 900 in series.

As the semiconductor 142, silicon is preferably used, for example. As silicon, single crystal silicon, hydrogenated amorphous silicon, microcrystalline silicon, or polycrystalline silicon can be used, for example. Other than silicon, a metal oxide can be used as the semiconductor 142, in some cases. Alternatively, a semiconductor such as Ge or a compound semiconductor such as ZnSe, CdS, GaAs, InP, GaN, SiGe, or the like can be used in some cases.

The semiconductor 143 is provided to fill the opening after the semiconductor 141, the semiconductor 142, the insulator 121, the insulator 122, the insulator 131, the insulator 132, and the insulator 133 are formed in the opening. Specifically, the semiconductor 143 is provided to be on the insulator 122 and the semiconductor 142, and to be in contact with a side surface of the insulator 117.

The semiconductor 143 is preferably a material similar to that of the semiconductor 141, for example. Thus, the polarity of the semiconductor 141 and the polarity of the semiconductor 143 are preferably the same.

A wiring layer may be provided over the insulator 117 and the semiconductor 143. For example, in FIG. 10, an insulator 382 and an insulator 384 are sequentially stacked as wiring layers. Furthermore, a conductor 386 is formed in the insulator 382 and the insulator 384. The conductor 386 has a function of a plug or a wiring. Note that the conductor 386 can be provided using a material similar to those of the conductor 328 and the conductor 330.

The data processing device of one embodiment of the present invention is not limited to the structure of the NAND memory circuit included in the memory portion 100 illustrated in FIG. 10. The NAND memory circuit used in the data processing device of one embodiment of the present invention may have a structure different from that of the NAND memory circuit illustrated in FIG. 10.

<Structure Example 2 of Data Processing Device>

Figure 12:
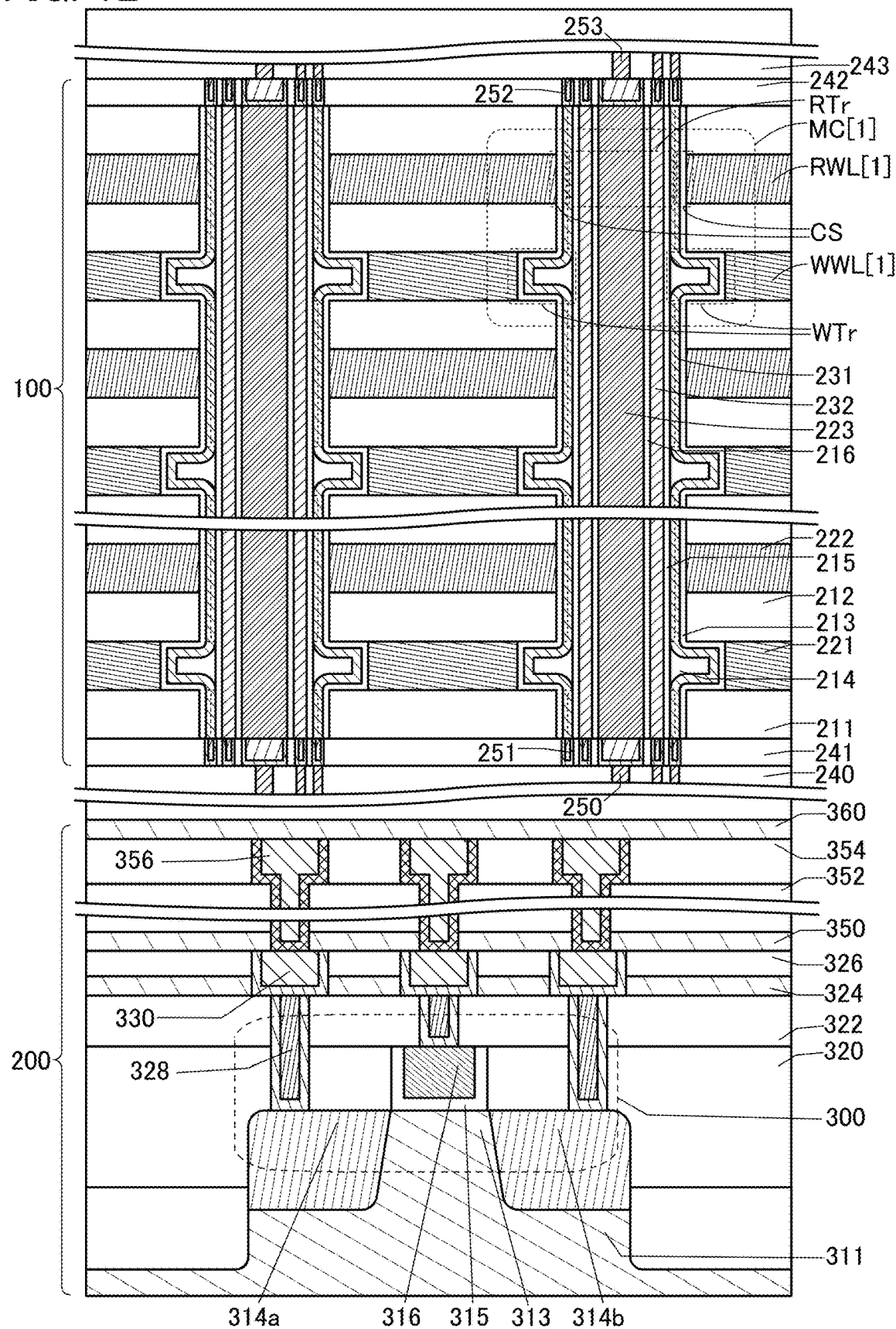
FIG. 12 is a schematic cross-sectional view illustrating a structure example of a data processing device.

FIG. 12 illustrates a structure example of a data processing device, which is different from the example in FIG. 10. The data processing device illustrated in FIG. 12 is different from the data processing device of FIG. 10 in the structure of the memory portion 100; specifically, the memory portion 100 of the data processing device of FIG. 12 has the structure of the memory portion of FIG. 4A described in Embodiment 2.

In the memory portion 100 of the data processing device illustrated in FIG. 12, the memory cell MC[1] included in the three-dimensional NAND memory circuit includes the transistor RTr, the transistor WTr, and the capacitor CS.

The memory portion 100 illustrated in FIG. 12 is provided over the control portion 200 in a manner similar to that of the data processing device of FIG. 10. Furthermore, the memory portion 100 includes, above the control portion 200, an insulator 211 to an insulator 215, an insulator 240 to an insulator 243, a conductor 221, a conductor 222, a conductor 250 to a conductor 253, a semiconductor 231, and a semiconductor 232.

The insulator 240 is provided above the control portion 200. Thus, the insulator 360 positioned below the insulator 240 is preferably formed by a method capable of forming a planar film. Furthermore, the insulator 360 is preferably subjected to CMP treatment.

Any of the materials that can be used as the insulator 111 can be used as the insulator 240, for example.

An insulator 241 is stacked over the insulator 240.

Any of the materials that can be used as the insulator 111 can also be used as the insulator 241 in a manner similar to that of the insulator 240, for example.

The conductor 250 is embedded in the insulator 240, and a conductor 251 is embedded in the insulator 241. The conductor 250 and the conductor 251 each have a function of a plug or a wiring. Furthermore, as in FIG. 10, a plurality of conductors functioning as plugs or wirings illustrated in FIG. 12 are collectively denoted by the same reference numeral in some cases. Moreover, in this specification and the like, a wiring and a plug connected to the wiring may be a single component. That is, there are cases where part of a conductor functions as a wiring and part of a conductor functions as a plug.

As the conductor 250 and the conductor 251, any of the materials that can be used as the conductor 328 and the conductor 330 can be used, for example.

The insulator 211 is provided over the insulator 241. The conductor 221 is provided over the insulator 211. An insulator 212 is provided over the conductor 221. Furthermore, the conductor 222 is provided over the insulator 212. In other words, the insulator 211, the conductor 221, the insulator 212, and the conductor 222 are stacked in this order (these are referred to as a stacked body). The memory portion 100 of the data processing device in FIG. 12 includes as many stacked bodies as memory cells MC included in a string.

In the manufacturing process of the data processing device in FIG. 12, an opening is provided in the insulator 211, the conductor 221, the insulator 212, and the conductor 222 by resist mask formation, etching treatment, and the like. At this time, the conductor 221 is selectively removed so that a depression portion is formed by the insulator 211, the conductor 221, and the insulator 212. In this case, the material of the conductor 221 preferably has higher etching rate than the materials of the insulator 211, the insulator 212, and the conductor 222.

Note that the formation of the resist mask can be performed by a lithography method, a printing method, an inkjet method, or the like as appropriate. Formation of the resist mask by an inkjet method needs no photomask; thus, manufacturing cost can be reduced. For the etching treatment, either a dry etching method or a wet etching method or both of them may be used.

In the opening formed by the etching treatment, an insulator 213, the semiconductor 231, an insulator 214, the insulator 215, the semiconductor 232, an insulator 216, and a conductor 223 are sequentially formed, which is described later in detail.

As the insulator 211 and the insulator 212, films having a barrier property that prevent diffusion of hydrogen or impurities are preferably used, for example. Thus, the insulator 211 and the insulator 212 can each be formed using a material similar to that of the insulator 111, for example.

As each of the conductor 221 and the conductor 222, any of the materials that can be used as the conductor 151 is preferably used, for example. In particular, a conductive material having a function of inhibiting transmission of impurities such as water or hydrogen is preferably used as each of the conductor 221 and the conductor 222.

The insulator 213 and the semiconductor 231 are sequentially formed on the side surface of the opening formed by the above-described etching treatment. Furthermore, the insulator 214 is formed so as to be embedded in the depression portion of the opening.

The formation method of the insulator 214 is, for example, such that the insulator 214 is formed first on the side surface of the opening in such a degree that the insulator 214 is embedded in the depression portion of the opening, and then part of the insulator 214 is removed by etching treatment so that the insulator 214 can remain in the depression portion and the semiconductor 231 can be exposed.

As the insulator 213, silicon oxide or silicon oxynitride can be used, for example. Alternatively, as the insulator 213, aluminum oxide, hafnium oxide, or an oxide containing aluminum and hafnium can be used, for example. The insulator 213 may be an insulator including a stack of any of the above.

A metal oxide described in Embodiment 6 is preferably used as the semiconductor 231. A metal oxide is used as the semiconductor 231 hereinafter in this embodiment. In particular, a CAAC-OS described later is suitable as the metal oxide. For example, in the case where polycrystalline silicon is used as the semiconductor 231, a grain boundary that can be formed in the polycrystalline silicon increases the electron trap density and causes large variation in transistor characteristics, in some cases. In contrast, a CAAC-OS in which no clear grain boundary is observed can suppress variation in transistor characteristics.

Before the insulator 214 is formed, the formed semiconductor 231 may be subjected to heat treatment in an oxygen atmosphere, so that oxygen can be supplied to the metal oxide of the semiconductor 231. Then, the insulator 214 is formed, and treatment for supplying impurities or the like to the metal oxide of the semiconductor 231 is performed, so that a region of the semiconductor 231, which is exposed to the opening, can have reduced resistance. In other words, in the semiconductor 231, a region in contact with the insulator 214 is a high-resistance region, and the region not in contact with the insulator 214 is a low-resistance region.

As the treatment for supplying impurities or the like to the metal oxide of the semiconductor 231, a method in which, after the insulator 214 is embedded in the depression portion of the opening, a conductor is formed on the side surface of the opening and is removed can be given, for example. By the contact between the conductive film and the metal oxide of the semiconductor 231, a metal element contained in the conductive film is diffused into the semiconductor 231 and forms a metal compound with a constituent element of the semiconductor 231, in some cases. By this metal compound, the low-resistance region is formed in the semiconductor 231.

The insulator 214 is preferably a component that does not form a compound with a component contained in the semiconductor 231 at the interface with the formed semiconductor 231 or in the vicinity of the interface. Specifically, silicon oxide or the like can be used as the insulator 214, for example.

Then, on formation surfaces of the semiconductor 231 and the insulator 214, the insulator 215, the semiconductor 232, the insulator 216, and the conductor 223 are sequentially formed. Note that the opening provided in the stacked body is filled by the formation of the conductor 223.

As each of the insulator 215 and the insulator 216, a material that can be used as the insulator 213 is preferably used, for example.

The metal oxide described in Embodiment 6 is preferably used as the semiconductor 232 in a manner similar to that of the semiconductor 231, for example.

As the conductor 223, any of the materials that can be used as the conductor 151 is preferably used, for example. In particular, a conductive material having a function of inhibiting transmission of impurities such as water or hydrogen is preferably used as the conductor 223.

Over the formed string, an insulator 242 and the insulator 243 are sequentially provided.

As each of the insulator 242 and the insulator 243, any of materials that can be used as the insulator 111 can be used, for example.

A conductor 252 is embedded in the insulator 242, and the conductor 253 is embedded in the insulator 243. The conductor 252 and the conductor 253 each have a function of a plug or a wiring.

As each of the conductor 252 and the conductor 253, any of the materials that can be used as the conductor 328 and the conductor 330 can be used, for example.

Through the above-described process, the data processing device including the memory portion 100 of FIG. 4A can be manufactured.

Specifically, the wiring WBL, the wiring RBL, and the wiring BGL in the memory portion of FIG. 4A correspond to the semiconductor 231, the semiconductor 232, and the conductor 223 of FIG. 12, respectively. Furthermore, the wiring WWL and the wiring RWL in the memory portion of FIG. 4A correspond to the conductor 221 and the conductor 222, respectively.

Thus, the capacitor CS in which the conductor 222 serves as one electrode, the region in contact with the conductor 222 in the insulator 213 serves as a dielectric, and the region overlapping with the conductor 222 in the semiconductor 231 serves as the other electrode is formed. Furthermore, the transistor RTr in which the region overlapping with the conductor 222 in the semiconductor 231 serves as the gate, the region overlapping with the conductor 222 in the insulator 215 serves as the gate insulating film, the region overlapping with the conductor 222 in the semiconductor 232 serves as the channel formation region, the region overlapping with the conductor 222 in the insulator 216 serves as the gate insulating film, and the region overlapping with the conductor 222 in the conductor 223 serves as the backgate, is formed. Furthermore, the transistor WTr in which the conductor 221 serves as the gate, the insulator 213 overlapping with the conductor 221 serves as the gate insulating film, and the region overlapping with the conductor 221 in the semiconductor 231 serves as the channel formation region, is formed.

Note that the insulators, the conductors, the semiconductors, and the like disclosed in this specification and the like can be formed by a PVD (Phisical Vapor Deposition) method or a CVD (Chemical Vapor Deposition) method. Examples of a PVD method include a sputtering method, a resistance heating evaporation method, an electron beam evaporation method, and a PLD (Pulsed Laser Deposition) method. The formation by a plasma CVD method or a thermal CVD method can be given as a CVD method. In particular, examples of a thermal CVD method include a MOCVD (Metal Organic Chemical Vepor Deposition) method and an ALD (Atomic Layer Deposition) method.

A thermal CVD method, which is a film formation method not using plasma, has an advantage that no defect due to plasma damage is generated.

Deposition by a thermal CVD method may be performed in such a manner that a source gas and an oxidizer are supplied to a chamber at a time, the pressure in the chamber is set to an atmospheric pressure or a reduced pressure, and they are made to react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves); in order to avoid mixing of the plurality of kinds of source gases, an inert gas (e.g., argon or nitrogen) or the like is introduced at the same time as or after the introduction of a first source gas and then a second source gas is introduced. Note that in the case where the first source gas and the inert gas are introduced at the same time, the inert gas serves as a carrier gas, and the inert gas may also be introduced at the same time as the introduction of the second source gas. Alternatively, the second source gas may be introduced after the first source gas is exhausted by vacuum evacuation instead of the introduction of the inert gas. The first source gas is adsorbed on the surface of the substrate to form a first thin layer; then the second source gas is introduced to react with the first thin layer; as a result, a second thin layer is stacked over the first thin layer, so that a thin film is formed. The sequence of the gas introduction is controlled and repeated a plurality of times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust the thickness and thus is suitable for manufacturing a minute FET.

A variety of films such as the metal film, the semiconductor film, and the inorganic insulating film disclosed in the above-described embodiment can be formed by a thermal CVD method such as a MOCVD method or an ALD method; for example, in the case of forming an In—Ga—Zn—O film, trimethylindium ($In(CH_3)_3$), trimethylgallium ($Ga(CH_3)_3$), and dimethylzinc ($Zn(CH_3)_2$) are used. Without limitation to the above combination, triethylgallium ($Ga(C_2H_5)_3$) can also be used instead of trimethylgallium and diethylzinc ($Zn(C_2H_5)_2$) can also be used instead of dimethylzinc.

For example, in the case where a hafnium oxide film is formed by a film formation apparatus using ALD, two kinds of gases, ozone ($O_3$) as an oxidizer and a source gas which is obtained by vaporizing a liquid containing a solvent and a hafnium precursor compound (hafnium alkoxide or hafnium amide such as tetrakis(dimethylamide)hafnium (TDMAH, $Hf[N(CH_3)_2]_4$)), are used. As another material, tetrakis(ethylmethylamide)hafnium can be given, for example.

For example, in the case where an aluminum oxide film is formed by a film formation apparatus using ALD, two kinds of gases, $H_2O$ as an oxidizer and a source gas which is obtained by vaporizing a liquid containing a solvent and an aluminum precursor compound (e.g., trimethylaluminum (TMA, $Al(CH_3)_3$)) are used. As another material, tris(dimethylamide)aluminum, triisobutylaluminum, and aluminum tris(2,2,6,6-tetramethyl-3,5-heptanedionate) can be given, for example.

For example, in the case where a silicon oxide film is formed by a film formation apparatus using ALD, hexachlorodisilane is adsorbed on a surface on which a film is to be formed, and radicals of an oxidizing gas ($O_2$ or dinitrogen monoxide) are supplied to react with the adsorbate.

For example, in the case where a tungsten film is deposited by a film formation apparatus using ALD, a $WF_6$ gas and a $B_2H_6$ gas are sequentially and repeatedly introduced to form an initial tungsten film, and then a $WF_6$ gas and an $H_2$ gas are sequentially and repeatedly introduced to form a tungsten film. Note that an $SiH_4$ gas may be used instead of a $B_2H_6$ gas.

For example, in the case where an oxide semiconductor film, for example, an In—Ga—Zn—O film, is formed by a film formation apparatus using ALD, an $In(CH_3)_3$ gas and an $O_3$ gas) are sequentially and repeatedly introduced to form an In—O layer, a $Ga(CH_3)_3$ gas and an $O_3$ gas) are sequentially and repeatedly introduced to form a GaO layer, and then a $Zn(CH_3)_2$ gas and an $O_3$ gas) are sequentially and repeatedly introduced to form a ZnO layer. Note that the order of these layers is not limited to this example. A mixed oxide layer such as an In—Ga—O layer, an In—Zn—O layer, or a Ga—Zn—O layer may be formed by using these gases. Note that although an $H_2O$ gas which is obtained by bubbling water with an inert gas such as Ar may be used instead of an $O_3$ gas), it is preferable to use an $O_3$ gas), which does not contain H. Furthermore, instead of an $In(CH_3)_3$ gas, an $In(C_2H_5)_3$ gas may be used. Furthermore, instead of a Ga(CH$_3$)$_3$ gas, a Ga(C$_2$H$_5$)$_3$ gas may be used. Furthermore, a Zn(CH$_3$)$_2$ gas may be used.

Note that this embodiment can be combined with any of the other embodiments in this specification as appropriate.

Embodiment 4

In this embodiment, an example of application of the data processing device of one embodiment of the present invention will be described.

A computer generally includes, as its components, a processor, a main memory, storage and the like on a motherboard, which are electrically connected to one another through a bus line, for example. Thus, the parasitic capacitance increases as the bus line lengthens, resulting in increased power consumption required for signal transmission.

Figure 13A:
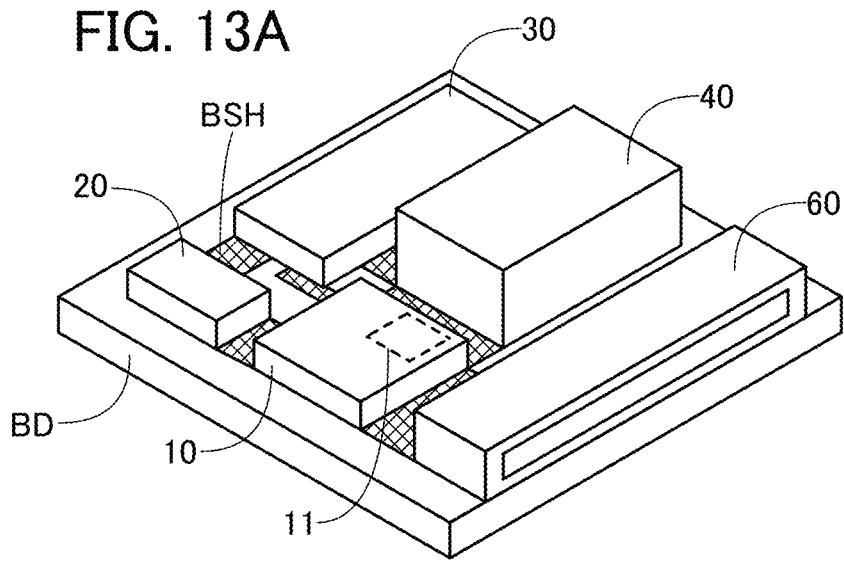
FIG. 13A is a perspective view illustrating a structure example of a computer.

Specifically, the computer has a structure illustrated in FIG. 13A, for example. The computer includes a motherboard BD, and an arithmetic processing unit (e.g., a processor and a CPU) 10, a main memory (e.g., a DRAM (Dynamic Random Access Memory)) 30, storage (e.g., a three-dimensional NAND memory device or a 3D OS NAND memory device) 40, an interface 60, and the like are provided on the motherboard BD. Although an SRAM (Static Random Access Memory) 20 that also functions as a main memory is illustrated in FIG. 13A, it is not necessarily provided on the motherboard BD.

Note that FIG. 13 illustrates a structure in which the arithmetic processing unit 10 includes a register 11.

In FIG. 13A, the arithmetic processing unit 10 is electrically connected to the SRAM 20, the main memory 30, the storage 40, and the interface 60. The main memory 30 is electrically connected to the SRAM 20 and the storage 40.

Note that the components of the computer in FIG. 13A are electrically connected to one another through a bus line BSH. This means that as the number of components of the computer increases or the motherboard BD increases in size, the bus line BSH to be routed lengthens; thus, the power consumption required for signal transmission increases.

The components of the computer in FIG. 13A may be integrated into one chip to form a monolithic IC (integrated circuit). In this case, the data processing device 50 in FIG. 1 or the like, which is described in the above embodiment, can be used as the main memory 30 and the storage 40. The case where the computer in FIG. 13A is made as a monolithic IC in this manner is illustrated in FIG. 13B.

Figure 13B:
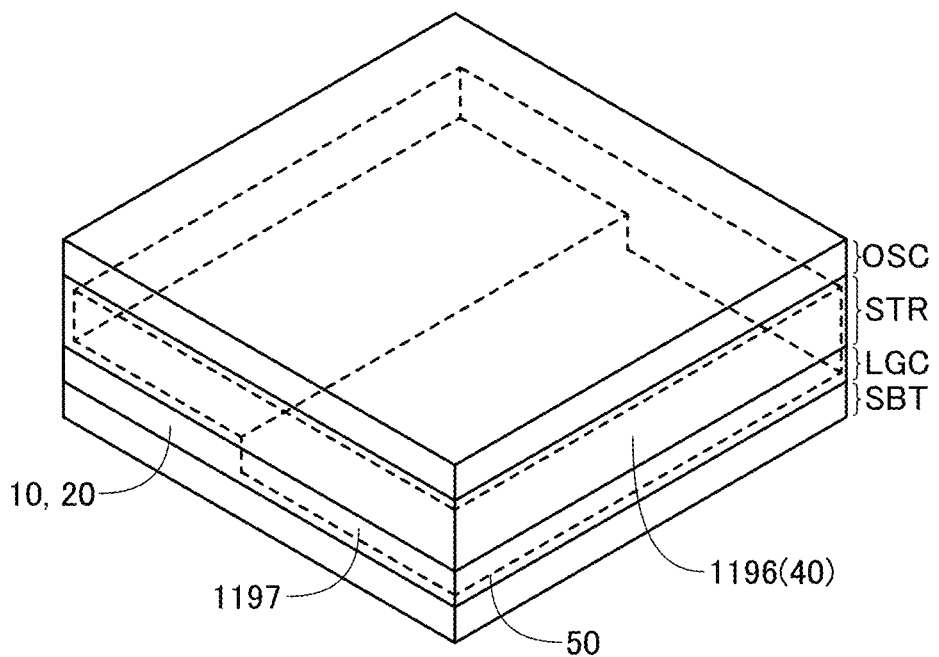
FIG. 13B is a perspective view illustrating a monolithic IC.

The monolithic IC in FIG. 13B includes a circuit layer LGC over a semiconductor substrate containing Si. The monolithic IC also includes a memory layer STR over the circuit layer LGC and a circuit layer OSC over the memory layer STR.

The circuit layer LGC includes a plurality of circuits including Si transistors formed on a semiconductor substrate SBT containing Si, for example. As part of the plurality of circuits, the arithmetic processing unit 10, the SRAM 20, and the like in FIG. 13A can be used, for example. In the case where the data processing device in FIG. 1 or the like is used as the main memory 30 and the storage 40, part of the plurality of circuits can be the controller 1197 included in the data processing device 50.

In particular, by using a Si transistor for the SRAM 20, for example, the drive frequency of the SRAM can be increased.

The memory layer STR functions as a memory portion including a Si transistor and/or an OS transistor. The memory layer STR can be, for example, a three-dimensional NAND memory circuit, a 3D OS NAND memory circuit, or the like. Thus, the memory layer STR includes the memory portion 1196 in the data processing device in FIG. 1, the storage 40 in FIG. 13A, and the like.

The use of the 3D OS NAND memory circuit can reduce the power consumption of the monolithic IC in FIG. 13B.

The circuit layer OSC includes a plurality of circuits including OS transistors, for example. As part of the plurality of circuits, for example, a circuit that is different from the circuits included in the circuit layer LGC, such as the arithmetic processing unit 10 and the SRAM 20, can be used.

In the monolithic IC in FIG. 13B, the bus line BSH to be routed on the motherboard is not provided, resulting in short wirings electrically connecting the components. Accordingly, the power consumption required for signal transmission can be reduced.

The monolithic IC in FIG. 13B also includes the data processing device 50. Thus, the data processing device 50 functions as both the storage 40 and the main memory 30 in FIG. 13A. Therefore, in the monolithic IC in FIG. 13B, the main memory 30 can serve as the memory portion 1196 of the memory layer STR.

The bus line BSH is not provided and the memory portion 1196 is used as an alternative to the main memory 30, whereby the circuit area in the monolithic IC in FIG. 13B can be smaller than that in the computer in FIG. 13A.

Figure 14A:
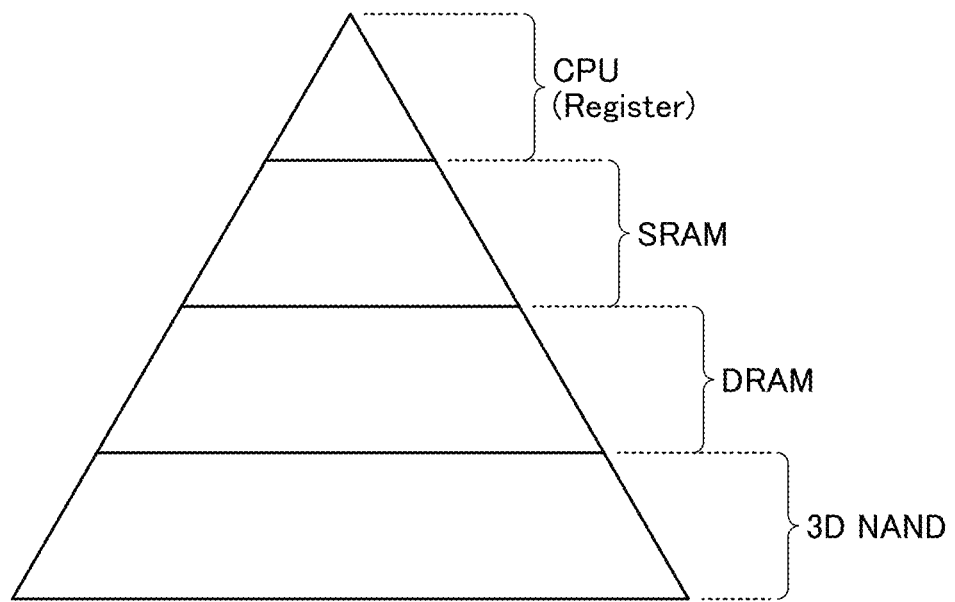
FIG. 14A and FIG. 14B are diagrams illustrating memory hierarchies of the computer and the monolithic IC, respectively.
Figure 14B:
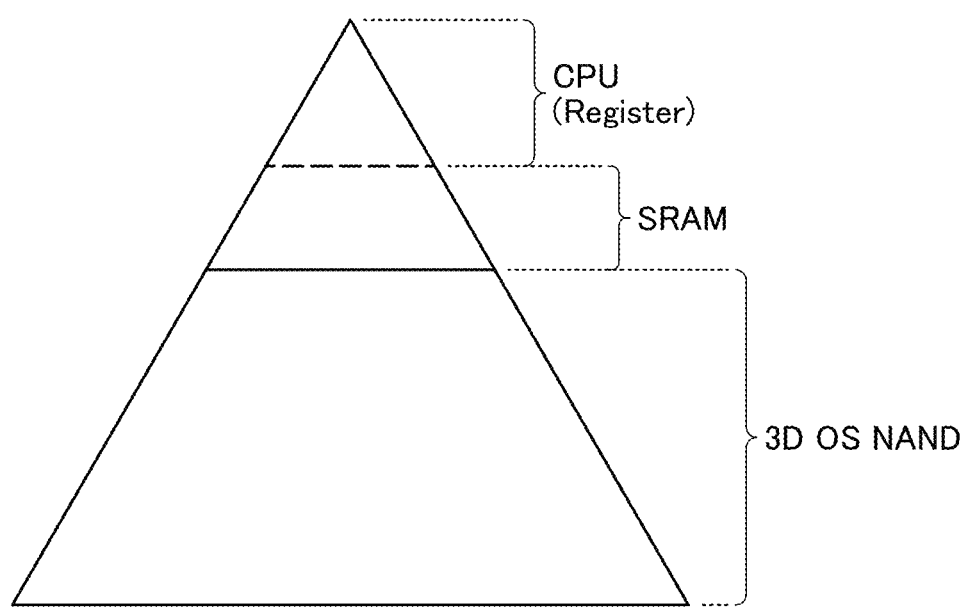

FIG. 14A and FIG. 14B illustrate memory hierarchy examples of the computer in FIG. 13A and the monolithic IC in FIG. 13B, respectively.

In a general memory hierarchy, memory devices at the upper levels require higher operation speed, and memory devices at the lower levels require larger storage capacity and higher record density. For example, FIG. 14A illustrates, in order from the top, a register included in the CPU (the arithmetic processing unit 10), the SRAM, the DRAM included in the main memory 30, the three-dimensional NAND memory circuit included in the storage 40.

The register included in the arithmetic processing unit 10 and the SRAM are used for temporary storage of arithmetic operation results, for example, and thus is frequently accessed by the arithmetic processing unit 10. Accordingly, high operation speed is required rather than memory capacity. The register also has a function of retaining settings of the arithmetic processing unit, for example.

The DRAM included in the main memory 30 has a function of retaining a program or data read from the storage 40, for example. The record density of the DRAM is approximately 0.1 to 0.3 Gbit/mm$^2$.

The storage 40 has a function of retaining data that needs to be stored for a long time and a variety of programs used in the arithmetic processing unit, for example. Therefore, the storage 40 needs to have large storage capacity and high record density rather than operation speed. The record density of a memory device used for the storage 40 is approximately 0.6 to 6.0 Gbit/mm$^2$. Thus, a three-dimensional NAND memory circuit (3D OS NAND), a hard disk drive (HDD), or the like is used as the storage 40.

Since, in the monolithic IC in FIG. 13B, the data processing device 50 in FIG. 1 functions as the storage 40 and the main memory 30 in FIG. 13A as described above, the memory hierarchy of the monolithic IC in FIG. 13B is as illustrated in FIG. 14B.

In other words, in the monolithic IC in FIG. 13B, a memory cell (3D OS NAND cell) included in the memory portion 100 of the data processing device 50 in FIG. 1 can be treated not only as a cache memory of the memory portion 100 but also as the main memory 30 in the computer in FIG. 13A. Accordingly, the main memory 30 such as a DRAM does not need to be provided in the monolithic IC in FIG. 13B, resulting in a smaller circuit area in the monolithic IC in FIG. 13B and lower power consumption required for the operation of the main memory 30 such as a DRAM.

Note that the structure of the monolithic IC illustrated in FIG. 13B is an example and is not limited to one embodiment of the present invention. The structure of the monolithic IC illustrated in FIG. 13B may be changed depending on circumstances. For example, in the case where a high-speed memory of 1 GHz or higher is required as the SRAM in the monolithic IC in FIG. 13B, the SRAM may be included in the arithmetic processing unit.

Note that this embodiment can be combined with any of the other embodiments in this specification as appropriate.

Embodiment 5

In this embodiment, an example of a method for writing to a NAND memory device of this specification or the like is described.

Figure 15A:
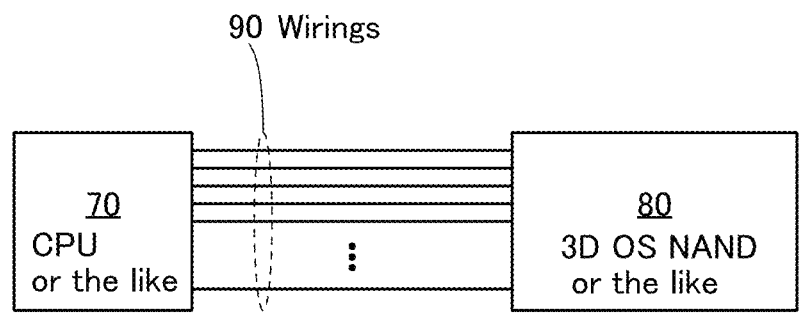
FIG. 15A and FIG. 15B are block diagrams illustrating a structure of a data processing device and a method for operating the data processing device.

FIG. 15A illustrates an electrical connection between an arithmetic processing unit (e.g., a processor or a CPU) 70 and a memory device (a three-dimensional NAND memory device or a 3D OS NAND memory device) 80. Specifically, the arithmetic processing unit 70 is electrically connected to the memory device 80 through a plurality of wirings 90.

The arithmetic processing unit 70 has a function of transmitting data for writing to memory cells included in the memory device 80, to the memory device 80 through the plurality of wirings 90. In other words, the plurality of wirings 90 function as write bit lines corresponding to the wirings WBL of the above-described embodiment. For example, in the case where the memory device 80 is a NAND memory device and includes a plurality of strings, the plurality of wirings 90 are electrically connected to the plurality of strings.

In order to increase the speed of writing data to the memory cells included in the memory device 80, the wirings 90 are formed of a low-resistant material or the length of the wirings 90 is set short, for example.

As a way of increasing the speed of writing data to the memory cells included in the memory device 80, the number of wirings 90 is increased. By increasing the number of wirings 90 (the number of strings in the memory device 80 electrically connected to the wirings 90), the amount of data that can be written to the memory cells at one time can be increased.

Figure 15B:
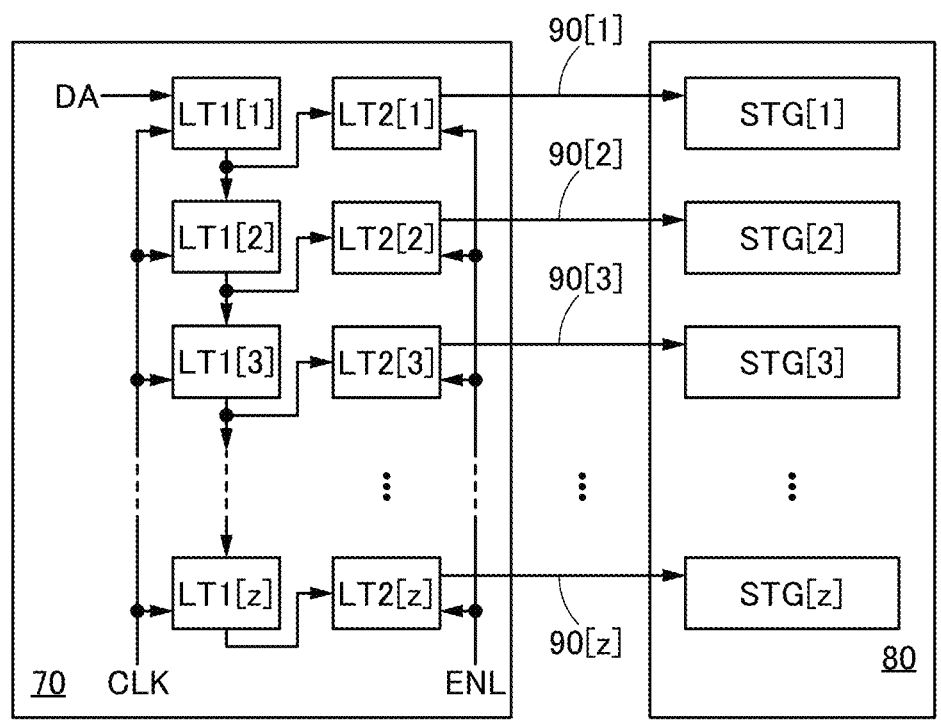

Next, a method for transmitting write data is described with reference to FIG. 15B.

The arithmetic processing unit 70 includes a latch circuit LT1[1] to a latch circuit LT1[z] (z is an integer more than or equal to 2), a latch circuit LT2[1] to a latch circuit LT2[z], and a wiring 90[1] to a wiring 90[z], for example. The memory device 80, as a NAND memory device, includes a string STG[1] to a string STG[z], for example.

In the arithmetic processing unit 70, the latch circuit LT1[1] to the latch circuit LT1[z] form a shift register. Thus, a wiring CLK which transmits a clock signal is electrically connected to each of clock input terminals of the latch circuit LT1[1] to the latch circuit LT1[z]. The shift register can sequentially transmit data DA for writing, which is input to an input terminal of the latch circuit LT1[1], to the latch circuit LT1[2] to the latch circuit LT1[z] in accordance with the number of times a pulse voltage as a clock signal is input from the wiring CLK.

An output terminal of a latch circuit LT1[v] (here, v is an integer more than or equal to 1 and less than or equal to z) is electrically connected to an input terminal of a latch circuit LT2[v]. Thus, the data DA output from the latch circuit LT1 [v] is input to the latch circuit LT2[v]. Furthermore, the latch circuit LT2[v] is electrically connected to a string STG[v] through a wiring 90[v].

A wiring ENL is electrically connected to each of clock input terminals of the latch circuit LT2[1] to the latch circuit LT2[z]. The wiring ENL functions as a wiring that transmits a trigger signal for the transmission of the data DA from the arithmetic processing unit 70 to the memory device 80.

The data DA is input to the latch circuit LT1[1] by serial transmission, so that the data DA is sequentially input to the latch circuit LT1[1]. Here, the data DA is sequentially input to the latch circuit LT1[1] to the latch circuit LT1[z], so that the latch circuit LT1[1] to the latch circuit LT1[z] store data DA[1] to data DA[z], respectively.

At this time, the data DA[1] to the data DA[z] are output from output terminals of the latch circuit LT1[1] to the latch circuit LT1[z], respectively. The data DA[1] to the data DA[z] are input to the latch circuit LT2[1] to the latch circuit LT2[z], respectively.

Thus, the data DA input by serial transmission can be distributed to the latch circuit LT1[1] to the latch circuit LT1[z] as the data DA[1] to the data DA[z]. In other words, the data DA input by serial transmission can be distributed to the wiring 90[1] to the wiring 90[z] as the data DA[1] to the data DA[z].

Then, the trigger signal is input to each of the clock signal input terminals of the latch circuit LT2[1] to the latch circuit LT2[z] through the wiring ENL, whereby the data DA[1] to the data DA[z] can be input to the string STG[1] to the string STG[z] of the memory device 80 in parallel through the wiring 90[1] to the wiring 90[z] from the latch circuit LT2[1] to the latch circuit LT2[z].

With the above-described structure and driving method, the serial-transmitted data for writing to the memory device 80 can be transmitted to the string STG[1] to the string STG[z] of the memory device 80 in parallel.

Note that this embodiment can be combined with any of the other embodiments in this specification as appropriate.

Embodiment 6

Described in this embodiment is a metal oxide (hereinafter also referred to as an oxide semiconductor) that can be used in an OS transistor described in the above embodiment.

A metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structures>

First, the classification of the crystal structures of an oxide semiconductor will be described with reference to FIG. 16A. FIG. 16A is a diagram showing the classification of crystal structures of an oxide semiconductor, typically IGZO (a metal oxide containing In, Ga, and Zn).

As shown in FIG. 16A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (cloud-aligned composite) (excluding single crystal and poly crystal). Note that single crystal, poly crystal, and completely amorphous are excluded from the category of "Crystalline". The term "Crystal" includes single crystal and poly crystal.

Note that the structures in the thick frame in FIG. 16A are in an intermediate state between "Amorphous" and "Crystal", and belong to a new crystalline phase. That is, these structures are completely different from "Amorphous", which is energetically unstable, and "Crystal".

A crystal structure of a film or a substrate can be evaluated with an X-Ray Diffraction (XRD) spectrum. FIG. 16B shows an XRD spectrum, which is obtained by GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 16B and obtained by GIXD measurement is hereinafter simply referred to as an XRD spectrum. The CAAC-IGZO film in FIG. 16B has a composition in the neighborhood of In:Ga: Zn=4:2:3 [atomic ratio]. The CAAC-IGZO film in FIG. 16B has a thickness of 500 nm.

As shown in FIG. 16B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 16B, the peak at 2θ of around 31° is asymmetric with respect to the axis of the angle at which the peak intensity (Intensity) is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 16C shows a diffraction pattern of the CAAC-IGZO film. FIG. 16C shows a diffraction pattern obtained by the NBED method in which an electron beam is incident in the direction parallel to the substrate. The composition of the CAAC-IGZO film in FIG. 16C is In:Ga:Zn=4:2:3 [atomic ratio] or the neighborhood thereof. In the nanobeam electron diffraction method, electron diffraction is performed with a probe diameter of 1 nm.

As shown in FIG. 16C, a plurality of spots indicating c-axis alignment are observed in the diffraction pattern of the CAAC-IGZO film.

<<Structure of Oxide Semiconductor>>

Oxide semiconductors might be classified in a manner different from that in FIG. 16A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like), the CAAC-OS tends to have a layered crystal structure (also referred to as a stacked-layer structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of a lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is unlikely to occur. Entry of impurities, formation of defects, or the like might decrease the crystallinity of an oxide semiconductor, which means that the CAAC-OS can be referred to as an oxide semiconductor having small amounts of impurities and defects (e.g., oxygen vacancies). Therefore, an oxide semiconductor including the CAAC-OS is physically stable. Accordingly, the oxide semiconductor including the CAAC-OS is resistant to heat and has high reliability. In addition, the CAAC-OS is stable with respect to high temperatures in the manufacturing process (i.e., thermal budget). Accordingly, the use of the CAAC-OS for the OS transistor can extend the degree of freedom of the manufacturing process.

[nc-OS]

In the nc-OS, a microscopic region (e.g., a region greater than or equal to 1 nm and less than or equal to 10 nm, in particular, a region greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. There is no regularity of crystal orientation between different nanocrystals in the nc-OS. Hence, the orientation in the whole film is not observed. Accordingly, in some cases, the nc-OS cannot be distinguished from an a-like OS or an amorphous oxide semiconductor, depending on the analysis method. For example, when an nc-OS film is subjected to structural analysis by out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[a-Like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has higher hydrogen concentration in the film than the nc-OS and the CAAC-OS.

<<Composition of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic proportions of In, Ga, and Zn in the metal elements contained in the CAC-OS in an In—Ga—Zn oxide are denoted by [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. For example, the first region has higher [In] than the second region and lower [Ga] than the second region. Moreover, the second region has higher [Ga] than the first region and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility ($\mu$), and excellent switching operation can be achieved.

An oxide semiconductor can have any of various structures that show various different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, a case where the above-described oxide semiconductor is used for a transistor is described.

When the above-described oxide semiconductor is used for a transistor, a transistor with high field-effect mobility can be achieved. In addition, a highly reliable transistor can be achieved.

An oxide semiconductor having a low carrier concentration is preferably used for the transistor. For example, the carrier concentration of an oxide semiconductor is lower than or equal to $1 \times 10^{17}$ cm$^{-3}$, preferably lower than or equal to $1 \times 10^{15}$ cm$^{-3}$, further preferably lower than or equal to $1 \times 10^{13}$ cm$^{-3}$, still further preferably lower than or equal to $1 \times 10^{11}$ cm$^{-3}$, yet further preferably lower than $1 \times 10^{10}$ cm$^{-3}$, and higher than or equal to $1 \times 10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Electric charges captured by the trap states in an oxide semiconductor take a long time to be released and may behave like fixed electric charges. A transistor whose channel formation region is formed in an oxide semiconductor having a high density of trap states has unstable electrical characteristics in some cases.

In order to obtain stable electrical characteristics of the transistor, it is effective to reduce the impurity concentration in the oxide semiconductor. In order to reduce the impurity concentration in the oxide semiconductor, the impurity concentration in a film that is adjacent to the oxide semiconductor is preferably reduced. Examples of impurities include hydrogen, nitrogen, an alkali metal, an alkaline earth metal, iron, nickel, and silicon.

<Impurities>

Here, the influence of each impurity in the oxide semiconductor is described.

When silicon or carbon, which is a Group 14 element, is contained in an oxide semiconductor, defect states are formed in the oxide semiconductor. Thus, the concentration of silicon or carbon in the oxide semiconductor and in the vicinity of an interface with the oxide semiconductor (the concentration obtained by secondary ion mass spectrometry (SIMS)) is lower than or equal to $2 \times 10^{18}$ atoms/cm$^3$, preferably lower than or equal to $2 \times 10^{17}$ atoms/cm$^3$.

When the oxide semiconductor contains an alkali metal or an alkaline earth metal, defect states are formed and carriers are generated in some cases. Accordingly, a transistor using an oxide semiconductor that contains an alkali metal or an alkaline earth metal tends to have normally-on characteristics. Thus, the concentration of an alkali metal or an alkaline earth metal in the oxide semiconductor, which is obtained by SIMS, is lower than or equal to $1 \times 10^{18}$ atoms/cm$^3$, preferably lower than or equal to $2 \times 10^{16}$ atoms/cm$^3$.

An oxide semiconductor containing nitrogen easily becomes n-type by generation of electrons serving as carriers and an increase in carrier concentration. Thus, a transistor using an oxide semiconductor that contains nitrogen as the semiconductor tends to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

Hydrogen contained in an oxide semiconductor reacts with oxygen bonded to a metal atom to be water, and thus causes an oxygen vacancy in some cases. Entry of hydrogen into the oxygen vacancy generates an electron serving as a carrier in some cases. Furthermore, some hydrogen may react with oxygen bonded to a metal atom and generate an electron serving as a carrier. Thus, a transistor using an oxide semiconductor that contains hydrogen tends to have normally-on characteristics. For this reason, hydrogen in the oxide semiconductor is preferably reduced as much as possible. Specifically, the hydrogen concentration in the oxide semiconductor, which is obtained by SIMS, is set lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$.

When an oxide semiconductor with sufficiently reduced impurities is used for a channel formation region in a transistor, the transistor can have stable electrical characteristics.

Note that this embodiment can be combined with any of the other embodiments in this specification as appropriate.

Embodiment 7

This embodiment describes examples of a semiconductor wafer where the data processing device or the like described in the above embodiment is formed and electronic components incorporating the data processing device.

<Semiconductor Wafer>

First, an example of a semiconductor wafer where a data processing device or the like is formed is described with reference to FIG. 17A.

Figure 17A:
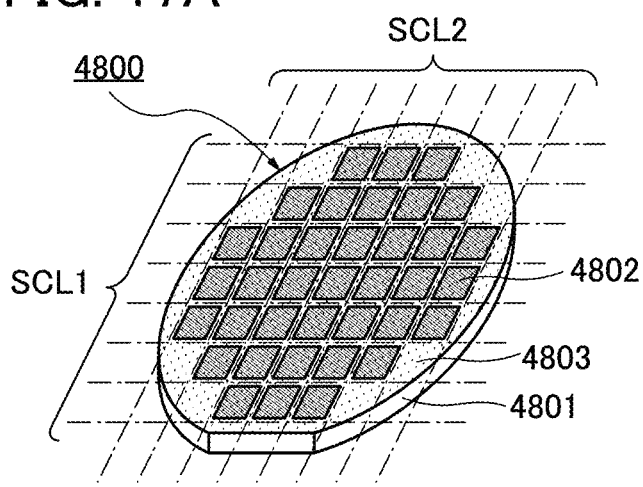
FIG. 17A is a perspective view illustrating an example of a semiconductor wafer.

A semiconductor wafer 4800 illustrated in FIG. 17A includes a wafer 4801 and a plurality of circuit portions 4802 provided on the top surface of the wafer 4801. A portion without the circuit portion 4802 on the top surface of the wafer 4801 is a spacing 4803 that is a region for dicing.

The semiconductor wafer 4800 can be fabricated by forming the plurality of circuit portions 4802 on the surface of the wafer 4801 by a pre-process. After that, a surface of the wafer 4801 opposite to the surface provided with the plurality of circuit portions 4802 may be ground to thin the wafer 4801. Through this step, warpage or the like of the wafer 4801 is reduced and the size of the component can be reduced.

A dicing step is performed as the next step. The dicing is performed along scribe lines SCL1 and scribe lines SCL2 (referred to as dicing lines or cutting lines in some cases) indicated by dashed-dotted lines. Note that to perform the dicing step easily, it is preferable that the spacing 4803 be provided so that the plurality of scribe lines SCL1 are parallel to each other, the plurality of scribe lines SCL2 are parallel to each other, and the scribe lines SCL1 are perpendicular to the scribe lines SCL2.

Figure 17B:
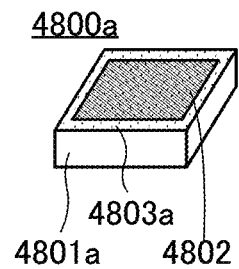
FIG. 17B is a perspective view illustrating an example of a chip.

With the dicing step, a chip 4800a illustrated in FIG. 17B can be cut out from the semiconductor wafer 4800. The chip 4800a includes a wafer 4801a, the circuit portion 4802, and a spacing 4803a. Note that it is preferable to make the spacing 4803a small as much as possible. In this case, the width of the spacing 4803 between adjacent circuit portions 4802 is substantially the same as a cutting allowance of the scribe line SCL1 or a cutting allowance of the scribe line SCL2.

Note that the shape of the element substrate of one embodiment of the present invention is not limited to the shape of the semiconductor wafer 4800 illustrated in FIG. 17A. The element substrate may be a rectangular semiconductor wafer, for example. The shape of the element substrate can be changed as appropriate, depending on a manufacturing process of an element and an apparatus for manufacturing the element.

<Electronic Component>

Figure 17C:
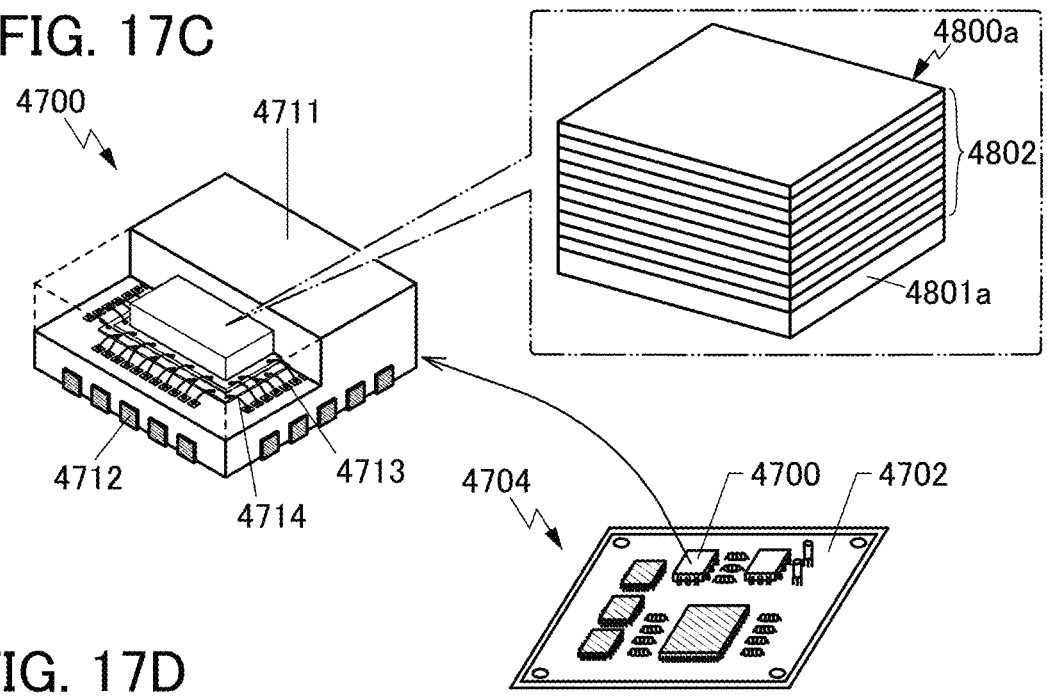
FIG. 17C and FIG. 17D are perspective views illustrating examples of electronic components.

FIG. 17C is a perspective view of an electronic component 4700 and a substrate (a mounting board 4704) on which the electronic component 4700 is mounted. The electronic component 4700 illustrated in FIG. 17C includes the chip 4800a in a mold 4711. Note that the chip 4800a illustrated in FIG. 17C is shown to have a structure in which the circuit portions 4802 are stacked. That is, the data processing device described in the above embodiment can be used for the circuit portion 4802. To illustrate the inside of the electronic component 4700, some portions are omitted in FIG. 17C. The electronic component 4700 includes a land 4712 outside the mold 4711. The land 4712 is electrically connected to an electrode pad 4713, and the electrode pad 4713 is electrically connected to the chip 4800a through a wire 4714. The electronic component 4700 is mounted on a printed circuit board 4702, for example. A plurality of such electronic components are combined and electrically connected to each other on the printed circuit board 4702, whereby the mounting board 4704 is completed.

Figure 17D:
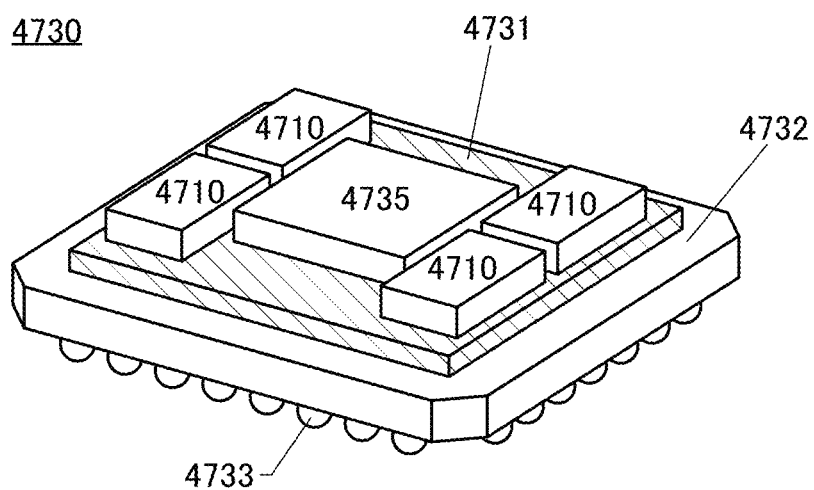

FIG. 17D shows a perspective view of an electronic component 4730. The electronic component 4730 is an example of a SiP (System in package) or an MCM (Multi Chip Module). In the electronic component 4730, an interposer 4731 is provided on a package substrate 4732 (a printed circuit board), and a semiconductor device 4735 and a plurality of semiconductor devices 4710 are provided on the interposer 4731.

The electronic component 4730 includes the semiconductor devices 4710. Examples of the semiconductor device 4710 include the semiconductor device described in the above embodiment and a high bandwidth memory (HBM). An integrated circuit (a semiconductor device) such as a CPU, a GPU, an FPGA, or a memory device can be used as the semiconductor device 4735.

As the package substrate 4732, a ceramic substrate, a plastic substrate, a glass epoxy substrate, or the like can be used. As the interposer 4731, a silicon interposer, a resin interposer, or the like can be used.

The interposer 4731 includes a plurality of wirings and has a function of electrically connecting a plurality of integrated circuits with different terminal pitches. The plurality of wirings are provided in a single layer or multiple layers. Moreover, the interposer 4731 has a function of electrically connecting an integrated circuit provided on the interposer 4731 to an electrode provided on the package substrate 4732. Accordingly, the interposer is referred to as a "redistribution substrate" or an "intermediate substrate" in some cases. A through electrode is provided in the interposer 4731 and the through electrode is used to electrically connect an integrated circuit and the package substrate 4732 in some cases. In a silicon interposer, a TSV (Through Silicon Via) can also be used as the through electrode.

A silicon interposer is preferably used as the interposer 4731. A silicon interposer can be manufactured at lower cost than an integrated circuit because it is not necessary to provide an active element. Moreover, since wirings of a silicon interposer can be formed through a semiconductor process, formation of minute wirings, which is difficult for a resin interposer, is easy.

In order to achieve a wide memory bandwidth, many wirings need to be connected to HBM. Therefore, formation of minute and high-density wirings is required for an interposer on which HBM is mounted. For this reason, a silicon interposer is preferably used as the interposer on which HBM is mounted.

In a SiP, an MCM, or the like using a silicon interposer, a decrease in reliability due to a difference in expansion coefficient between an integrated circuit and the interposer is less likely to occur. Furthermore, the surface of a silicon interposer has high planarity, so that a poor connection between the silicon interposer and an integrated circuit provided on the silicon interposer is less likely to occur. It is particularly preferable to use a silicon interposer for a 2.5D package (2.5-dimensional mounting) in which a plurality of integrated circuits are arranged side by side on an interposer.

A heat sink (a radiator plate) may be provided to overlap with the electronic component 4730. In the case of providing a heat sink, the heights of integrated circuits provided on the interposer 4731 are preferably equal to each other. For example, in the electronic component 4730 described in this embodiment, the heights of the semiconductor devices 4710 and the semiconductor device 4735 are preferably equal to each other.

To mount the electronic component 4730 on another substrate, an electrode 4733 may be provided on the bottom portion of the package substrate 4732. FIG. 17D illustrates an example where the electrode 4733 is formed of a solder ball. Solder balls are provided in a matrix on the bottom portion of the package substrate 4732, whereby BGA (Ball Grid Array) mounting can be achieved. Alternatively, the electrode 4733 may be formed of a conductive pin. When conductive pins are provided in a matrix on the bottom portion of the package substrate 4732, PGA (Pin Grid Array) mounting can be achieved.

The electronic component 4730 can be mounted on another substrate by various mounting methods not limited to BGA and PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be employed.

Note that this embodiment can be combined with any of the other embodiments described in this specification as appropriate.

Embodiment 8

This embodiment describes examples of electronic devices including the data processing device described in the above embodiment. FIG. 18A to FIG. 18J illustrate electronic devices each of which includes the electronic component 4700 including the data processing device.

[Mobile Phone]

Figure 18A:
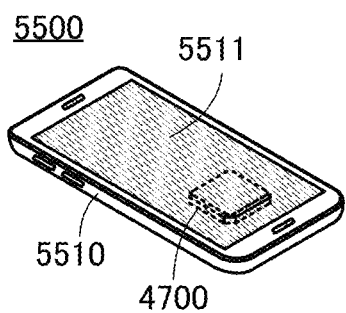
FIG. 18A to FIG. 18J are each a perspective view or a schematic view illustrating an example of a product.

An information terminal 5500 illustrated in FIG. 18A is a mobile phone (smartphone), which is a type of information terminal. The information terminal 5500 includes a housing 5510 and a display portion 5511, and as input interfaces, a touch panel is provided in the display portion 5511 and a button is provided in the housing 5510.

By using the data processing device described in the above embodiment, the information terminal 5500 can retain a temporary file generated at the time of executing an application (e.g., a web browser's cache).

[Wearable Terminal]

Figure 18B:
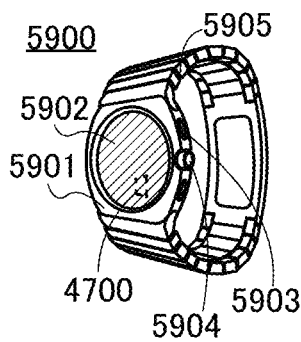

FIG. 18B illustrates an information terminal 5900 that is an example of a wearable terminal. The information terminal 5900 includes a housing 5901, a display portion 5902, an operation button 5903, an operator 5904, a band 5905, and the like.

Like the information terminal 5500 described above, the wearable terminal can retain a temporary file generated at the time of executing an application by using the data processing device described in the above embodiment.

[Information Terminal]

Figure 18C:
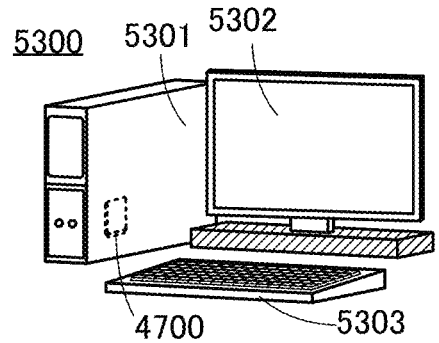

FIG. 18C illustrates a desktop information terminal 5300. The desktop information terminal 5300 includes a main body 5301 of the information terminal, a display 5302, and a keyboard 5303.

Like the information terminal 5500 described above, the desktop information terminal 5300 can retain a temporary file generated at the time of executing an application by using the data processing device described in the above embodiment.

Note that although the smartphone and the desktop information terminal are respectively illustrated in FIG. 18A and FIG. 18C as examples of the data processing device, one embodiment of the present invention can be applied to an information terminal other than a smartphone and a desktop information terminal. Examples of an information terminal other than a smartphone and a desktop information terminal include a PDA (Personal Digital Assistant), a laptop information terminal, and a workstation.

[Household Appliance]

Figure 18D:
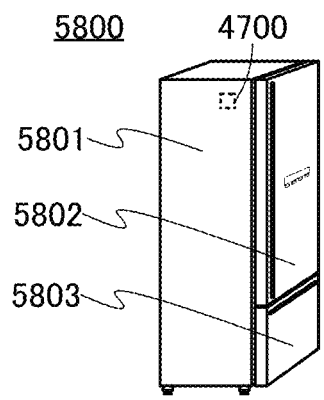

FIG. 18D illustrates an electric refrigerator-freezer 5800 as an example of a household appliance. The electric refrigerator-freezer 5800 includes a housing 5801, a refrigerator door 5802, a freezer door 5803, and the like.

When the data processing device described in the above embodiments is used in the electric refrigerator-freezer 5800, the electric refrigerator-freezer 5800 can be used for IoT (Internet of Things), for example. When used for IoT, the electric refrigerator-freezer 5800 can send and receive data on food stored in the electric refrigerator-freezer 5800 and food expiration dates, for example, to/from the above-described information terminal and the like via the Internet. When sending the data, the electric refrigerator-freezer 5800 can retain the data as a temporary file in the data processing device.

Although the electric refrigerator-freezer is described in this example as a household appliance, examples of other household appliances include a vacuum cleaner, a microwave oven, an electric oven, a rice cooker, a water heater, an IH cooker, a water server, a heating-cooling combination appliance such as an air conditioner, a washing machine, a drying machine, and an audiovisual appliance.

[Game Machines]

Figure 18E:
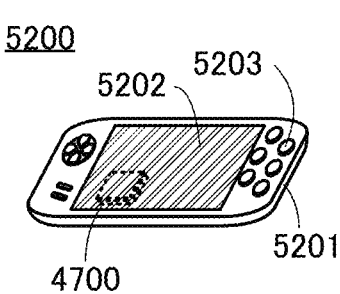

FIG. 18E illustrates a portable game machine 5200 that is an example of a game machine. The portable game machine 5200 includes a housing 5201, a display portion 5202, a button 5203, and the like.

Figure 18F:
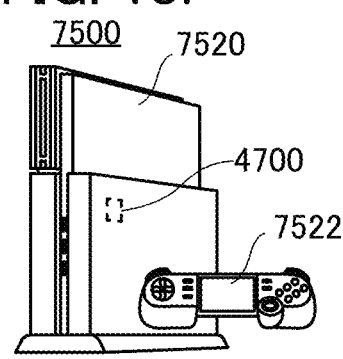

FIG. 18F illustrates a stationary game machine 7500 that is another example of a game machine. The stationary game machine 7500 includes a main body 7520 and a controller 7522. The controller 7522 can be connected to the main body 7520 with or without a wire. Although not illustrated in FIG. 18F, the controller 7522 can include a display portion that displays a game image, and an input interface besides a button, such as a touch panel, a stick, a rotating knob, and a sliding knob, for example. The shape of the controller 7522 is not limited to that illustrated in FIG. 18F, and can be changed variously in accordance with the genres of games. For example, for a shooting game such as an FPS (First Person Shooter) game, a gun-shaped controller having a trigger button can be used. As another example, for a music game or the like, a controller having a shape of a musical instrument, audio equipment, or the like can be used. Furthermore, the stationary game machine may include a camera, a depth sensor, a microphone, and the like so that the game player can play a game using a gesture and/or a voice instead of a controller.

Videos displayed on the game machine can be output with a display device such as a television device, a personal computer display, a game display, or a head-mounted display.

When the data processing device described in the above embodiment is used in the portable game machine 5200, the portable game machine 5200 with low power consumption can be achieved. Furthermore, heat generation from a circuit can be reduced owing to low power consumption; thus, the influence of heat generation on the circuit itself, the peripheral circuit, and the module can be reduced.

Moreover, with the use of the data processing device described in the above embodiment, the portable game machine 5200 can retain a temporary file necessary for an arithmetic operation that occurs during game play.

Although FIG. 18E and FIG. 18F illustrate the portable game machines as examples of game machines, the data processing device of one embodiment of the present invention is not limited thereto. Examples of the data processing device of one embodiment of the present invention include a home stationary game machine, an arcade game machine installed in entertainment facilities (e.g., a game center and an amusement park), and a throwing machine for batting practice installed in sports facilities.

[Moving Vehicle]

The data processing device described in the above embodiment can be used for an automobile, which is a moving vehicle, and around the driver's seat in an automobile.

Figure 18G:
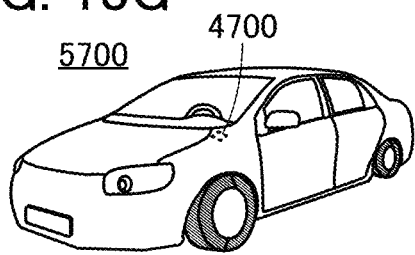

FIG. 18G illustrates an automobile 5700 that is an example of a moving vehicle.

An instrument panel that provides various kinds of information by displaying a speedometer, a tachometer, a mileage, a fuel meter, a gearshift state, and air-conditioning settings is provided around the driver's seat in the automobile 5700. In addition, a display device showing the above information may be provided around the driver's seat.

In particular, the display device can compensate for the view obstructed by the pillar or the like, the blind areas for the driver's seat, and the like by displaying a video taken by an imaging device (not illustrated) provided for the automobile 5700, which improves safety.

The data processing device described in the above embodiment can temporarily retain data, and thus the computer can be used to retain temporary data necessary in an automatic driving system for the automobile 5700 and a system for navigation and risk prediction, for example. The display device may be configured to display temporary information regarding navigation, risk prediction, or the like. Moreover, the semiconductor device may be configured to retain a video taken by a driving recorder provided in the automobile 5700.

Although an automobile is described above as an example of a moving vehicle, a moving vehicle is not limited to an automobile. Examples of moving vehicles include a train, a monorail train, a ship, and a flying object (a helicopter, an unmanned aircraft (a drone), an airplane, and a rocket).

[Camera]

The data processing device described in the above embodiment can be used in a camera.

Figure 18H:
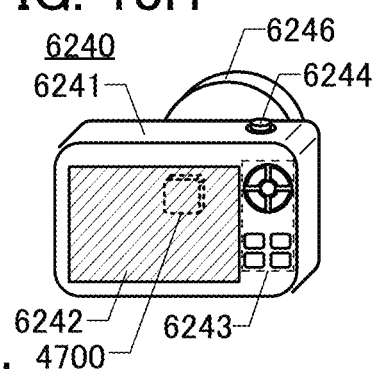

FIG. 18H illustrates a digital camera 6240 that is an example of an imaging device. The digital camera 6240 includes a housing 6241, a display portion 6242, operation buttons 6243, a shutter button 6244, and the like, and an attachable lens 6246 is attached to the digital camera 6240. Here, the lens 6246 of the digital camera 6240 is detachable from the housing 6241 for replacement; alternatively, the lens 6246 may be incorporated into the housing 6241. A stroboscope, a viewfinder, or the like may be additionally attached to the digital camera 6240.

When the data processing device described in the above embodiment is used in the digital camera 6240, the digital camera 6240 with low power consumption can be achieved. Furthermore, heat generation from a circuit can be reduced owing to low power consumption; thus, the influence of heat generation on the circuit itself, the peripheral circuit, and the module can be reduced.

[Video Camera]

The data processing device described in the above embodiment can be used in a video camera.

Figure 18I:
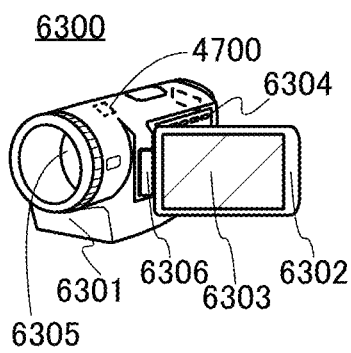

FIG. 18I illustrates a video camera 6300 that is an example of an imaging device. The video camera 6300 includes a first housing 6301, a second housing 6302, a display portion 6303, operation keys 6304, a lens 6305, a joint 6306, and the like. The operation keys 6304 and the lens 6305 are provided in the first housing 6301, and the display portion 6303 is provided in the second housing 6302. The first housing 6301 and the second housing 6302 are connected to each other with the joint 6306, and the angle between the first housing 6301 and the second housing 6302 can be changed with the joint 6306. Images displayed on the display portion 6303 may be changed in accordance with the angle at the joint 6306 between the first housing 6301 and the second housing 6302.

When images taken by the video camera 6300 are recorded, the images need to be encoded in accordance with a data recording format. With the use of the above data processing device, the video camera 6300 can retain a temporary file generated in encoding.

[ICD]

The data processing device described in the above embodiment can be used in an implantable cardioverter-defibrillator (ICD).

Figure 18J:
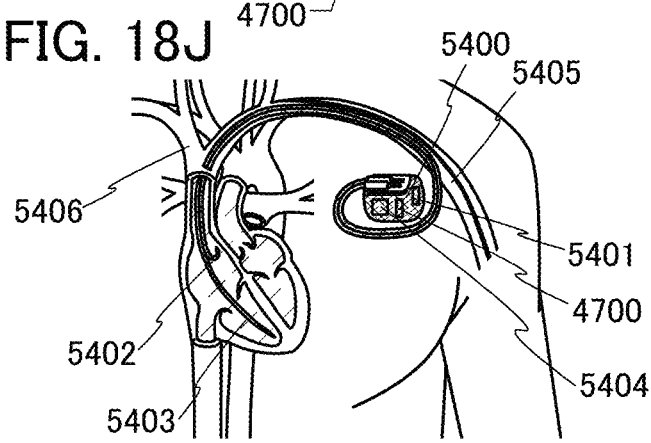

FIG. 18J is a schematic cross-sectional view illustrating an example of an ICD. An ICD main unit 5400 includes at least a battery 5401, an electric component 4700, a regulator, a control circuit, an antenna 5404, a wire 5402 reaching a right atrium, and a wire 5403 reaching a right ventricle.

The ICD main unit 5400 is implanted in the body by surgery, and the two wires pass through a subclavian vein 5405 and a superior vena cava 5406 of the human body, with the end of one of the wires placed in the right ventricle and the end of the other wire placed in the right atrium.

The ICD main unit 5400 functions as a pacemaker and paces the heart when the heart rate is not within a predetermined range. When the heart rate is not recovered by pacing (e.g., when ventricular tachycardia or ventricular fibrillation occurs), treatment with an electrical shock is performed.

The ICD main unit 5400 needs to monitor the heart rate all the time in order to perform pacing and deliver electrical shocks as appropriate. For that reason, the ICD main unit 5400 includes a sensor for measuring the heart rate. In the ICD main unit 5400, data on the heart rate obtained by the sensor, the number of times the treatment with pacing is performed, and the time taken for the treatment, for example, can be stored in the electronic component 4700.

The antenna 5404 can receive electric power, and the battery 5401 is charged with the electric power. When the ICD main unit 5400 includes a plurality of batteries, the safety can be improved. Specifically, even if one of the batteries in the ICD main unit 5400 is dead, the other batteries can work properly; hence, the batteries also function as an auxiliary power source.

In addition to the antenna 5404 capable of receiving electric power, an antenna that can transmit physiological signals may be included to construct, for example, a system that monitors the cardiac activity by checking physiological signals such as a pulse, a respiratory rate, a heart rate, and body temperature with an external monitoring device.

Note that this embodiment can be combined with any of the other embodiments described in this specification as appropriate.

Embodiment 9

In this embodiment, a computer including any of the data processing devices described in the above embodiments will be described.

Figure 19A:
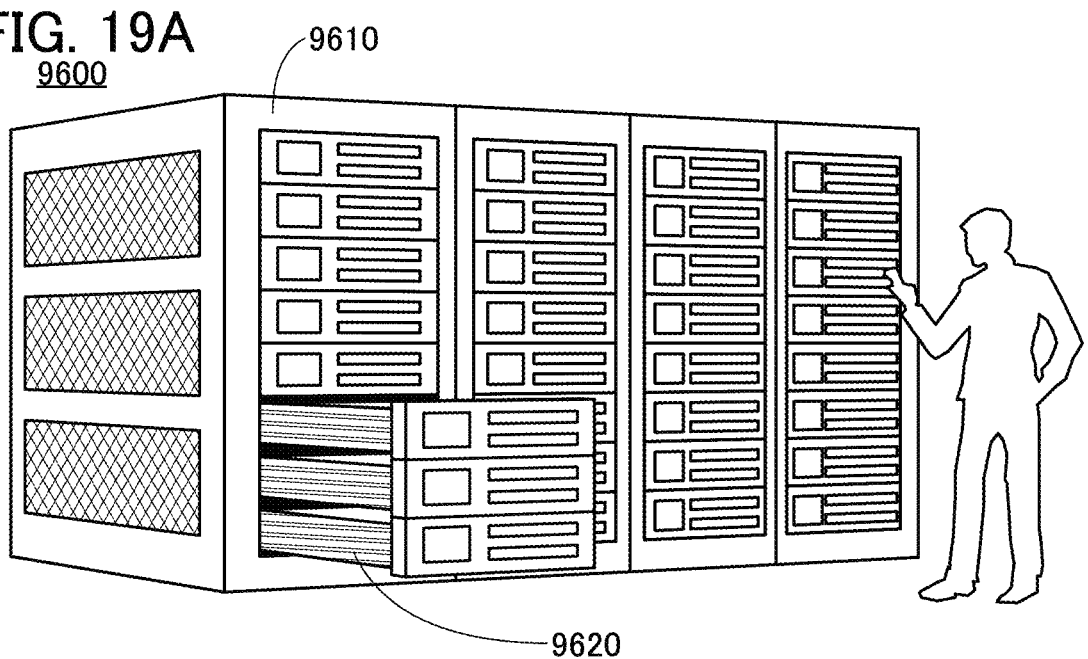
FIG. 19A to FIG. 19C are perspective views illustrating an example of a computer.

A computer 9600 illustrated in FIG. 19A is an example of a large computer. In the computer 9600, a plurality of rack mount computers 9620 are stored in a rack 9610.

Figure 19B:
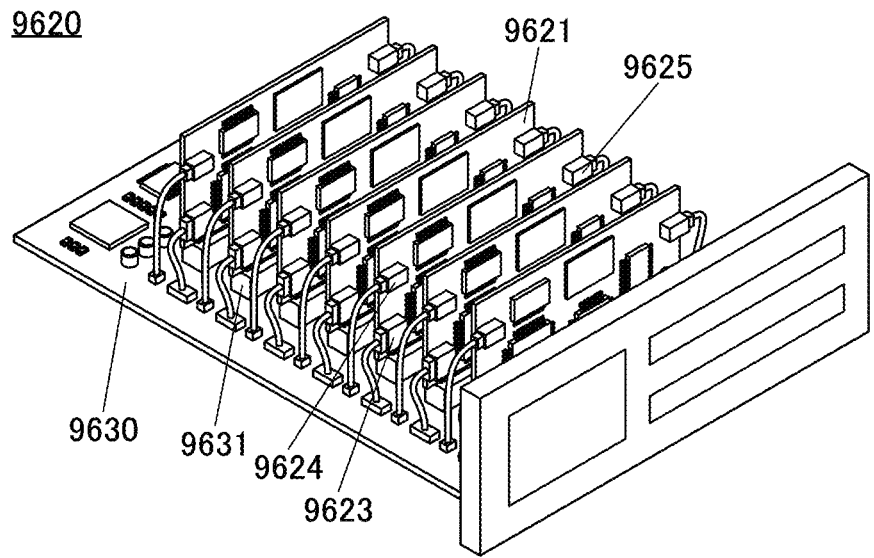

The computers 9620 can have a structure in a perspective view illustrated in FIG. 19B, for example. In FIG. 19B, the computer 9620 includes a motherboard 9630, and the motherboard 9630 includes a plurality of slots 9631 and a plurality of connection terminals. A PC card 9621 is inserted in the slot 9631. In addition, the PC card 9621 includes a connection terminal 9623, a connection terminal 9624, and a connection terminal 9625, each of which is connected to the motherboard 9630.

Figure 19C:
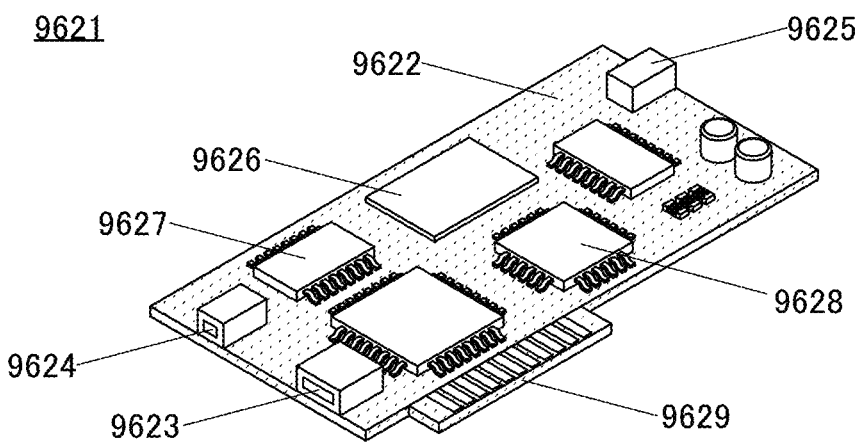

The PC card 9621 illustrated in FIG. 19C is an example of a processing board provided with a CPU, a GPU, a memory device, and the like. The PC card 9621 includes a board 9622. The board 9622 includes the connection terminal 9623, the connection terminal 9624, the connection terminal 9625, a semiconductor device 9626, a semiconductor device 9627, a semiconductor device 9628, and a connection terminal 9629. FIG. 19C also illustrates semiconductor devices other than the semiconductor device 9626, the semiconductor device 9627, and the semiconductor device 9628; the following description of the semiconductor device 9626, the semiconductor device 9627, and the semiconductor device 9628 can be referred to for those semiconductor devices.

The connection terminal 9629 has a shape with which the connection terminal 9629 can be inserted in the slot 9631 of the motherboard 9630, and the connection terminal 9629 functions as an interface for connecting the PC card 9621 and the motherboard 9630. An example of the standard for the connection terminal 9629 is PCIe.

The connection terminal 9623, the connection terminal 9624, and the connection terminal 9625 can serve, for example, as an interface for performing power supply, signal input, or the like to the PC card 9621. As another example, they can serve as an interface for outputting a signal calculated by the PC card 9621, for instance. Examples of the standard for each of the connection terminal 9623, the connection terminal 9624, and the connection terminal 9625 include USB (Universal Serial Bus), SATA (Serial ATA), and SCSI (Small Computer System Interface). In the case where video signals are output from the connection terminal 9623, the connection terminal 9624, and the connection terminal 9625, an example of the standard therefor is HDMI (registered trademark).

The semiconductor device 9626 includes a terminal (not illustrated) for inputting and outputting signals, and when the terminal is inserted in a socket (not illustrated) of the board 9622, the semiconductor device 9626 and the board 9622 can be electrically connected to each other.

The semiconductor device 9627 includes a plurality of terminals, and when the terminals are reflow-soldered, for example, to wirings of the board 9622, the semiconductor device 9627 and the board 9622 can be electrically connected to each other. Examples of the semiconductor device 9627 include an FPGA (Field Programmable Gate Array), a GPU, and a CPU. As the semiconductor device 9627, the electronic component 4730 can be used, for example.

The semiconductor device 9628 includes a plurality of terminals, and when the terminals are reflow-soldered, for example, to wirings of the board 9622, the semiconductor device 9628 and the board 9622 can be electrically connected to each other. Examples of the semiconductor device 9628 include a memory device and a data processing device. As the semiconductor device 9628, the electronic component 4700 can be used, for example.

The computer 9600 can also function as a parallel computer. When the computer 9600 is used as a parallel computer, large-scale computation necessary for artificial intelligence learning and inference can be performed, for example.

The semiconductor device of one embodiment of the present invention is used in a variety of electronic devices described above, whereby a reduction in size, an increase in speed, or a reduction in power consumption of the electronic devices can be achieved. In addition, since the semiconductor device of one embodiment of the present invention has low power consumption, heat generation from a circuit can be reduced. Accordingly, it is possible to reduce adverse effects of the heat generation on the circuit itself, the peripheral circuit, and the module. Furthermore, the use of the semiconductor device of one embodiment of the present invention enables an electronic device that operates stably even in a high temperature environment. Thus, the reliability of the electronic device can be increased.

Figure 20:
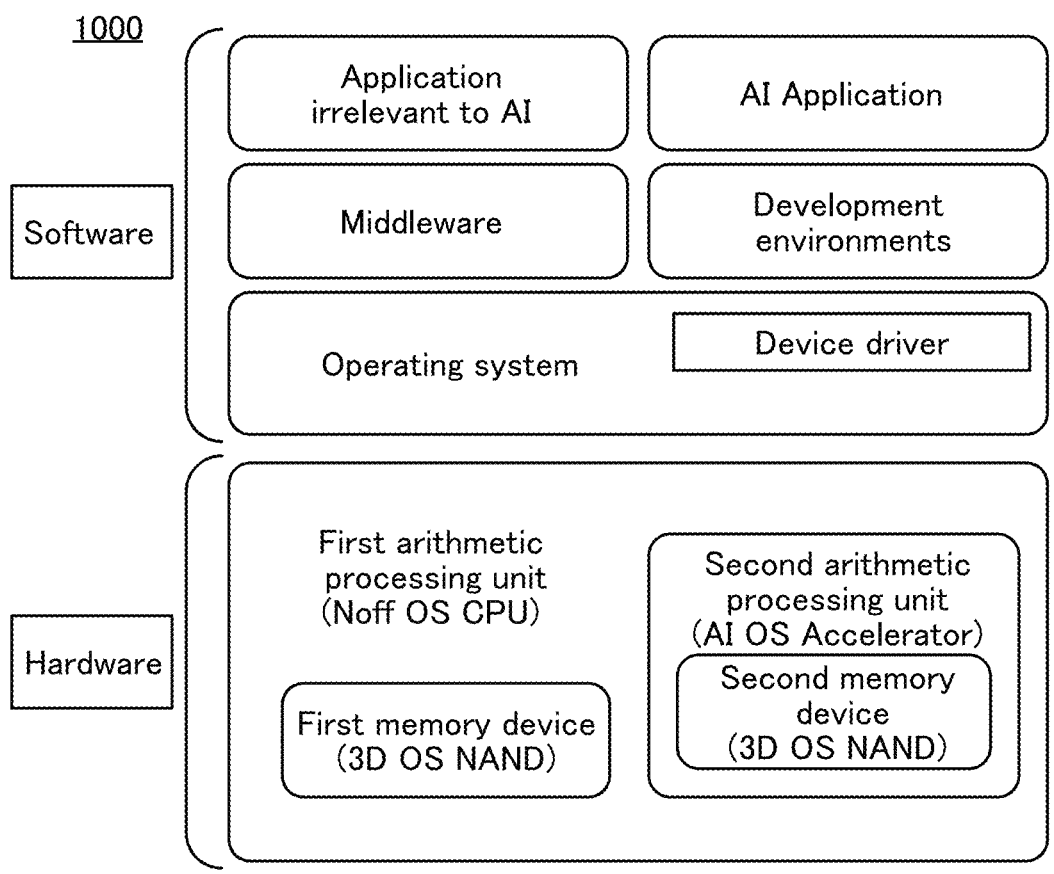
FIG. 20 is a diagram illustrating an example of a computer.

Next, a structure example of a computer system that can be used in the computer 9600 is described. FIG. 20 is a diagram illustrating a structure example of a computer system 1000. The computer system 1000 is made, including software and hardware. Note that the hardware included in the computer system is sometimes referred to as a data processing device.

Examples of the software in the computer system 1000 include an operating system including a device driver, middleware, a variety of development environments, an application program related to AI (AI Application), and an application program irrelevant to AI.

The device driver includes, for example, application programs for controlling externally connected devices such as an auxiliary memory device, a display device, and a printer.

The hardware in the computer system 1000 includes a first arithmetic processing unit, a second arithmetic processing unit, a first memory device, and the like. The second arithmetic processing unit includes a second memory device.

As the first arithmetic processing unit, a central arithmetic processing unit such as an Noff OS CPU is preferably used, for example. The Noff OS CPU includes a memory unit using OS transistors (e.g., a nonvolatile memory), and has a function of storing necessary data in the memory unit and stopping power supply to the central arithmetic processing unit when it does not need to operate. The use of the Noff OS CPU as the first arithmetic processing unit can reduce the power consumption of the computer system 1000.

As the second arithmetic processing unit, a GPU or an FPGA can be used, for example. Note that as the second arithmetic processing unit, an AI OS Accelerator is preferably used. The AI OS Accelerator is composed of OS transistors and includes an arithmetic unit such as a product-sum operation circuit. The power consumption of the AI OS Accelerator is lower than that of a common GPU and the like. The use of the AI OS Accelerator as the second arithmetic processing unit can reduce the power consumption of the computer system 1000.

As the first memory device and the second memory device, the semiconductor device of one embodiment of the present invention is preferably included. The semiconductor device of one embodiment of the present invention can include a 3D OS NAND memory device, for example; in this case, the 3D OS NAND memory device can function as a cache, a main memory, or a storage. The use of the 3D OS NAND memory device facilitates fabrication of a non-von Neumann computer system.

The power consumption of the 3D OS NAND memory device is lower than that of a 3D NAND memory device using Si transistors. The use of the 3D OS NAND memory device as the memory devices can reduce the power consumption of the computer system 1000. In addition, the 3D OS NAND memory device can function as a universal memory, thereby reducing the number of components of the memory devices included in the computer system 1000.

When the semiconductor devices in the hardware include OS transistors, the hardware including the central arithmetic processing unit, the arithmetic processing unit, and the memory devices can be easily monolithic. Making the hardware monolithic facilitates a further reduction in power consumption as well as a reduction in size, weight, and thickness.

Note that this embodiment can be combined with any of the other embodiments in this specification as appropriate.

REFERENCE NUMERALS

ST1: string, ST2: string, ST3: string, L[1]: memory cell, L[2]: memory cell, L[n]: memory cell, M[1]: memory cell, M[2]: memory cell, M[n]: memory cell, N[1]: memory cell, N[2]: memory cell, N[n]: memory cell, SL1: wiring, SL2: wiring, SL3: wiring, BL1: wiring, BL2: wiring, BL3: wiring, ISG: signal, OSG: signal, DT: data, STP1: step, STP2: step, STP3: step, STP4: step, STP5: step, STP6: step, STP7: step, STP8: step, MC[1]: memory cell, MC[2]: memory cell, MC[n]: memory cell, MC[1, 1]: memory cell, MC[j, 1]: memory cell, MC[n, 1]: memory cell, MC[1, i]: memory cell, MC[j, i]: memory cell, MC[n, i]: memory cell, MC[1, m]: memory cell, MC[j, m]: memory cell, MC[n, m]: memory cell, N1: node, N2: node, RWL[1]: wiring, RWL[2]: wiring, RWL[j]: wiring, RWL [n]: wiring, WWL[1]:

wiring, WWL[2]: wiring, WWL[j]: wiring, WWL[n]: wiring, WBL: wiring, WBL[1]: wiring, WBL[i]: wiring, WBL[m]: wiring, RBL: wiring, RBL[1]: wiring, RBL[i]: wiring, RBL[m]: wiring, BGL: wiring, BGL[1]: wiring, BGL[i]: wiring, BGL[m]: wiring, WTr: transistor, RTr: transistor, CS: capacitor, BLK_1: block, BLK_h: block, BLK_k: block, BLK_2: block, BLK_3: block, MC[1]_1: memory cell, MC[j]_1: memory cell, MC[n]_1: memory cell, MC[1]_h: memory cell, MC[j]_h: memory cell, MC[n]_h: memory cell, MC[1]_k: memory cell, MC[j]_k: memory cell, MC[n]_k: memory cell, MC[2]_1: memory cell, MC[3]_1: memory cell, MC[1]_2: memory cell, MC[2]_2: memory cell, MC[3]_2: memory cell, MC[1]_3: memory cell, MC[2]_3: memory cell, MC[3]_3: memory cell, RWL[1]_1: wiring, RWL[j]_1: wiring, RWL[n]_1: wiring, RWL[1]_h: wiring, RWL[j]_h: wiring, RWL [n]_h: wiring, RWL[1]_k: wiring, RWL[j]_k: wiring, RWL[n]_k: wiring, RWL[2]_1: wiring, RWL[3]_1: wiring, RWL[1]_2: wiring, RWL[2]_2: wiring, RWL[3]_2: wiring, RWL[1]_3: wiring, RWL[2]_3: wiring, RWL[3]_3: wiring, WWL[1]_1: wiring, WWL[j]_1: wiring, WWL[n]_1: wiring, WWL[1]_h: wiring, WWL[j]_h: wiring, WWL[n]_h: wiring, WWL[1]_k: wiring, WWL[j]_k: wiring, WWL[n]_k: wiring, WWL[2]_1: wiring, WWL[3]_1: wiring, WWL[1]_2: wiring, WWL[2]_2: wiring, WWL[3]_2: wiring, WWL[1]_3: wiring, WWL[2]_3: wiring, WWL[3]_3: wiring, RBL_1: wiring, RBL_h: wiring, RBL_k: wiring, RBL_2: wiring, RBL_3: wiring, WBL_1: wiring, WBL_h: wiring, WBL_k: wiring, WBL_2: wiring, WBL_3: wiring, LN1: wiring, LN2: wiring, BTr_1: transistor, BTr_h: transistor, BTr_k: transistor, BTr_2: transistor, BTr_3: transistor, STr_1: transistor, STr_h: transistor, STr_k: transistor, STr_2: transistor, STr_3: transistor, BD: motherboard, BSH: bus line, SBT: semiconductor substrate, LGC: circuit layer, STR: memory layer, OSC: circuit layer, LT1[1]: latch circuit, LT1[2]: latch circuit, LT1[3]: latch circuit, LT1[z]: latch circuit, LT2[1]: latch circuit, LT2[2]: latch circuit, LT2[3]: latch circuit, LT2[z]: latch circuit, DA: data, CLK: wiring, ENL: wiring, STG[1]: string, STG[2]: string, STG[3]: string, STG[z]: string, 10: arithmetic processing unit, 20: SRAM, 30: main memory, 40: storage, 50: data processing device, 60: interface, 70: arithmetic processing unit, 80: memory device, 90: wiring, 100: memory portion, 111: insulator, 112: insulator, 113: insulator, 114: insulator, 115: insulator, 116: insulator, 117: insulator, 121: insulator, 122: insulator, 131: insulator, 132: insulator, 133: insulator, 141: semiconductor, 142: semiconductor, 143: semiconductor, 151: conductor, 152: conductor, 153: conductor, 154: conductor, 155: conductor, 156: conductor, 200: control portion, 211: insulator, 212: insulator, 213: insulator, 214: insulator, 215: insulator, 216: insulator, 221: conductor, 222: conductor, 223: conductor, 231: semiconductor, 232: semiconductor, 240: insulator, 241: insulator, 242: insulator, 243: insulator, 250: conductor, 251: conductor, 252: conductor, 253: conductor, 300: transistor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 382: insulator, 384: insulator, 386: conductor, 700: transistor, 800: transistor, 900: transistor, 1000: computer system, 1196: memory portion, 1197: controller, 1198: bus interface, 4700: electronic component, 4702: printed circuit board, 4704: mounting board, 4710: semiconductor device, 4714: wire, 4730: electronic component, 4731: interposer, 4732: package substrate, 4733: electrode, 4735: semiconductor device, 4800: semiconductor wafer, 4800a: chip, 4801: wafer, 4801a: wafer, 4802: circuit portion, 4803: spacing, 4803a: spacing, 5200: portable game machine, 5201: housing, 5202: display portion, 5203: button, 5300: desktop information terminal, 5301: main body, 5302: display, 5303: keyboard, 5400: ICD main unit, 5401: battery, 5402: wire, 5403: wire, 5404: antenna, 5405: subclavian vein, 5406: superior vena cava, 5500: information terminal, 5510: housing, 5511: display portion, 5700: automobile, 5800: electric refrigerator-freezer, 5801: housing, 5802: refrigerator door, 5803: freezer door, 5900: information terminal, 5901: housing, 5902: display portion, 5903: operation button, 5904: operator, 5905: band, 6240: digital camera, 6241: housing, 6242: display portion, 6243: operation buttons, 6244: shutter button, 6246: lens, 6300: video camera, 6301: first housing, 6302: second housing, 6303: display portion, 6304: operation key, 6305: lens, 6306: joint, 7520: main body, 7522: controller, 9600: computer, 9610: rack, 9620: computer, 9621: PC card, 9622: board, 9623: connection terminal, 9624: connection terminal, 9625: connection terminal, 9626: semiconductor device, 9627: semiconductor device, 9628: semiconductor device, 9629: connection terminal, 9630: motherboard, 9631: slot

The invention claimed is:

1. A data processing device comprising:
a NAND memory portion; and
a controller,
wherein the NAND memory portion comprises a first string and a second string in different blocks,
wherein the first string and the second string each comprise a transistor comprising a metal oxide in a channel formation region,
wherein the first string comprises a first memory cell,
wherein the second string comprises a second memory cell, and
wherein the controller is configured to write first data to the first memory cell, read the first data from the first memory cell, and write the first data to the second memory cell.

2. The data processing device according to claim 1,
wherein the NAND memory portion comprises a third string,
wherein the second string comprises a third memory cell,
wherein the third string comprises a fourth memory cell, and
wherein the controller is configured to read third data retained in the third memory cell and write the third data to the fourth memory cell,
delete second data retained in the second memory cell and the third data retained in the third memory cell, and
read the third data retained in the fourth memory cell and write the third data to the third memory cell.

3. A method for operating a data processing device comprising a NAND memory portion and a controller, the method comprising:
a first step; a second step; and a third step,
wherein the first step comprises:
a step in which the controller receives first data and a signal including an instruction to write the first data; and
a step in which the first data is written to a first memory cell by the controller,
wherein the second step comprises a step in which the first data is read from the first memory cell by the controller,
wherein the third step comprises a step in which the first data read in the second step is written to a second memory cell by the controller, wherein the NAND memory portion comprises a first string and a second string in different blocks, wherein the first string and the second string each comprise a transistor comprising a metal oxide in a channel formation region, wherein the first string comprises the first memory cell, and wherein the second string comprises the second memory cell.

4. A method for operating a data processing device comprising a NAND memory portion and a controller, the method comprising:

a first step; a second step; a third step; a fourth step; a fifth step; a sixth step; a seventh step; and an eighth step, wherein the first step comprises:
a step in which the controller receives first data and a signal including an instruction to rewrite second data retained in a second memory cell to the first data; and
a step in which the first data is written to a first memory cell by the controller, wherein the second step comprises a step in which third data retained in a third memory cell is read by the controller, wherein the third step comprises a step in which the third data read in the second step is written to a fourth memory cell by the controller, wherein the fourth step comprises a step in which the second data retained in the second memory cell and the third data retained in the third memory cell are deleted by the controller, wherein the fifth step comprises a step in which the first data retained in the first memory cell is read by the controller, wherein the sixth step comprises a step in which the first data read in the fifth step is written to the second memory cell by the controller, wherein the seventh step comprises a step in which the third data retained in the fourth memory cell is read by the controller, wherein the eighth step comprises a step in which the third data read in the seventh step is written to the third memory cell by the controller, wherein the NAND memory portion comprises a first string, a second string, and a third string in different blocks, wherein the first string, the second string, and the third string each comprise a transistor comprising a metal oxide in a channel formation region, wherein the first string comprises the first memory cell, wherein the second string comprises the second memory cell and the third memory cell, and wherein the third string comprises the fourth memory cell.

5. A method for operating a data processing device comprising an arithmetic processing unit, a memory device, and wirings, the method comprising:

converting first data input by serial transmission into a plurality of second data;

distributing the plurality of second data to the wirings; and supplying the plurality of second data to strings at the same time in response to a trigger signal, wherein the memory device comprises the strings, and wherein one of the strings is electrically connected to the arithmetic processing unit through one of the wirings.

6. The method for operating the data processing device according to claim 5, wherein the one of the strings comprises memory cells, and wherein the one of the memory cells comprises a transistor comprising a metal oxide in an oxide semiconductor.

7. The method for operating the data processing device according to claim 5, wherein the memory device is a NAND memory device.

8. The method for operating the data processing device according to claim 6, wherein the memory device is a NAND memory device.

* * * * *